(12) United States Patent
Yamazaki et al.

(10) Patent No.: US 7,868,328 B2
(45) Date of Patent: Jan. 11, 2011

(54) SEMICONDUCTOR DEVICE HAVING ANTENNA OVER THIN FILM INTEGRATED CIRCUIT

(75) Inventors: Shunpei Yamazaki, Tokyo (JP); Atsuo Isobe, Kanagawa (JP); Tetsuji Yamaguchi, Kanagawa (JP); Hiromichi Godo, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 12/362,462

(22) Filed: Jan. 29, 2009

(65) Prior Publication Data
US 2009/0194803 A1 Aug. 6, 2009

Related U.S. Application Data

(62) Division of application No. 11/136,705, filed on May 25, 2005, now Pat. No. 7,504,663.

(30) Foreign Application Priority Data

May 28, 2004 (JP) .............................. 2004-160353

(51) Int. Cl.
*H01L 29/786* (2006.01)
(52) U.S. Cl. .................... 257/66; 257/316; 257/783; 257/E23.193
(58) Field of Classification Search ............... 438/962; 977/773, 774, 936, 937
See application file for complete search history.

(56) References Cited

U.S. PATENT DOCUMENTS

| | | | |
|---|---|---|---|
| 5,506,159 | A | 4/1996 | Enomoto |
| 6,005,270 | A | 12/1999 | Noguchi |
| 6,232,631 | B1 | 5/2001 | Schmidt et al. |
| 6,285,055 | B1 | 9/2001 | Gosain et al. |
| 6,531,731 | B2 | 3/2003 | Jones, Jr. et al. |
| 6,574,144 | B2 | 6/2003 | Forbes |
| 6,717,179 | B1 | 4/2004 | Yamazaki et al. |
| 6,787,403 | B2 | 9/2004 | Inoue et al. |
| 6,790,727 | B2 | 9/2004 | Jones, Jr. et al. |

(Continued)

FOREIGN PATENT DOCUMENTS

EP 0 971 416 A1 1/2000

(Continued)

OTHER PUBLICATIONS

Kiyoshi Kato et al., "Nonvolatile Memory and Semiconductor Device", English Translation of JP 2001-326289 A, JPO Nov. 22, 2001.

*Primary Examiner*—Stephen W Smoot
(74) *Attorney, Agent, or Firm*—Nixon Peabody LLP; Jeffrey L. Costellia

(57) ABSTRACT

The present invention provides a semiconductor device capable of being mass-produced and a manufacturing method of the semiconductor device. The present invention also provides a semiconductor device using an extreme thin integrated circuit and a manufacturing method of the semiconductor device. Further, the present invention provides a low power consumption semiconductor device and a manufacturing method of the semiconductor device. According to one aspect of the present invention, a semiconductor device that has a semiconductor nonvolatile memory element transistor over an insulating surface in which a floating gate electrode of the memory transistor is formed by a plurality of conductive particles or semiconductor particles is provided.

40 Claims, 28 Drawing Sheets

U.S. PATENT DOCUMENTS

| | | | |
|---|---|---|---|
| 6,828,619 B2 | 12/2004 | Yoshino | |
| 6,833,307 B1 | 12/2004 | Wristers et al. | |
| 7,221,016 B2 | 5/2007 | Inoue et al. | |
| 7,282,380 B2 * | 10/2007 | Maruyama et al. | 438/30 |
| 2003/0127651 A1 | 7/2003 | Murakami et al. | |
| 2007/0120681 A1 * | 5/2007 | Yamazaki et al. | 340/572.8 |

FOREIGN PATENT DOCUMENTS

| | | |
|---|---|---|
| JP | 48-080283 | 10/1973 |
| JP | 07-202044 | 8/1995 |
| JP | 11-087545 | 3/1999 |
| JP | 11-274420 | 10/1999 |
| JP | 11-297963 | 10/1999 |
| JP | 2000-081642 | 3/2000 |
| JP | 2001-326289 | 11/2001 |
| JP | 2002-110829 | 4/2002 |
| JP | 2002-533933 | 10/2002 |
| JP | 2003-204000 | 7/2003 |
| JP | 2003-347437 | 12/2003 |
| JP | 2005-520318 | 7/2005 |
| JP | 2006-505131 | 2/2006 |
| WO | WO-02/103800 A2 | 12/2002 |
| WO | WO-2004/040655 A2 | 5/2004 |

* cited by examiner

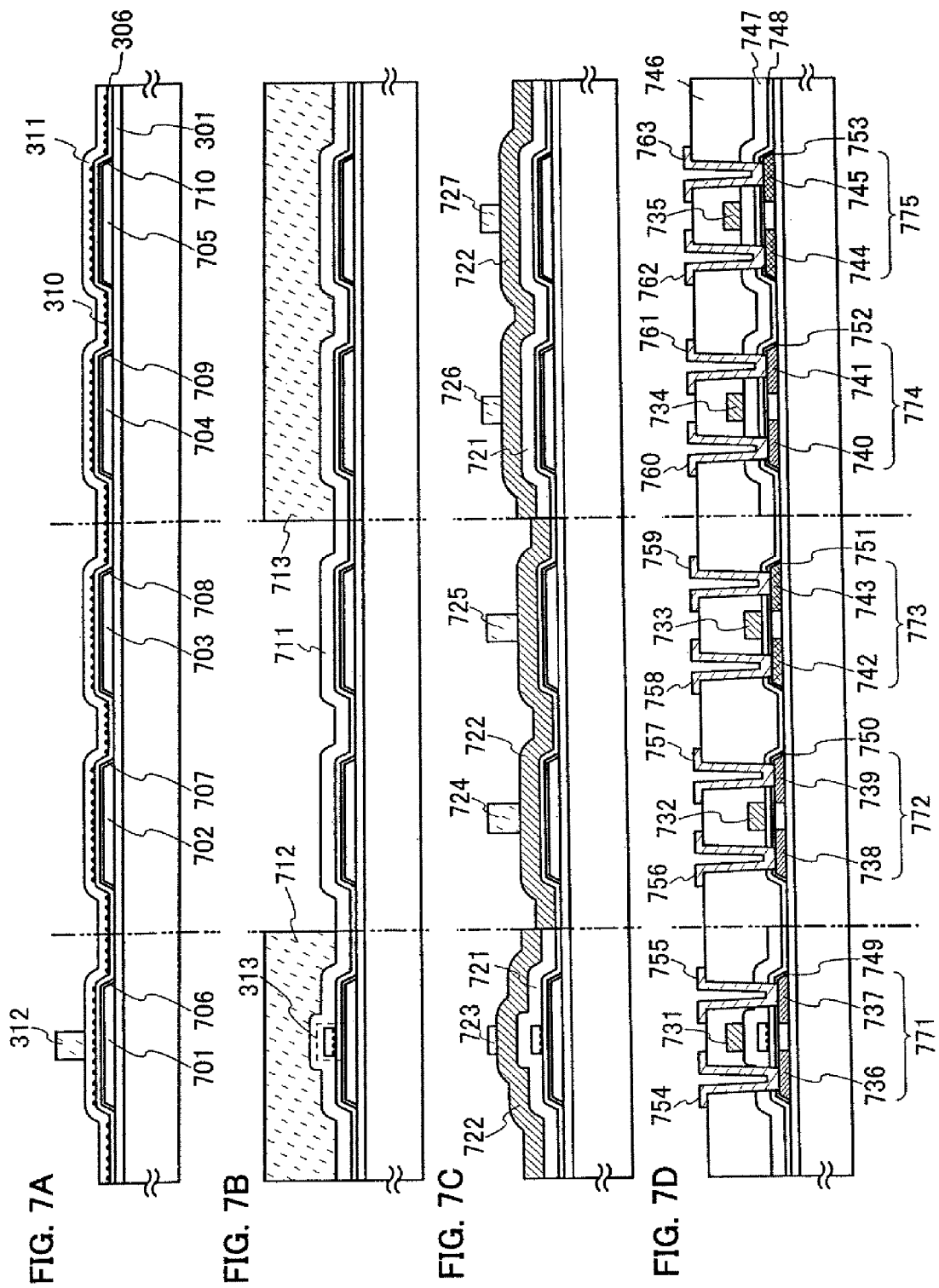

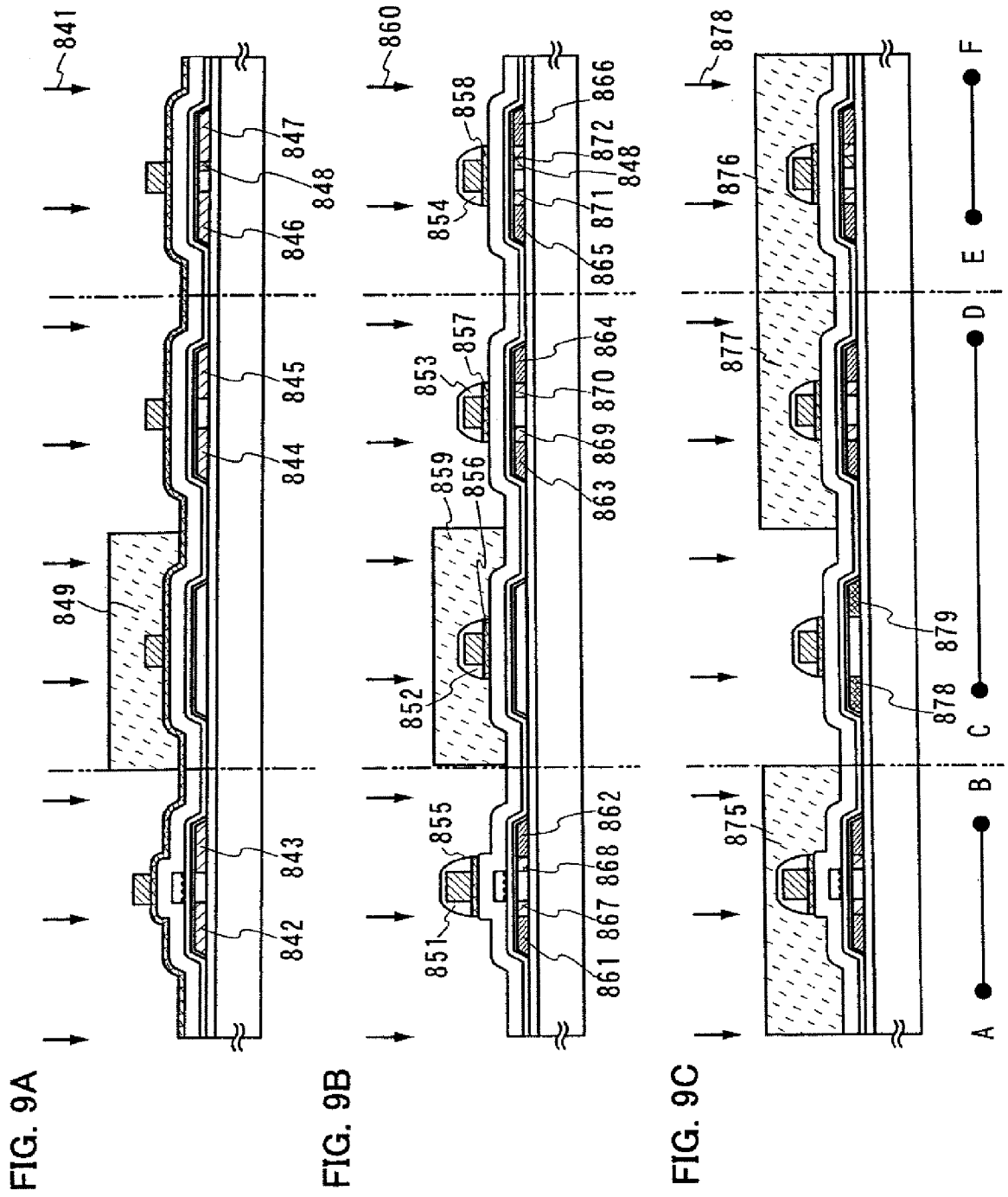

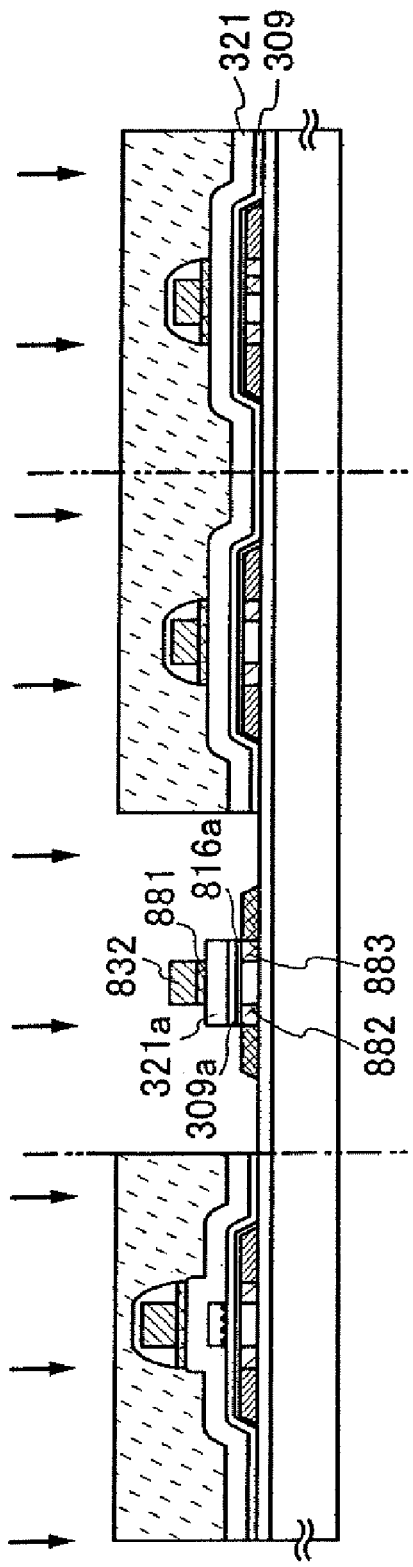
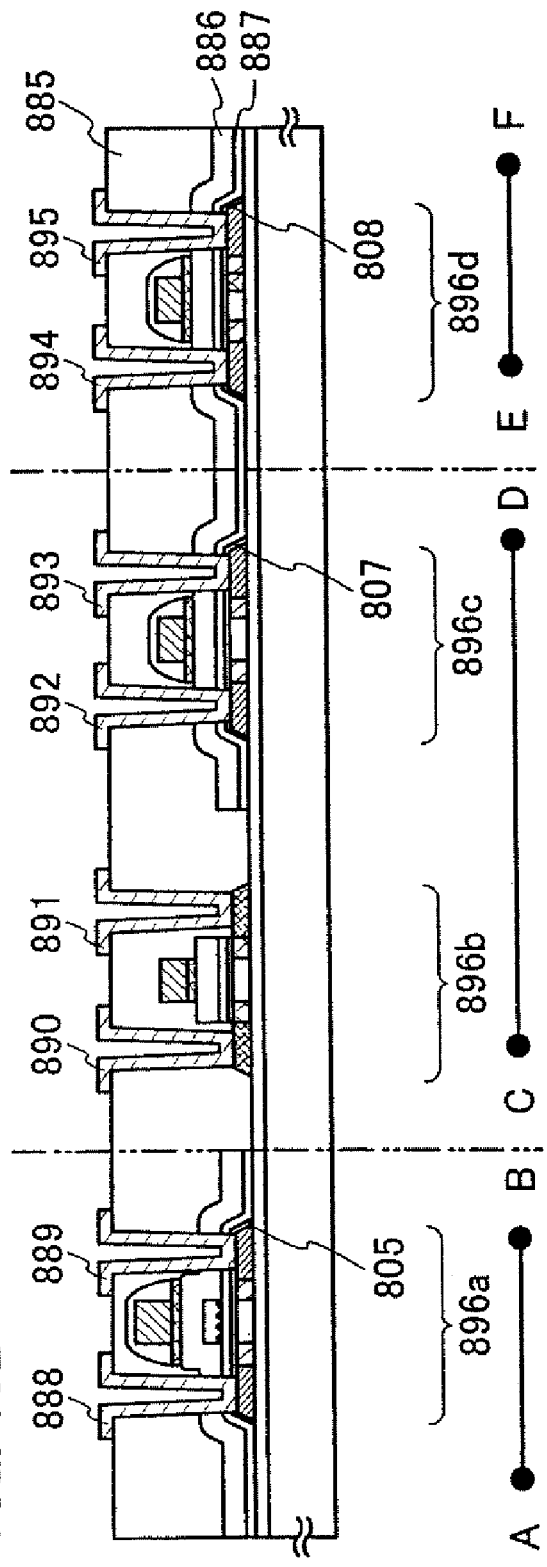
FIG. 10A
FIG. 10B

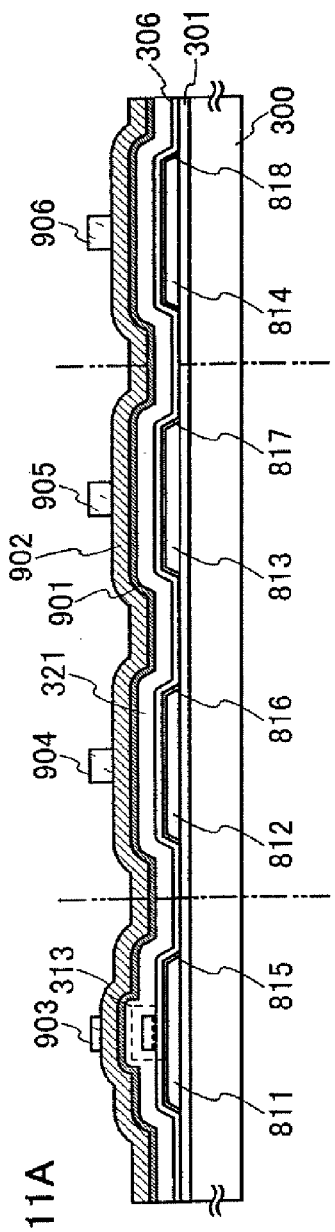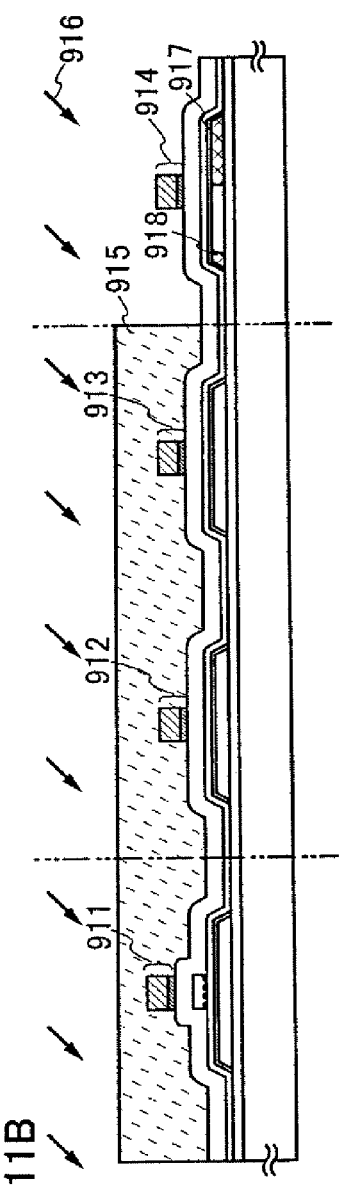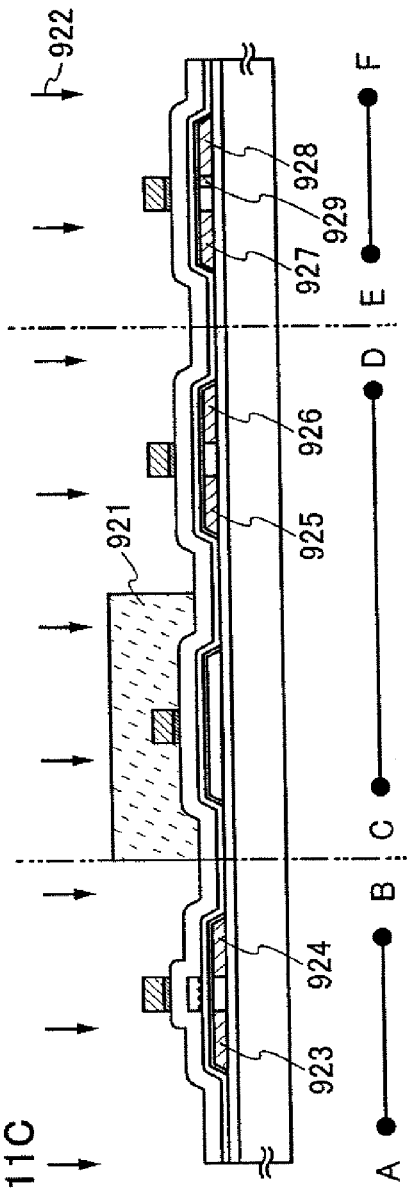

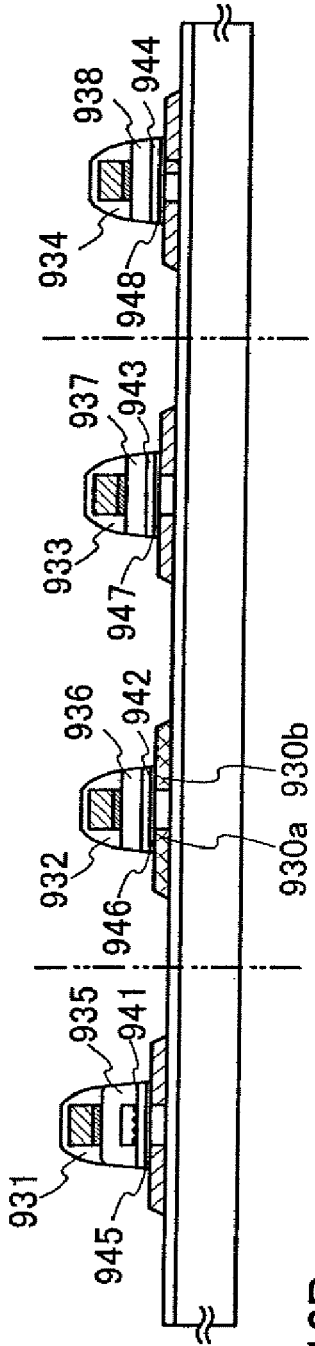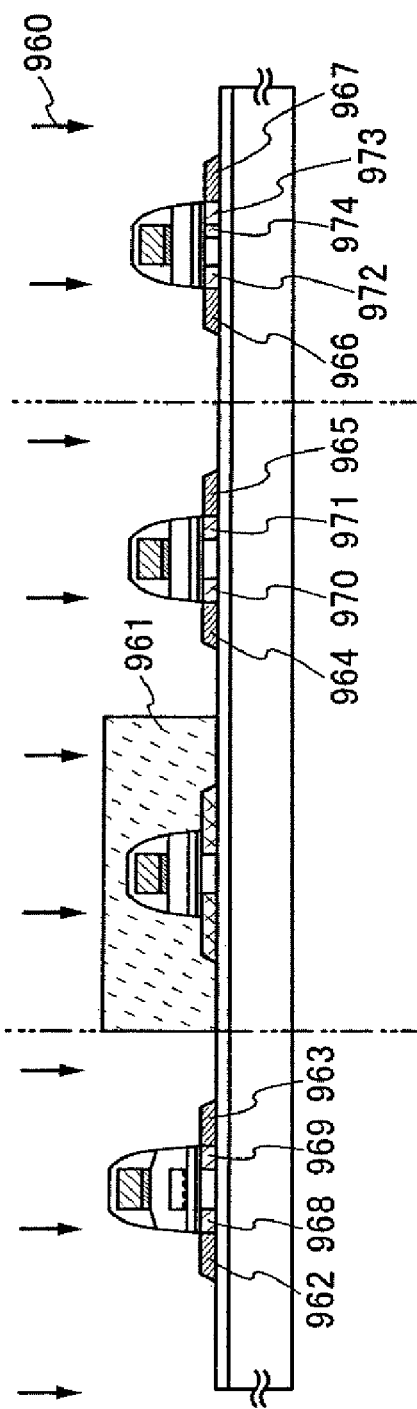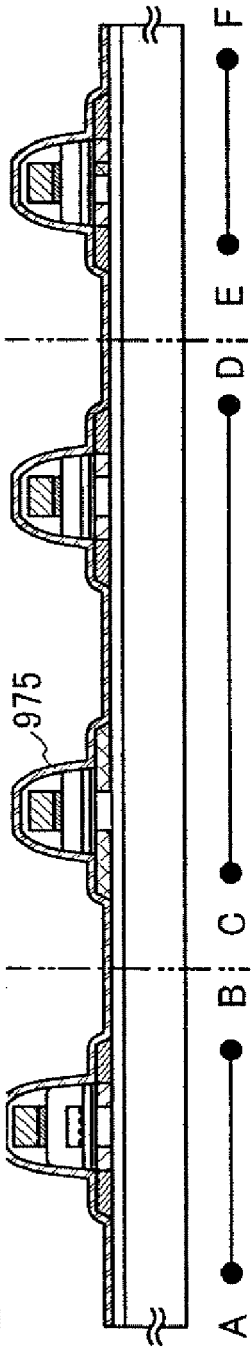

FIG. 23A
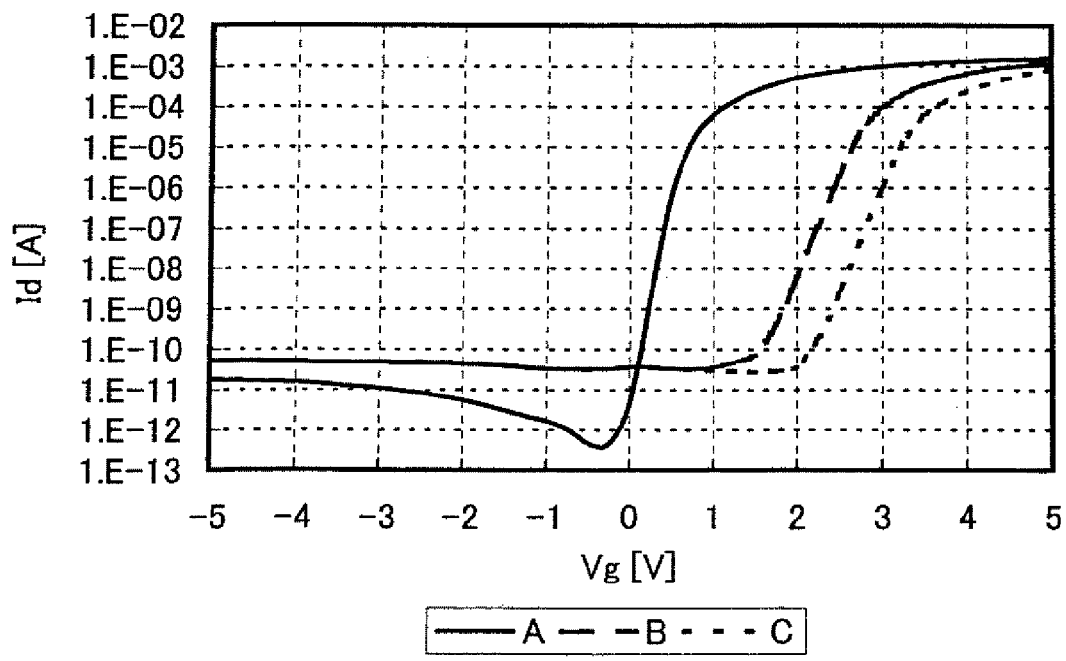
FIG. 23B
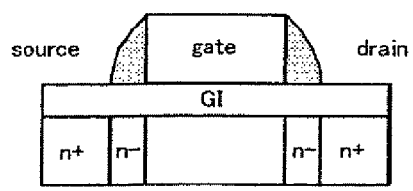
structure A
L/W= 1000/20000nm
width of Loff= 300nm
film thickness of gate
insulating film= 20nm
n+ 1E+20 [atoms/cm$^3$]
n− 1E+18 [atoms/cm$^3$]
p− 1E+18 [atoms/cm$^3$]
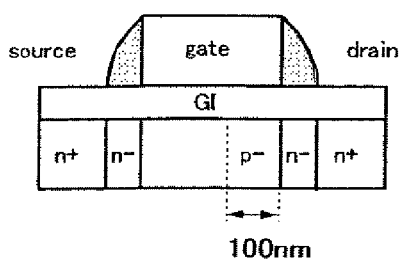
structure B
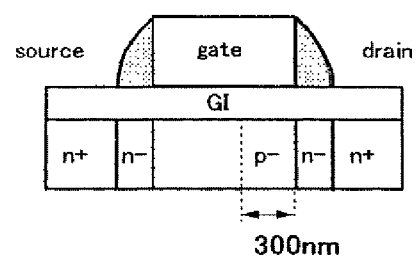
structure C

FIG. 24A
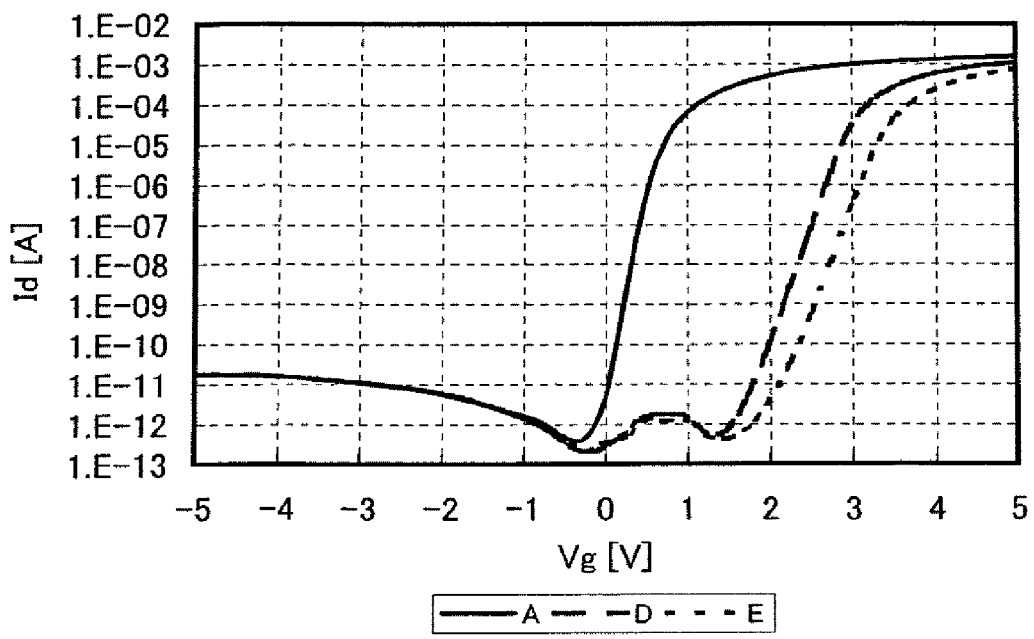
FIG. 24B
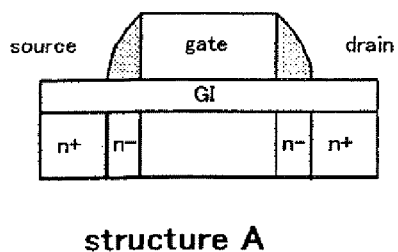
structure A
L/W= 1000/20000nm
width of Loff= 300nm
film thickness of gate
insulating film = 20nm
n+  1E+20 [atoms/cm$^3$]
n−  1E+18 [atoms/cm$^3$]
p−  1E+18 [atoms/cm$^3$]
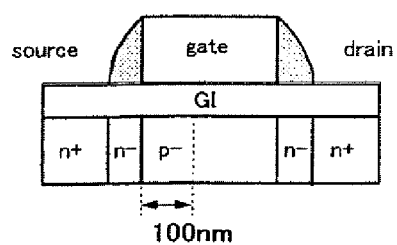
structure D
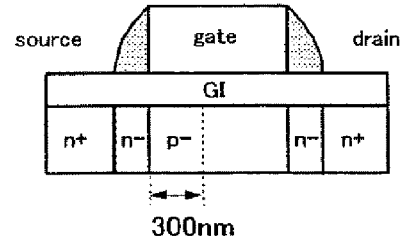
structure E

SEMICONDUCTOR DEVICE HAVING ANTENNA OVER THIN FILM INTEGRATED CIRCUIT

BACKGROUND OF THE INVENTION

1. Field of the Invention

The present invention relates to a semiconductor device having a semiconductor nonvolatile memory element, and more particularly a semiconductor device having a semiconductor nonvolatile memory element formed with thin films and a transistor. Further, the present invention relates to a semiconductor device such as an ID chip, a CPU, or a system LSI, having a semiconductor nonvolatile memory element.

2. Related Art

An EEPROM (Electrically Erasable and Programmable Read Only Memory) or a flash memory is known as a typical memory of a semiconductor nonvolatile memory. Since these memories are nonvolatile, data is not lost even when power source is turned off in contrast with a DRAM (Dynamic Random Access Memory) or SRAM (Static RAM), each of which is volatile. In the case of comparing with a magnetic disk that is another typical nonvolatile memory, the EEPROM or the flash memory has advantages in integration density, impact resistance, power consumption, write/read speed, and the like (for example, see Japanese Unexamined Patent Publication No. 2003-204000).

A nonvolatile memory formed by using a single crystalline semiconductor substrate has been put into practical use and offered in markets. Especially a nonvolatile memory having large memory capacitance, that is, high integration density is widely used.

On the other hand, a semiconductor device as typified by an ID chip capable of wireless sending and receiving data such as identification information has been put into practical use in various fields, and has been expected to increase in trade as a new form information-communication terminal. The ID chip is referred to as a wireless tag, an RFID (Radio Frequency Identification) tag, or an IC tag. An ID chip that has an antenna and an integrated circuit formed by using a semiconductor substrate is about to be put into practical use at present.

Illegal rewrite of identification information of the ID chip can be prevented by forming a nonvolatile memory which data is impossible to be rewritten in an integrated circuit in the ID chip.

However, it is required to manufacture a vast number of ID chips available for human, animals, merchandise, paper money, and the like at extremely low costs as non-contact type or contact type ID chips are spread, and so it has been required to realize a structure and a manufacturing process of an ID chip capable of being mass-produced at low costs.

In the existing circumstances, a method of forming a plurality of integrated circuits and dividing the plurality of integrated circuits by back-grind of the silicon wafer is used to manufacture an ID chip. However, the problem of high manufacturing cost cannot be avoided since the silicon wafer is removed by back-grind even though silicon wafers are expensive. Since the integrated circuit formed by the silicon wafer is thick, irregularities are generated on a surface of a product container in the case of mounting the integrated circuit to the product container itself, and so latitude of design selection is limited.

A semiconductor device as typified by a CPU or a system LSI is required to be mounted in a limited capacity of an electric appliance. Accordingly, it has been required to reduce a thickness of an integrated circuit of the semiconductor device in order to realize reduction in size and weight.

SUMMARY OF THE INVENTION

In view of the foregoing, it is an object of the present invention to provide a semiconductor device capable of being mass-produced at low costs and a manufacturing method of the semiconductor device. It is another object of the present invention to provide a semiconductor device using an extreme thin integrated circuit and a manufacturing method of the semiconductor device. It is still another object of the present invention to provide a low power consumption semiconductor device and a manufacturing method of the semiconductor device.

According to one aspect of the present invention, a semiconductor device that has a semiconductor nonvolatile memory element (hereinafter, memory transistor) over an insulating surface in which a floating gate electrode of the memory transistor is formed by a plurality of conductive particles or semiconductor particles is provided.

The present invention provides not only the foregoing memory transistor, but also a semiconductor device having a transistor of which threshold value is controlled. As a typical example of the transistor, a transistor that includes a semiconductor region having a first conductive type region covered by a gate electrode, source and drain regions of a second conductive type, and a channel region, wherein the first conductive type region is provided between the channel region and either of the source and drain regions. Here, the first conductive type region refers to a semiconductor region indicating one of n-type and p-type conductivity, whereas the second conductive type refers to a semiconductor region indicating the other of n-type and p-type conductivity.

The present invention provides a semiconductor device comprising a first transistor including a first semiconductor region, a first insulating film formed over the first semiconductor region, a floating gate electrode formed over the first insulating film, a second insulating film formed over the floating gate electrode, and a first gate electrode formed over the second insulating film; and a second transistor including a second semiconductor region, a third insulating film formed over the second semiconductor region, and a second gate electrode formed over the third insulating film; wherein the first transistor and the second transistor are formed over one insulating surface; and the floating gate electrode is a plurality of scattered particles.

The present invention provides a semiconductor device comprising a first transistor including a first semiconductor region, a first insulating film formed over the first semiconductor region, a floating gate electrode formed over the first insulating film, a second insulating film formed over the floating gate electrode, and a first gate electrode formed over the second insulating film; a second transistor including a second semiconductor region, a third insulating film formed over the second semiconductor region, and a second gate electrode formed over the third insulating film; and a third transistor including a third semiconductor region, a fourth insulating film formed over the third semiconductor region, and a third gate electrode formed over the fourth insulating film; wherein the second semiconductor region has source and drain regions doped with an impurity element imparting the one of n-type and p-type conductivity; the third semiconductor region has source and drain regions doped with an impurity element imparting the other of n-type and p-type conductivity and a region that is covered by the third gate electrode and that is doped with the other impurity element imparting n-type and p-type conductivity; the first to third transistors are formed over one insulating surface; and the floating gate electrode is a plurality of scattered particles.

The present invention provides a semiconductor device comprising a thin film integrated circuit including a first transistor including a first semiconductor region, a first insulating film formed over the first semiconductor region, a floating gate electrode formed over the first insulating film, a second insulating film formed over the floating gate electrode, and a first gate electrode formed over the second insulating film; and a second transistor including a second semiconductor region, a third insulating film formed over the second semiconductor region, and a second gate electrode formed over the third insulating film; and an antenna; wherein the first transistor and the second transistor are formed over one insulating surface; and the first floating gate electrode is a plurality of scattered particles.

The present invention provides a semiconductor device comprising a thin film integrated circuit including a first transistor including a first semiconductor region, a first insulating film formed over the first semiconductor region, a floating gate electrode formed over the first insulating film, a second insulating film formed over the floating gate electrode, and a first gate electrode formed over the second insulating film; a second transistor including a second semiconductor region, a third insulating film formed over the second semiconductor region, and a second gate electrode formed over the third insulating film; a third transistor including a third semiconductor region, a fourth insulating film formed over the third semiconductor region, and a third gate electrode formed over the fourth insulating film; and an antenna; wherein the first to third transistors are formed over one insulating surface; the first floating gate electrode is a plurality of scattered particles; the second semiconductor region has a source or drain region doped with an impurity element imparting one of n-type and p-type conductivity; and the third semiconductor region has source and drain regions doped with an impurity element imparting the one of n-type and p-type conductivity and a region that is covered by the third gate electrode and that is doped with an impurity element imparting the other of n-type and p-type conductivity. In addition, the region that is covered by the third gate electrode and that is doped with an impurity element imparting the other of n-type and p-type conductivity is formed between a channel region and one of a source region and a drain region of the third semiconductor region.

The thin film integrated circuit has one or a plurality of circuits selected from a power source circuit, a clock signal generation circuit, a data modulation/demodulation circuit, an interface circuit, a control circuit, and a memory. The thin film integrated circuit may be provided over a glass substrate or a flexible substrate.

The floating gate electrode is a plurality of particles formed of a semiconductor material or a conductive material. The diameter of the particles of the floating gate electrode is preferably 1 to 5 nm. One or a plurality of the first to third semiconductor regions are formed by a crystalline semiconductor film or a single crystalline semiconductor The first insulating film is formed by stacking a silicon oxide film having a thickness of from 1 to 2 nm and a silicon nitride film having a thickness of 1 to 5 nm in this order from the first semiconductor region. The second insulating film is formed by stacking a silicon nitride film having a thickness of from 10 to 20 nm and a silicon oxide film having a thickness of 20 to 50 nm in this order from the first semiconductor region. The third insulating film is formed by stacking a silicon oxide film having a thickness of from 1 to 2 nm, a silicon nitride film having a thickness of 1 to 5 nm, and a silicon oxide film having a thickness of 20 to 50 nm in this order from the second semiconductor region. The fourth insulating film is formed by stacking a silicon oxide film having a thickness of from 1 to 2 nm, a silicon nitride film having a thickness of 1 to 5 nm, and a silicon oxide film having a thickness of 20 to 50 nm in this order from the third semiconductor region.

The transistor according to the present invention may have a side wall structure or a silicide structure.

The present invention provides a method for manufacturing a semiconductor device comprising the steps of forming a semiconductor film over an insulating surface; forming a crystalline semiconductor film by irradiating an amorphous semiconductor film with laser light; forming first and second semiconductor regions by removing a part of the crystalline semiconductor film by etching; forming a first insulating film over the first and second semiconductor regions; forming a plurality of particles over the first insulating film; forming a floating gate electrode by selectively removing the plurality of particles formed over the second semiconductor region by etching; forming a second insulating film over the floating gate electrode and the first insulating film; forming a first conductive film over the second insulating film; forming first and second gate electrodes by removing a part of the first conductive layer by etching; doping an impurity element to the first and second semiconductor regions; forming source and drain regions by activating the impurity element; and forming a source wiring or a drain wiring.

The present invention provides a method for manufacturing a semiconductor device comprising the steps of forming a semiconductor film over an insulating surface; forming a crystalline semiconductor film by irradiating the semiconductor film with laser light; forming first and second semiconductor regions by removing a part of the crystalline semiconductor film by etching; forming a first insulating film over the first and second semiconductor regions; forming a plurality of particles over the first insulating film; selectively removing the plurality of particles formed over the second semiconductor region by etching; forming a second insulating film over the plurality of particles that is remained and the first insulating film; forming a first conductive film over the second insulating film; forming a first gate electrode, a second gate electrode, and a floating gate electrode by selectively removing the first conductive layer and the plurality of particles which are remained by etching; doping an impurity element to the first and second semiconductor regions; forming source and drain regions by activating the impurity element; and forming a source wiring and a drain wiring that are in contact with the source and drain regions respectively.

The present invention provides a method for manufacturing a semiconductor device comprising the steps of forming a semiconductor film over a substrate; forming a crystalline semiconductor film by irradiating the semiconductor film with laser light; forming first to third semiconductor regions by removing a part of the crystalline semiconductor film by etching; forming a first insulating film over the first to third semiconductor regions; forming a plurality of particles over the first insulating film; forming a floating gate electrode by removing selectively the plurality of particles formed over the second and third semiconductor regions by etching; forming a second insulating film over the floating gate electrode and the first insulating film; forming a first conductive film over the second insulating film; forming first to third gate electrodes by removing a part of the first conductive film by etching; covering the first and second semiconductor regions by a mask; doping an impurity element imparting one of n-type and p-type conductivity to the third semiconductor region at an angle of from 0 to 60 degrees to a surface of the third semiconductor region and along one direction to the third gate electrode; removing the mask; doping an impurity element imparting the other of n-type and p-type conductivity to the first to third semiconductor regions at a vertical angle; forming a source region and a drain region by heating; and forming a source wiring or a drain wiring.

The laser light for crystallizing an amorphous semiconductor film is continuous wave laser light or pulse oscillation laser light. The pulse oscillation laser light is preferably at a repetition rate of 0.5 MHz or more. When etching the crystalline semiconductor film, the crystalline semiconductor film is preferably etched so that directions of channel regions of the first to third semiconductor regions are the same.

A substrate is preferably fixed to dope an impurity element imparting one of n-type and p-type conductivity to the third semiconductor region at an angle of from 0 to 60 degrees to a surface of the third semiconductor region.

A semiconductor device using a thin film integrated circuit can be formed at low costs by this invention because the semiconductor device is formed over an inexpensive substrate such as glass. Also, this invention enables manufacture of a semiconductor device at low costs because it is possible to manufacture the semiconductor device by stripping off a plurality of thin film integrated circuits after forming the plurality of thin film integrated circuits over a substrate having a large size. Further, it is possible to manufacture a semiconductor device with low power consumption by forming a semiconductor element of which threshold voltage is controlled more precisely than the other semiconductor elements, in a part of the thin film integrated circuit.

These and other objects, features and advantages of the present invention will become more apparent upon reading of the following detailed description along with the accompanied drawings.

BRIEF DESCRIPTION OF THE DRAWINGS

FIGS. 7A to 7D are cross-sectional views for showing a manufacturing process of a semiconductor device according to the present invention;

FIGS. 9A to 9C are cross-sectional views for showing a manufacturing process of a semiconductor device according to the present invention;

FIGS. 10A and 10B are cross-sectional views for showing a manufacturing process of a semiconductor device according to the present invention;

FIGS. 11A to 11C are cross-sectional views for showing a manufacturing process of a semiconductor device according to the present invention;

FIGS. 12A to 12C are cross-sectional views for showing a manufacturing process of a semiconductor device according to the present invention;

FIGS. 23A and 23B are model diagrams and a drawing of results of a simulation of a TFT;

FIGS. 24A and 24B are model diagrams and a drawing of results of a simulation of a TFT;

DESCRIPTION OF THE INVENTION

Figure 1A:
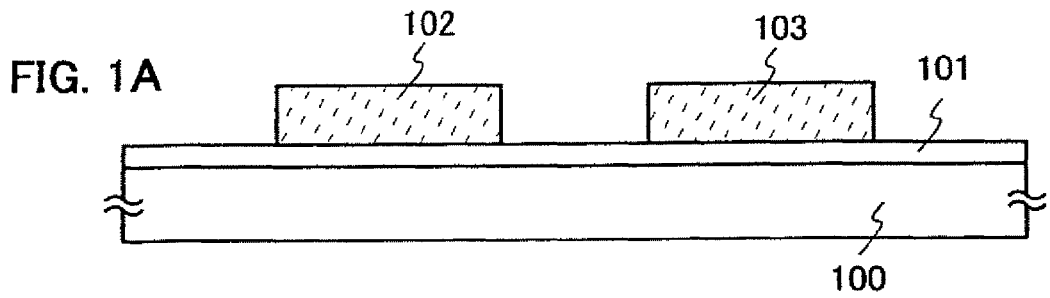
FIGS. 1A to 1E are cross-sectional views for showing a manufacturing process of a semiconductor device according to the present invention.

Embodiment Modes and Example of the present invention will be described in detail with reference to the accompanying drawings. Although, the invention is not limited to the following description and it is easily understood by those skilled in the art that various changes and modifications are possible, unless such changes and modifications depart from the content and the scope of the invention. Therefore, the invention is to be interpreted without limitation to the description in Embodiment Modes and the Example shown below. Note that, in the structure of the invention described hereinafter, the same reference numerals denote the same parts or parts having the similar functions in different drawings and the explanation will not be repeated.

Embodiment 1

In this embodiment, a manufacturing process of a semiconductor device having an integrated circuit over an insulating substrate is explained with reference to FIGS. 1A to 1E. As a transistor, a thin film transistor (hereinafter, TFT) is used for the explanation.

As shown in FIG. 1A, a semiconductor film 101 is formed over a substrate. Then, mask patterns 102, 103 made of resist, organic resin, or the like are formed over the semiconductor film 101.

As a substrate 100, a glass substrate, a quartz substrate, a ceramic substrate, a plastic substrate, a stainless substrate, a synthetic resin substrate, a flexible substrate, and the like can be nominated. The semiconductor film can be formed by using a SOI (Silicon on Insulator) substrate. In the case of using any one of these substrates, a base film (not shown) may be appropriately provided on the substrate if necessary. In this embodiment, the substrate including the base film is referred to as the substrate 100.

The semiconductor film 101 is preferably formed by a crystalline semiconductor that is formed by crystallizing an amorphous semiconductor film by laser crystallization in which the foregoing amorphous semiconductor film is formed by reduced pressure thermal CVD, plasma CVD, sputtering, or the like. A crystalline semiconductor film that is formed by crystallizing an amorphous semiconductor film formed by the foregoing film formation method by a solid growth method, or a crystalline semiconductor film that is formed in accordance with a technique disclosed in Japanese granted patent publication No. 3,300,153 may be used. The crystallinity of the crystalline semiconductor film formed by the foregoing method can be improved by laser irradiation. Further, a crystalline semiconductor film or the like that is formed by laser-crystallizing a microcrystalline semiconductor film made form silane ($SiH_4$) may be used. Moreover, as the semiconductor film, a microcrystalline semiconductor film can be used.

As a semiconductor material for the semiconductor film, silicon (Si) or germanium (Ge), or a compound semiconductor material such as silicon germanium alloy, silicon carbide, or gallium arsenide can be used.

In the case of laser crystallization, thermal annealing of the semiconductor film is preferably performed at 500° C. for 1 hour before laser crystallization in order to improve resistance of the semiconductor film to laser. By irradiating the semiconductor film with laser light of second to fourth harmonics of a fundamental wave using a solid laser capable of continuous wave, a large grain size crystal can be obtained. Typically, a second harmonic (532 nm) or a third harmonic (355 nm) of Nd:$YVO_4$ laser (fundamental wave 1064 nm) is preferably used. Specifically, laser light emitted form the continuous wave $YVO_4$ laser is converted into a higher harmonic by a nonlinear optical element to obtain laser light having a power of several W or more. The laser light is preferably emitted so as to be formed into a rectangular shape or an elliptical shape on an irradiated surface of the semiconductor film by an optical system. Here, power density of approximately 0.01 to 100 $MW/cm^2$ (preferably, 0.1 to 10 $MW/cm^2$) is preferable. The laser light is emitted at scanning rate of approximately 10 to 200 cm/sec.

As the laser, a known continuous wave gas laser or solid laser can be used. As the gas laser, an Ar laser or a Kr laser can be nominated. As the solid laser, a YAG laser, a $YVO_4$ laser, a YLF laser, a $YAlO_3$ laser, a $Y_2O_3$ laser, a glass laser, a ruby laser, an alexandrite laser, a Ti sapphire laser, and the like can be nominated.

The laser crystallization can be performed by a pulse laser at a repetition rate of 0.5 MHz or more, which is a drastically higher range of repetition rates than a generally used range of repetition rates of several ten to several hundred Hz. It is said that the time between melting a semiconductor film and solidification of the semiconductor film is several ten to several hundred nsec in a pulse laser. Hence, the semiconductor film can be irradiated with the following pulse of the laser light during the period from melting the semiconductor film by the preceding pulse and solidification of the semiconductor film by using the foregoing range of repetition rate. Since solid-liquid interface can be continuously moved in the semiconductor film, a semiconductor film having crystal grains that has grown continuously in the scanning direction of the laser beam is formed. Specifically, an aggregate of crystal grains having widths of 10 to 30 μm in the scanning direction and widths of 1 to 5 μm in the direction perpendicular to the scanning direction can be formed. By forming crystal grains of single crystal extended long along the scanning direction, a semiconductor film hardly has a crystal boundary at least in a channel direction of a TFT can be formed.

The semiconductor film may be irradiated with laser light in an inert gas atmosphere such as rare gas or nitrogen. Accordingly, roughness of a surface of the semiconductor film due to laser irradiation can be prevented, and variation of a threshold voltage due to variation of interface state densities can be prevented.

In this embodiment, pulse laser light is emitted to an amorphous semiconductor film to form a crystalline silicon film. Thereafter, a channel doping may be carried out by doping $B_2H_6$ to the semiconductor film in order to control a threshold value of a transistor that is formed afterwards.

As the mask patterns 102, 103, resist masks are formed by a known photolithography technique. The masks can be formed by discharging an insulating material such as organic resin or inorganic material by an ink jetting method or a droplet discharging method from which a material can be discharged to a predetermined position. Alternatively, a printing method can be used. Moreover, by reducing the areas of the mask patterns 102 and 103, a semiconductor device in which memory transistors and TFTs are highly integrated can be manufactured.

Figure 1B:
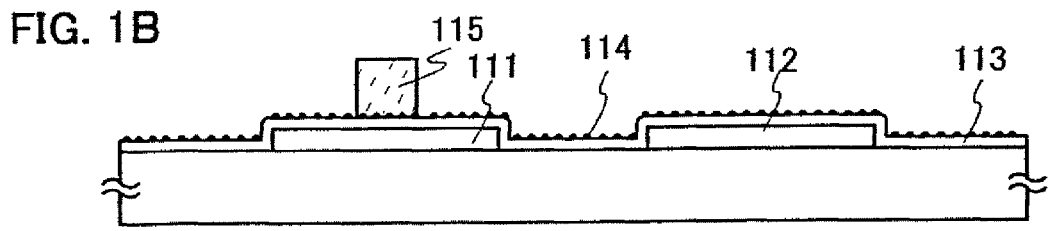

As shown in FIG. 1B, a first semiconductor region 111 and a second semiconductor region 112 are formed by etching the semiconductor film 101 by using the mask patterns 102, 103. The first semiconductor region 111 serves as an active region of a semiconductor memory transistor that is formed afterwards, whereas the second semiconductor region 112 serves as an active region of a TFT that is formed afterwards.

After removing mask patterns 102 and 103, a first insulating film 113 is formed over each of the first semiconductor region 111, the second semiconductor region 112, and the substrate 100. The first insulating film 113 is preferably formed to have a thickness of 1 to 100 nm, more preferably, 1 to 10 nm, further more preferably, 2 to 5 nm. The first insulating film serves afterwards as a tunnel oxide film in a memory transistor and as a part of a gate insulating film in a TFT. Accordingly, a tunnel current is easier to flow with being thinner a thickness of the first insulating film, and so high speed operation becomes possible. As a thickness of the first insulating film is decreased, the voltage required to store charges in the floating gate electrode is lower. As a result, power consumption of a semiconductor device that is formed afterwards can be reduced.

As a method for forming the first insulating film 113, a GRTA (Gas Rapid Thermal Anneal), an LRTA (Lamp Rapid Thermal Anneal), or the like is used to oxidize a surface of the semiconductor region to form a thermal oxide film, and so the first insulating film having a thin thickness can be formed. Alternatively, a CVD method, a coating method, or the like can be used. As the first insulating film 113, a silicon oxide film or a silicon nitride film can be used. Further, the first insulating film 113 may be formed to have a lamination structure of stacking a silicon oxide film and a silicon nitride film in this order from the side of the substrate 100, or stacking a silicon oxide film, a silicon nitride film, and a silicon oxide film in this order from the side of a substrate 100. In this embodiment, a silicon oxide film and a silicon nitride film are stacked to form the first insulating film 113.

A plurality conductive particles or semiconductor particles (hereinafter, referred to as dispersed particles) 114 are formed to be dispersed (scattered) over the first insulating film 113. As a manufacturing method for the dispersed particles, a known method such as sputtering, plasma CVD, a low pressure CVD (LPCVD), a vapor deposition, or a droplet discharging method can be used. Since it is possible to suppress a bombardment to the first insulating film by forming the dispersed particles when the dispersed particles are formed by plasma CVD, low pressure CVD (LPCVD), vapor deposition, or a droplet discharging method, defects of the first insulating film can be suppressed. As a result, a semiconductor film having high reliability can be manufactured. The dispersed particles can be formed by forming a conductive film or a semiconductor film by the foregoing method and etching the semiconductor film or a conductive film so as to form a desired shape. The size of each dispersed particle is 0.1 to 10 nm, preferably, 2 to 5 nm. As a material for conductive particles, gold, silver, copper, palladium, platinum, cobalt, tungsten, nickel, and the like can be used. As a material for semiconductor particles, silicon (Si), germanium (Ge), or silicon germanium alloy, and the like can be used. Here, silicon small particles are formed as the dispersed particles 114.

Here, a part of the dispersed particles can be aggregated together.

A mask pattern 115 is formed over the dispersed particles 114. Here, the mask pattern 115 is formed over the first semiconductor region 111, which is to be a part of a memory transistor.

Figure 1C:
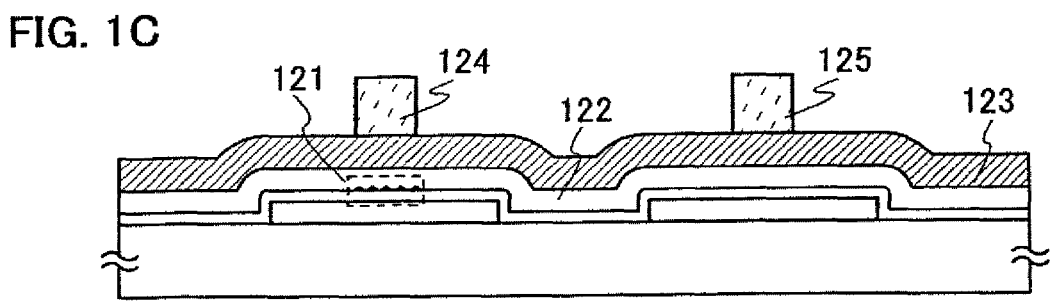

As shown in FIG. 1C, a floating gate electrode 121 is formed by removing a part of the dispersed particles 114 by etching with a mask pattern 115. As a method of removing the dispersed particles 114, a known etching method such as dry etching or wet etching, can be used. When dry etching is used in the case that the thickness of the first insulating film 113 is thin, on which the dispersed particles 114 are formed, there is a possibility of generating defects in the first insulating film by plasma bombardment. Accordingly, the dispersed particles 114 are preferably removed by wet etching. Here, silicon small particles that are the dispersed particles 114 are selectively removed by wet etching using NMD3 solution (aqueous solution containing 0.2 to 0.5% of tetramethyl ammonium hydrooxide).

The floating gate electrode is formed by the dispersed particles. Accordingly, even when defects are occurred in the first insulating film serving as a tunnel oxide film, all charges stored in the floating gate electrode can be prevented from flowing out from the defects to the semiconductor region. As a result, a semiconductor memory transistor having high reliability can be manufactured.

After removing the mask pattern 115, a second insulating film 122 is formed over the floating electrode 121 and the first insulating film 113. The second insulating film 122 is preferably formed to have a thickness of 1 to 100 nm, more preferably, 10 to 70 nm, and further more preferably 10 to 30 nm. The second insulating film 122 is required to keep insulating the floating gate electrode 121 from a gate electrode that is formed afterwards in the memory transistor. Accordingly, the second insulating film 122 is preferably formed to have such a thickness that does not allow a leak current to increase between the floating gate electrode 121 and the gate electrode. The second insulating film 122 can be formed by a silicon oxide film and a silicon nitride film as with the first insulating film 113. Alternatively, the second insulating film 122 may be formed to have a lamination layer structure formed by stacking a silicon oxide film and a silicon nitride film in this order from the side of the substrate 100, or stacking a silicon oxide film, a silicon nitride film, and a silicon oxide film in this order from the side of the substrate 100. The silicon oxide film is preferably formed on the semiconductor region since an interface state between the gate insulating film and the semiconductor region is lowered. Here, a lamination layer structure is formed by stacking a silicon oxide film with a thickness of 10 nm and a silicon nitride film with a thickness of 20 nm as the second insulating film 122.

After forming the second insulating film, as shown in FIG. 1B, a second floating gate electrode can be formed by forming dispersed particles and a mask pattern that covers the dispersed particles. Moreover, a plurality of the floating gate electrodes can be stacked by repeating the similar processes.

A first conductive film 123 is formed over the second insulating film 122. The first conductive film can be formed by a known method such as sputtering, vapor deposition, CVD or the like. The first conductive film can be formed by using an element selected from tantalum (Ta), tungsten (W), titanium (Ti), molybdenum (Mo), aluminum (Al), copper (Cu), chromium (Cr), and neodymium (Nd), or an alloy material or a compound material containing these elements as its main component. A semiconductor film doped with impurity elements can be used as the first conductive film.

As a material for the first conductive film 123, a material that is etched sufficiently faster than the second insulating film 122 is preferably used. As a result, the second insulating film 122 that is exposed in etching the first conductive film can be prevented from being over-etched.

Mask patterns 124, 125 are formed over the first conductive film 123. The mask patterns 124, 125 can be formed by using appropriately a similar method to that used for forming the mask patterns 102, 103. Widths of the mask patterns can be reduced by sliming the patterns formed by the foregoing method by ashing or the like. As a result, a TFT capable of operating at high speed having a short channel structure with a gate electrode that has a narrow width along the channel length direction and to be formed afterwards can be formed. The mask patterns 124 and 125 are mask patterns 124 and 125 for forming the gate electrode. In the case that a gate electrode is formed by a droplet discharging method, the mask patterns 124 and 125 are not required to be provided.

Figure 1D:
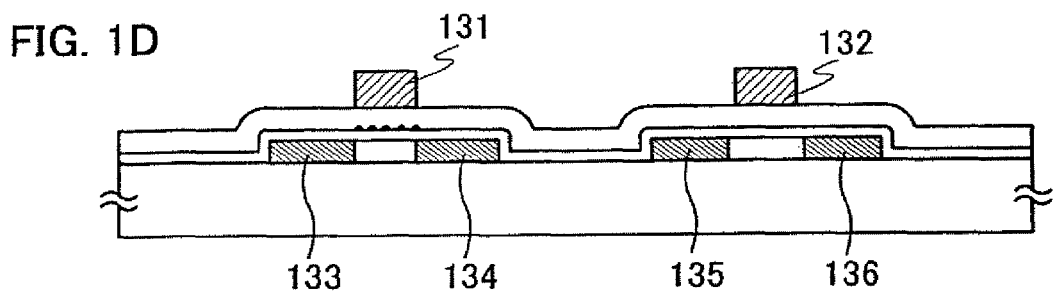

As shown in FIG. 1D, gate electrodes 131 and 132 are formed by etching the first conductive layer by using the mask patterns 124 and 125. The gate electrodes are formed to have thicknesses of 0.2 to 1.5 μm, preferably 0.2 to 0.7 μm. By setting the width of the gate electrode, a memory transistor and a TFT having a short channel length can be formed, and a semiconductor device capable of operating at high speed can be manufactured.

Impurity elements imparting n-type or p-type conductivity are doped to each of the first semiconductor region 111 and the second semiconductor region 112 by using the mask patterns 124 and 125 and the gate electrodes 131 and 132 as masks. Then, after removing the mask patterns 124 and 125, an insulating film is formed and impurity elements are activated by a heat treatment, GRTA, LRTA to form source and drain regions 133 to 136. Thereafter, an inorganic insulating film containing a silicon nitride film can be formed over the second insulating film and the gate electrode to perform heat treatment. By forming the inorganic insulating film in such a way that the inorganic insulating film contains hydrogen and performing heat treatment, termination of dangling bonds of each of the semiconductor regions can be hydrogenated.

Figure 1E:
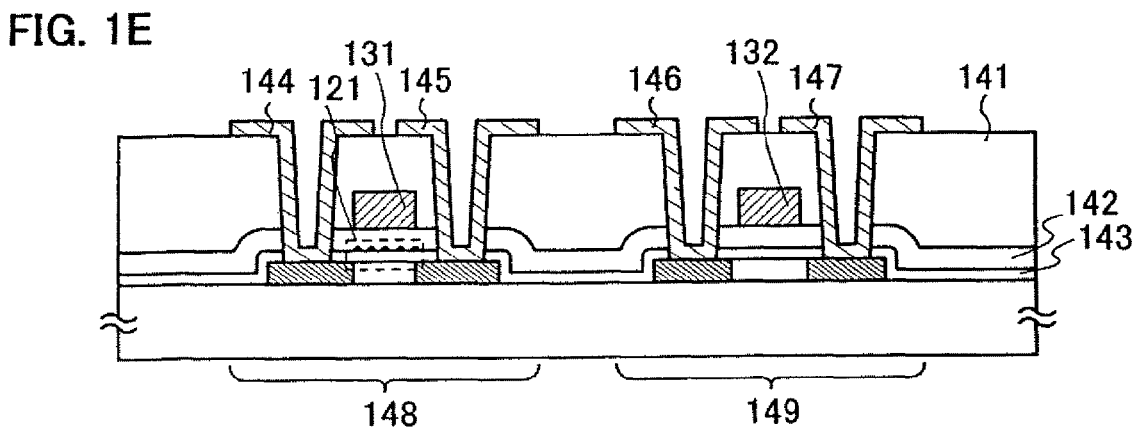

As shown in FIG. 1E, a third insulating film serving as an interlayer insulating film is formed over the second insulating film 122. The third insulating film can be formed by using organic resin having heat resistance such as polyimide, acrylic, and polyamide. In addition to the foregoing organic resin, a low dielectric constant material (low-k material), resin including the Si—O—Si bond formed by a siloxane based material as a starting material (hereinafter, siloxane based resin), or the like can be used. The siloxane based resin may have at least hydrogen, and moreover, at least one of an alkyl group and aromatic hydrocarbon of an organic group, as a substituent. Alternatively, a fluoro group may be contained in the third insulating film as the substituent. The third insulating film can be formed by spin coating, dipping, a spray coating method, a droplet discharging method, an ink jetting method, a screen printing method, an offset printing method, a doctor knife, a roll coater, a curtain coater, a knife coater, CVD, vapor deposition, or the like depending on the material. Alternatively, inorganic material such as silicon oxide, silicon nitride, silicon oxynitride, PSG (phosphorous glass), BPSG (boron phosphorous glass), or an alumina film, can be used. The third insulating film can be formed by stacking these insulating films. Here, the third insulating film is formed by coating and baking an acrylic film.

Contact holes are formed by removing a part of the third insulating film by etching, the second insulating film 122, and parts of the first insulating film 113 by a photolithography process and an etching process to expose a part of the source and drain regions. At this time, the etched third insulating film is referred to as a third insulating layer 141, the etched second insulating film is referred to as a second insulating layer 142, and the etched first insulating film is referred to as a first insulating layer 143. Here, a plane surface insulating film is illustrated as the third insulating layer 141; however, the third insulating layer 141 is not required to be plane.

Source and drain regions 144 to 147 connected to the source and drain regions are formed. The source and drain electrodes can be formed by forming a conductive film by PVD (Physical Vapor Deposition), CVD (Chemical Vapor Deposition), vapor deposition, or the like, and etching the conductive film into a desired shape. A conductive layer can be formed at a predetermined position by a droplet discharging method, a printing method, an electroplating method, or the like. Moreover, a reflow method or a damascene method can be used. As a material for the source and drain regions, metal such as Ag, Au, Cu, Ni, Pt, Pd, Ir, Rh, W, Al, Ta, Mo, Cd, Zn, Fe, Ti, Si, Ge, Zr, Ba, or the like; alloys of the foregoing metal; or metal nitride of the foregoing metal. Alternatively, the source and drain regions may be formed to have a lamination layered structure of the foregoing materials.

Figure 27A:
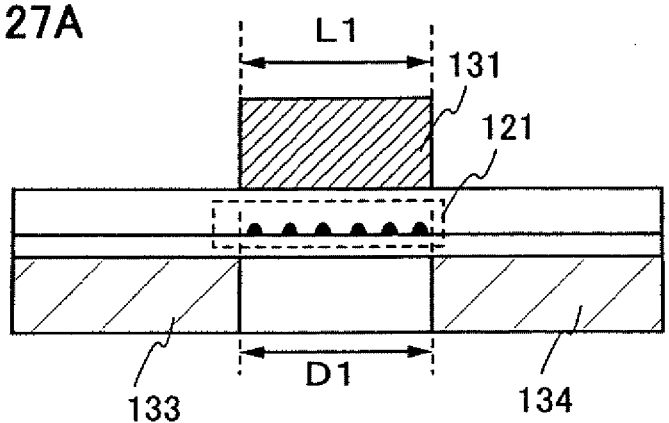
FIGS. 27A to 27D are cross-sectional views for showing a semiconductor device according to the present invention.

The positional relationship between edges of the gate electrode 131 and the floating gate electrode 121 is explained with reference to FIGS. 27A to 27D. In FIGS. 27A to 27D, widths of the gate electrodes are represented by L1 to L3, whereas widths of the floating gate electrodes are represented by D1 to D3. FIG. 27A shows that a memory transistor in which the width L1 of the gate electrode 131 and the width D1 of the floating gate electrode 121 are equal to each other, that is, the edges of the gate electrode and the edges of the floating gate electrode almost correspond to each other.

Figure 27B:
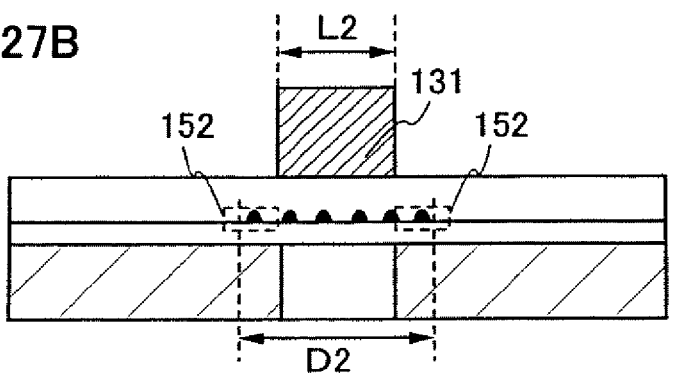

In FIG. 27B, a memory transistor in which the width D2 of the gate electrode 121 is larger than the width L2 of the gate electrode 131, that is, the edges of the floating gate electrode are positioned outside the edges of the gate electrode is illustrated. In this case, floating gate electrodes 152, which are provided outside the gate electrode 131, do not serve as charge storage layers. Therefore, either the structure in which edges of the floating gate electrodes are outside the edges of the gate electrode or the structure in which the edges of the gate electrode and those of the floating gate electrode correspond to each other may be appropriately selected so that the structure will be favorable to a manufacturing process or miniaturization.

Figure 27C:
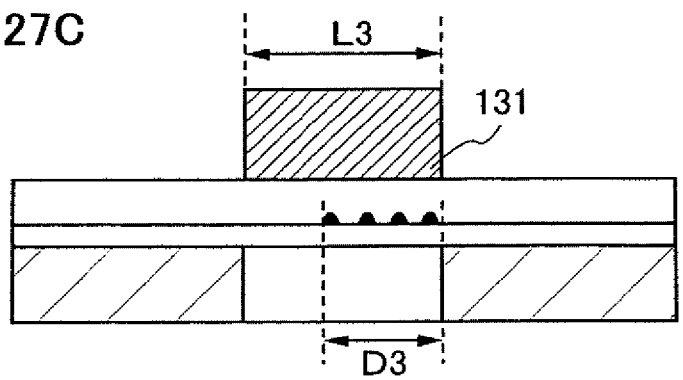
Figure 27D:
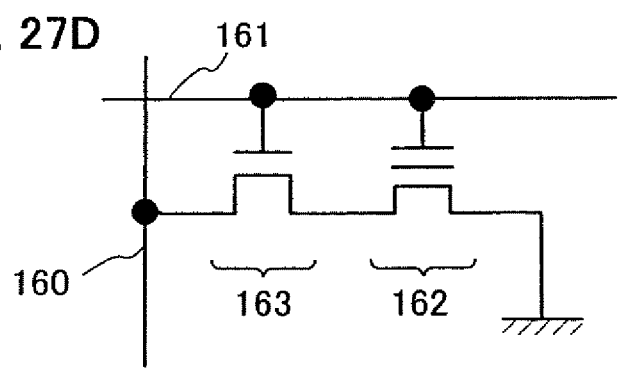

FIG. 27C shows a memory transistor in which a width D3 of the floating gate electrode 121 is smaller than that of a width L3 of the gate electrode 131. In this case, the memory transistor has a so-called split gate electrode structure. The split gate electrode structure refers to an element that constructs a selecting transistor for selecting a memory transistor and the memory transistor in the one semiconductor region 111 and the gate electrode 131. The split gate electrode has a configuration that a pair of signal lines 160 and 161 controls the memory transistor 162 and the selecting transistor 163. Even when the memory transistor becomes an excessive erasing state (under threshold voltage), such a structure can keep the selectivity of a memory cell by virtue of the selecting transistor 163, and so the structure has a favorable operation margin. FIG. 27C shows a structure in which either edge of the floating gate electrode coincides with an edge of the gate electrode; however, the present invention is not limited thereto. The edges of the floating electrode 121 can be provided within the edges of the gate electrode 131.

The following method can separate the memory transistor 148 and the TFT 149 from the substrate 100 illustrated in FIG. 1A to 1E. As a method for separating, 1) a method in which a substrate having heat resistance at approximately 300 to 500° C. is used as a substrate 100, a metal oxide film is provided between the substrate 100, and the memory transistor 148 and the TFT 149, and the metal oxide film is made so fragile that the memory transistor 148 and the TFT 149 are separated from the substrate; 2) a method in which an amorphous silicon film containing hydrogen is provided between the substrate 100, and the memory transistor 148 and the TFT 149, and the amorphous silicon film is removed to separate the memory transistor 148 and the TFT 149 from the substrate by irradiating the amorphous silicon film with laser light or etching the amorphous silicon film with gas or solution; 3) a method in which the substrate 100 provided with the memory transistor 148 and the TFT 149 is removed mechanically, or by etching with solution or gas such as $CF_3$ or the like, to separate the memory transistor 148 and the TFT 149 from the substrate; or the like can be nominated. The separated memory transistor 148 and TFT 149 may be pasted onto a flexible substrate by using a commercially available adhesive agent, for example, an adhesive agent such as epoxy resin based adhesive agent or resin additive.

As noted above, by pasting the separated memory transistor 148 and TFT 149 onto the flexible substrate, a semiconductor device that is thin, lightweight, and shatter proof even when falling can be manufactured.

By the foregoing processes, a semiconductor device that has the memory transistor 148 including the first semiconductor region 111, the first insulating layer 143 serving as a tunnel oxide film, the floating gate electrode 121, the second insulating layer 142, and the gate electrode 131; and the TFT 149 including the second semiconductor region 112, the first insulating layer 143 and the second insulating layer 142 serving as a gate insulating film, and the gate electrode 132, all of which are formed over one substrate, can be formed. The TFT 149 can be appropriately used for a peripheral circuit such as a decoder circuit for selecting a memory transistor, a write/read circuit, or the like; a functional circuit such as a CPU, a DRAM, an image processing circuit, a sound processing circuit, or the like; or a driver circuit such as a buffer circuit, a shift register circuit, a level shifter circuit, sampling circuit, or the like.

Since the semiconductor device of this embodiment can be manufactured by using a crystalline silicon film, the semiconductor device can be manufactured without using an expensive single crystalline semiconductor substrate. Therefore, the cost can be reduced. Mass production of semiconductor devices is possible by using a large substrate as the substrate 100, forming a plurality of circuit patterns of the semiconductor device by the foregoing process, and splitting the circuit patterns into rectangular shapes to form respective semiconductor devices. Therefore, the cost can be reduced at this point. Moreover, a thin semiconductor device can be manufactured by separating the memory transistor 148 and the TFT 149 manufactured according to this embodiment from the substrate and pasting onto the flexible substrate.

Since dispersed particles are used for the floating gate electrode of the memory transistor, discharge of stored charges due to defects of the tunnel oxide film can be prevented. Therefore, a semiconductor device having high reliability can be manufactured.

Embodiment 2

In this embodiment, a method for manufacturing a semiconductor device that has a memory transistor in which the edges of a floating gate electrode and a gate electrode almost correspond to each other in Embodiment 1 is explained with reference to FIGS. 29A to 29D.

Figure 29A:
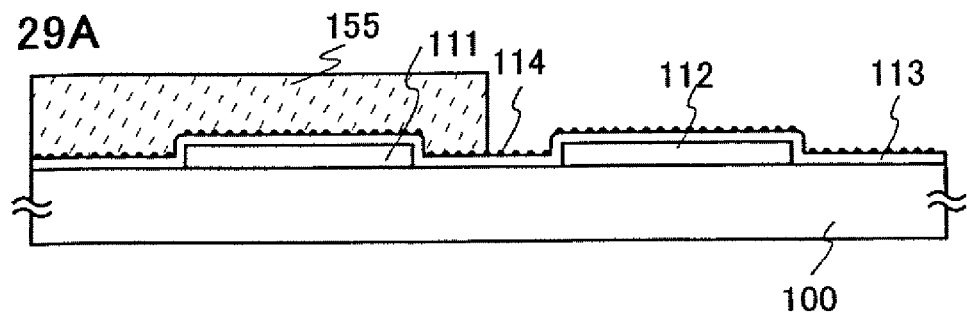
FIGS. 29A to 29D are cross-sectional views for showing a manufacturing process of a semiconductor device according to the present invention.

As shown in FIG. 29A, dispersed particles 114 are formed over a first insulating film 113 as with Embodiment 1. Then, a mask pattern 155 is formed. Here, the mask pattern is not required to cover a second semiconductor region 112 serving as an active region of a TFT but cover at least a first semiconductor region 111 serving as an active region of a memory transistor.

Figure 29B:
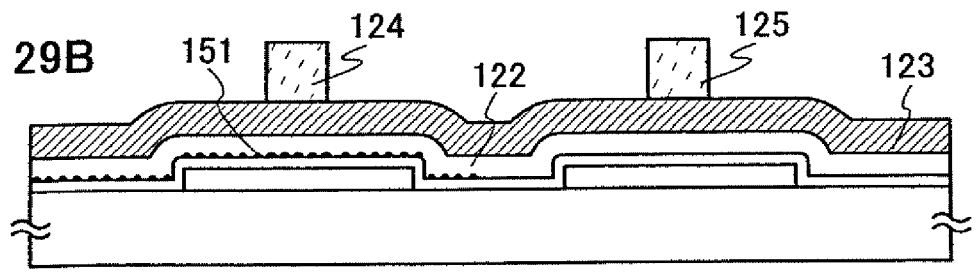

As shown in FIG. 29B, a second insulating film 122 and a first conductive film 123 are formed. Then, mask patterns 124 and 125 are formed.

Figure 29C:
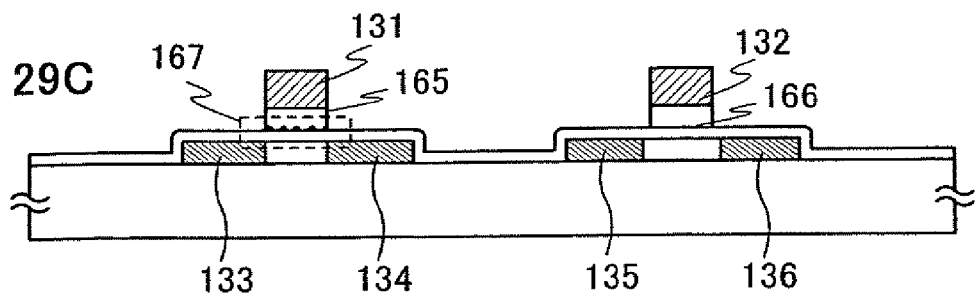
Figure 29D:
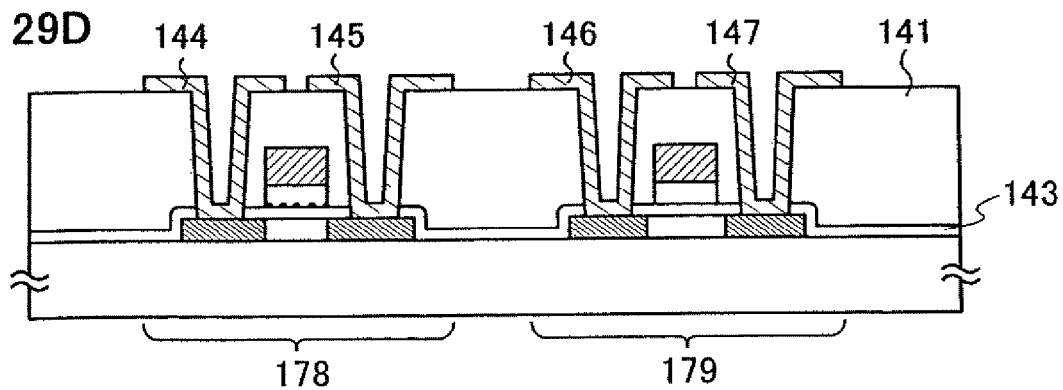

As shown in FIG. 29C, the first conductive film 123, the second insulating film 122, and a part of the remaining dispersed particles 151 are removed by etching with the mask patterns 124 and 125 to form gate electrodes 131 and 132, second insulating layer 165, 166, and a floating gate electrode 167 formed by the dispersed particles. Here, the first conductive film 123 and the second insulating film 122 are etched by dry etching. Thereafter, a part of the remaining dispersed particles 151 are etched by wet etching without removing the mask patterns 124 and 125. By the process, the gate electrode 131 and the floating gate electrode 167 are formed in a self alignment manner.

Thereafter, a memory transistor 178 and a TFT 179 can be formed in accordance with a similar process to that of Embodiment 1.

According to the foregoing processes, a semiconductor device including: the memory transistor 178 including the first semiconductor region 111, the first insulating layer 143 serving as a tunnel oxide film, the floating gate electrode 167, the second insulating layer 165, and the gate electrode 131; and the TFT 179 including the second semiconductor region 112, the first insulating layer 143 and the second insulating layer 166 serving as gate insulating films, and the gate electrode 132; all of which are formed over one substrate, can be manufactured.

Embodiment 3

In this embodiment, a process of forming a memory transistor and a MOS transistor using a single crystalline semiconductor substrate on one substrate is explained with reference to FIG. 2A to 2D.

Figure 2A:
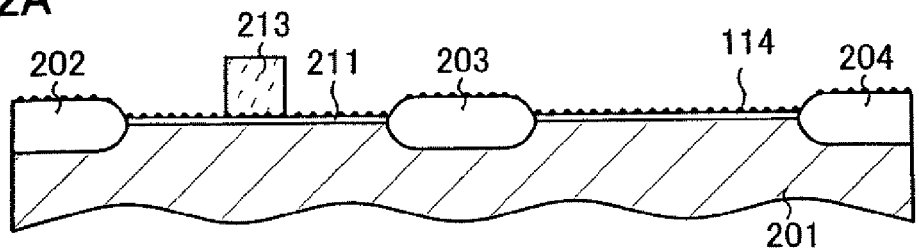
FIGS. 2A to 2D are cross-sectional views for showing a manufacturing process of a semiconductor device according to the present invention.

As shown in FIG. 2A, element isolation regions 202 to 204 are provided to a substrate 201. The substrate 201 is a single crystalline semiconductor substrate or a compound semiconductor substrate, typically, an n-type or a p-type single crystalline silicon substrate, a GaAs substrate, an InP substrate, a GaN substrate, an SiC substrate, a sapphire substrate, or a ZnSe substrate. Alternatively, an SOI substrate (Silicon On Insulator) is used as the substrate 201. In this embodiment, a single crystalline silicon substrate is used as the substrate 201. The element isolation regions 202 to 204 can use known LOCOS (Local Oxidation of Silicon) or a trench isolation method. As the element isolation regions 202 to 204, a silicon oxide film is formed by oxidizing a part of a silicon substrate by LOCOS. Thereafter, well ion injection, channel stop ion injection, and threshold voltage adjustment ion injection are appropriately carried out.

A surface of the substrate 201 is exposed by washing the surface of the substrate 201. Thereafter, a first insulating film 211 is formed by a known method. The first insulating film 211 is required to have a thin thickness since it serves as a tunnel oxide film of a memory transistor. In the case that the first insulating film 211 has a thin thickness, charges can be stored in a floating gate electrode with low voltage, and a low power consumption semiconductor device can be manufactured. Here, a silicon oxide film is formed by a thermal oxidization method as the first insulating film 211.

As with Embodiment 1, dispersed particles 114 are formed over the first insulating film 211. Then, a mask pattern 213 is formed in the region in which a memory transistor is formed afterwards.

Figure 2B:
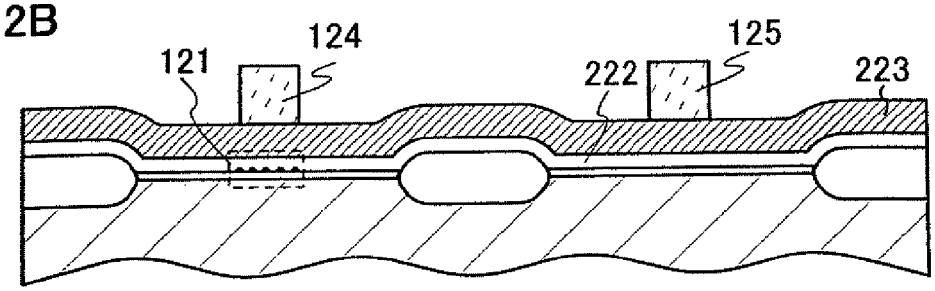

As shown in FIG. 2B, a floating electrode 121 is formed by removing a part of the dispersed particles 114 by etching. A second insulating film 222 is formed over the element isolation regions 202 to 204, the first insulating film 211, and the floating electrode 121. The floating gate electrode can be formed by using the same process as that shown in Embodiment 2. Then, a first conductive film 223 is formed over the second insulating film 222. Each of the second insulating layer 222 and the first conductive film 223 can be formed by a similar material and a similar process to those used for the second insulating film 122 and the first conductive film 123 in Embodiment 1. Then, mask patterns 124 and 125 are formed over the first conductive film 123.

Figure 2C:
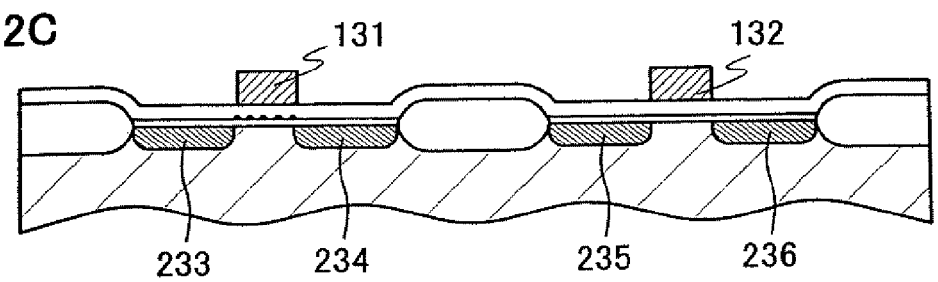

Gate electrodes 131 and 132 are formed by etching the first conductive film by using the mask patterns 124 and 125 as shown in FIG. 2C. Then, impurity elements are doped to the substrate 201 by using the mask patterns 124 and 125 and the gate electrodes 131, 132. Then, after removing the mask patterns 124 and 125, the impurity elements are activated by heat treatment, GRTA, LRTA, or the like to form source and drain regions 233 to 236.

Figure 2D:
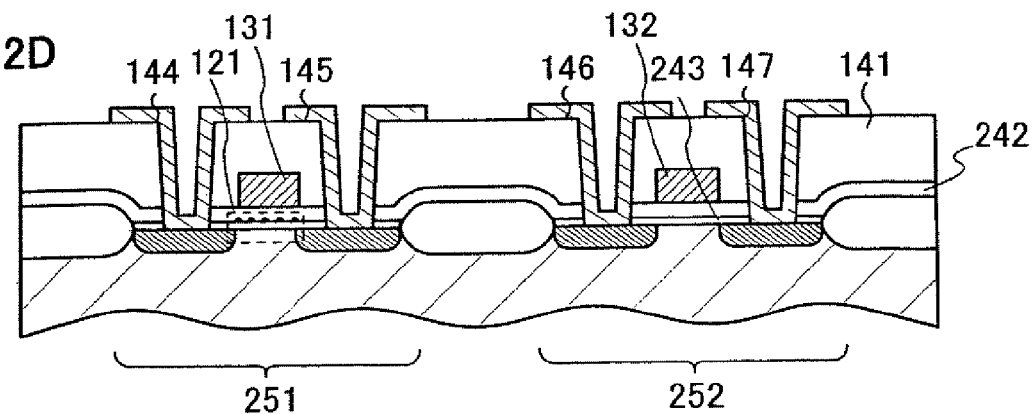

As shown in FIG. 2D, a third insulating film is formed over the second insulating film 222. Thereafter, a part of the third insulating film, the second insulating film 222, and a part of the first insulating film 211 are etched to form contact holes, simultaneously, parts of the source and drain regions is exposed. Here, the etched third insulating film is referred to as a third insulating layer 141, the etched second insulating film is referred to as a second insulating layer 242, and the etched first insulating film is referred to as a first insulating film 243. Thereafter, source and drain electrodes 144 to 147 that are connected to the source and drain regions are formed.

According to the foregoing processes, a semiconductor device having a memory transistor 251 including the substrate 201 using a single crystalline semiconductor, the first insulating layer 243 serving as a tunnel oxide film, the floating gate electrode 121, the second insulating layer 242, and the gate electrode 131; and the MOS transistor 252 including the substrate 201 using a single crystalline semiconductor, the first insulating layer 243 and the second insulating layer 242 serving as gate insulating films, and the gate electrode 132; all of which are formed on one substrate can be manufactured. The MOS transistor 252 can be appropriately used for a peripheral circuit such as a decoder circuit for selecting a memory transistor, a write/read circuit, or the like; a functional circuit, such as a CPU, a DRAM, an image processing circuit, a sound processing circuit, or the like; or a driver circuit such as a buffer circuit, a shift register circuit, a level shifter circuit, a sampling circuit, or the like.

The memory transistor and the TFT can be separated by using the SOI substrate (Silicon On Insulator) as the substrate 201 and performing a process described in Embodiment 1 by virtue of an insulating oxide film formed on the silicon substrate. By adhering the separated memory transistor and MOS transistor to the flexible substrate as with Embodiment 1, a thin-shaped semiconductor device can be manufactured.

Since dispersed particles are used as the floating electrode of the memory transistor, discharge of stored charges due to defects of the tunnel oxide film can be prevented. Therefore, a semiconductor device having high reliability can be manufactured.

EXAMPLE 1

In this example, a method for manufacturing a semiconductor device having a memory transistor and a CMOS circuit over one substrate is explained with reference to FIGS. 3A to 3F. In this example, each of the memory transistor and a TFT has a single drain structure.

Figure 3A:
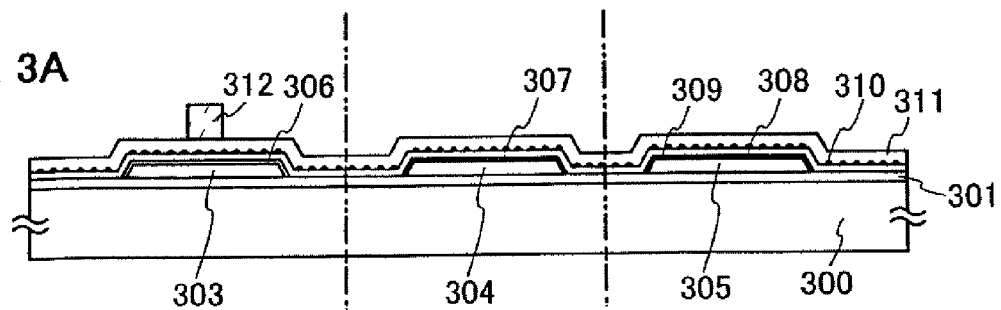
FIGS. 3A to 3F are cross-sectional views for showing a manufacturing process of a semiconductor device according to the present invention.

As illustrated in FIG. 3A, a first insulating film 301 is formed over a glass substrate 300. The first insulating film 301 serves as a blocking film for preventing impurity elements from the substrate from diffusing into a semiconductor region that is formed afterwards. Accordingly, as the first insulating film 301, a base film containing an insulating film such as silicon oxide film, silicon nitride film, or silicon oxynitride film is formed. Moreover, a silicon oxide film and a silicon nitride film may be laminated.

An amorphous silicon film is formed over the first insulating film 301. A crystalline silicon film is formed by irradiating the amorphous silicon film with pulse-oscillated laser light having a repetition rate of 80 MHz. Then, the crystalline silicon film is patterned into a desired shape by a photolithography process and an etching process to form a first semiconductor region 303, a second semiconductor region 304, and a third semiconductor region 305. Further, the first semiconductor region 303 serves as an active region of a memory transistor to be formed afterwards, the second semiconductor region 304 serves as an active region of an n-channel TFT to be formed afterwards, and the third semiconductor region 305 serves as an active region of a p-channel TFT to be formed afterwards.

After removing a natural oxide film formed over the surfaces of the first to third semiconductor regions 303 to 305, the surfaces are exposed to ozone water containing hydroxy radical for several ten seconds to several minutes to form silicon oxide films over the surfaces of the first to third semiconductor regions 303 to 305. Thereafter, the densification of the silicon oxide films is carried out by GRTA (Gas Rapid Thermal Anneal) and LRTA (Lamp Rapid Thermal Anneal) to form second insulating films 306 to 308 having thicknesses of 1 to 2 nm. By the foregoing methods, it is possible to process in a short time at high temperature, and so the fine and dense second insulating films having thin thicknesses can be formed without expanding and contracting. Then, a third insulating film 309 is formed over the second insulating films 306 to 308 and the glass substrate 300. Here, a silicon nitride film or a silicon nitride oxide film (SiNO (the number of nitrogen is higher than that of oxygen) having a thickness of 1 to 5 nm is formed as the third insulating film 309.

Silicon small particles 310 are formed as scattered particles over the third insulating film 309 by plasma CVD. Then, a fourth insulating film 311 is formed over the silicon small particles 310 and the third insulating film 309. As the fourth insulating film 311, a silicon nitride film or a silicon nitride oxide film (SiNO (the number of nitrogen is higher than that of oxygen) having a thickness of 10 to 20 nm is formed by plasma CVD. A mask pattern 312 is formed over the first semiconductor region 303 by a photolithography process.

Figure 3B:
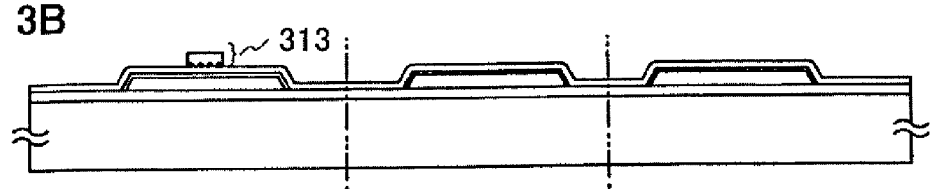

As shown in FIG. 3B, an insulating layer 313 having a floating gate electrode is formed by removing a part of the fourth insulating film 311 and the silicon small particles 310 by etching with a mask pattern 312. Here, the fourth insulating film is etched by dry etching to expose the silicon small particles 310, and the silicon small particles are etched by using NMD3 solution (solution containing 0.2 to 0.5% of tetramethyl ammonium hydrooxide) or the like. Here, the floating electrode is formed by the silicon small particles which are remained after the etching process.

Figure 3C:
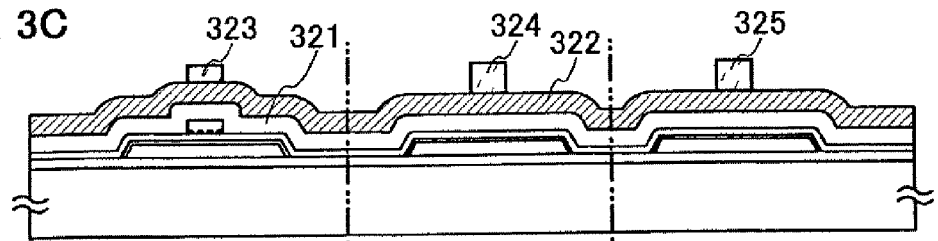

As illustrated in FIG. 3C, a fifth insulating film 321 is formed over the insulating layer 313 having the floating gate electrode. As the fifth insulating film 321, silicon oxide film or a silicon oxynitride film (SiON (the number of oxygen is higher than that of nitrogen)) having a thickness of 20 to 50 nm is formed by plasma CVD.

A first conductive film 322 is formed. As the first conductive film 322, a tungsten film is formed to have a thickness of 400 nm by sputtering. Mask patterns 323 to 325 are formed by a photolithography process over the first to third semiconductor regions 303 to 305.

Figure 3D:
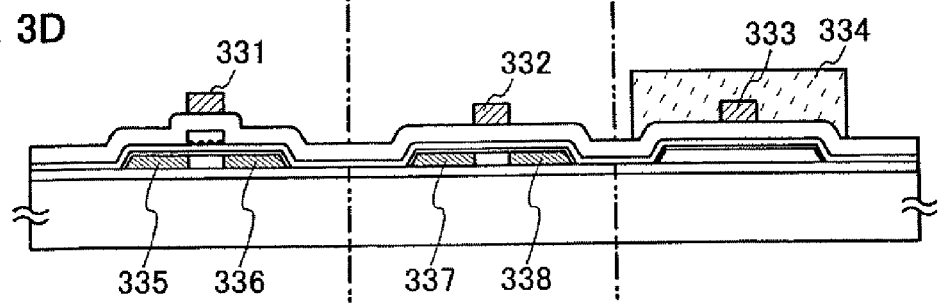

As shown in FIG. 3D, gate electrodes 331 to 333 are formed by etching the first conductive film 322 by using the mask patterns 323 to 325. Here, the gate electrodes are formed to have a width of 0.2 to 1.5 nm, preferably, 0.2 to 0.7 nm. After removing the mask patterns 323 to 325, a mask pattern 334 is newly formed over the third semiconductor region 305.

Impurity elements are doped to the first and the second semiconductor regions 303 and 304 by using the gate electrodes 331 and 332 as masks. Here, phosphorous (P) that is an impurity element imparting n-type conductivity is doped to each semiconductor region to form source and drain regions 335 to 338 imparting n-type conductivity.

Figure 3E:
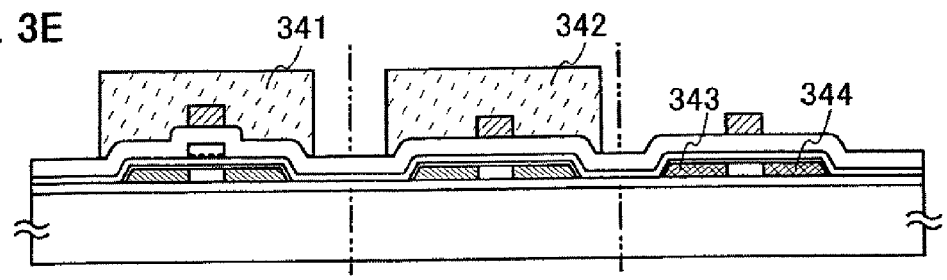

As shown in FIG. 3E, after removing the mask pattern 334, mask patterns 341 and 342 are formed by a photolithography process over the first and the second semiconductor regions 303 and 304. Then, impurity elements are doped to the third semiconductor region 305 by using the gate electrode 325 as a mask. Here, boron (B) that is an impurity element imparting p-type conductivity is doped to each semiconductor region to form source and drain regions 343 and 344 imparting p-type conductivity. Then, after removing the mask patterns 341, 342, impurity elements in the source region and the drain region are activated by heat. Thereafter, hydrogenation of the surfaces of the semiconductor regions may be carried out by forming and heating an insulating film containing hydrogen over the fifth insulating film 321.

Figure 3F:
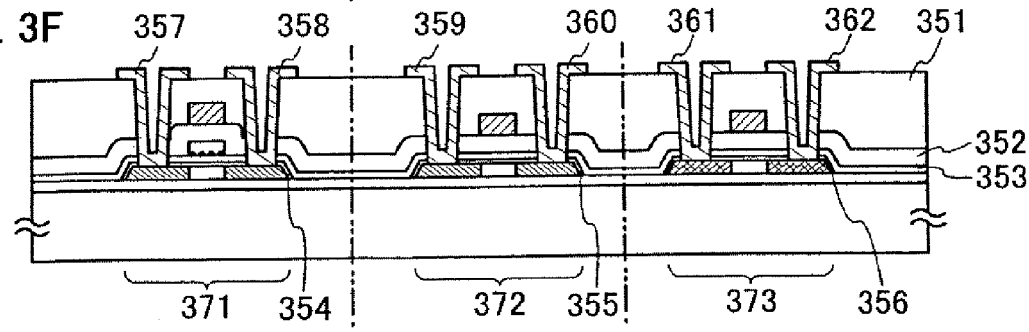

As shown in FIG. 3F, a sixth insulating film that serves as an interlayer insulating film is formed over the fifth insulating film 321. Here, the sixth insulating film is formed by coating siloxane based resin to be baked. Then, contact holes are formed by etching the sixth, fifth, third, and second insulating films to expose a part of the source and drain regions 335 to 338, 343, and 344. The etched sixth insulating film is referred to as a sixth insulating layer 351, the etched fifth insulating film is referred to as a fifth insulating layer 352, and the etched third insulating film is referred to as a third insulating layer 353. In addition, the etched second insulating film is referred to as second insulating layers 354 to 356. Then, a titanium film, an aluminum silicon alloy film, and a titanium film are stacked by a sputtering method, and then, source and drain electrodes 357 to 362 are formed by a photolithography process and an etching process.

According to the foregoing processes, the first semiconductor region 303, the second and third insulating layers 354, 353 serving as tunnel oxide films, the insulating layer 313 having the floating gate electrode, the fifth insulating layer 352, and the memory transistor 371 formed by the gate electrode 331 can be formed. Further, the second semiconductor region 304, the second insulating layer 355 serving as a gate insulating film, the third insulating layer 353, and the n-channel TFT 372 composed of the fifth insulating layer 352 and the gate electrode 332 can be formed. In addition, the third semiconductor region 305; the second insulating layer 356, the third insulating layer 353, and the fifth insulating layer 352 serving as a gate insulating film; and the p-channel TFT 373 composed of and the gate electrode 333 can be formed. Moreover, a semiconductor device that has the memory transistor 371 having a single drain structure, the n-channel TFT 372, and the p-channel TFT 373, all of which are formed over one substrate can be formed.

This example can be used by combining with each Embodiment 1 to 3.

EXAMPLE 2

In this example, a method for manufacturing a semiconductor device having a memory transistor and a CMOS circuit, each of which is formed over one substrate is explained with reference to FIG. 3A to 4E. In this example, the memory transistor and a TFT have lightly doped drain regions covered by a side wall (side wall spacer) and the region of the side wall.

Figure 4A:
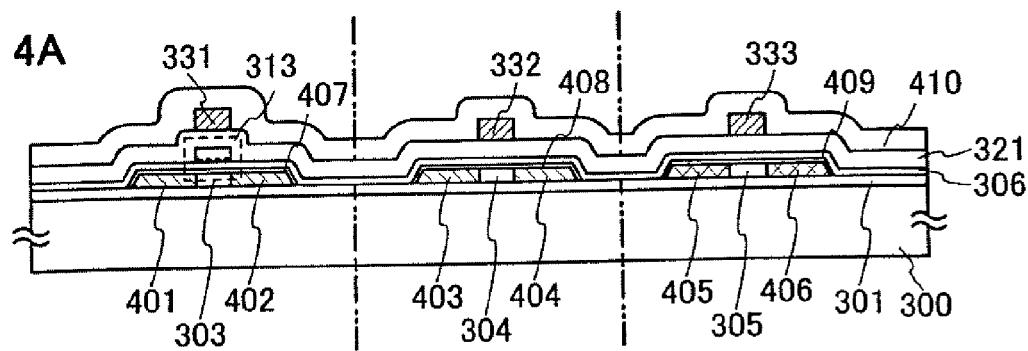
FIGS. 4A to 4E are cross-sectional views for showing a manufacturing process of a semiconductor device according to the present invention.

In this example, since up to a process of forming a gate electrode is the same as that explained in Example 1, subsequent processes thereof are explained. According to the process explained in Example 1, the memory transistor and gate electrodes 331 to 333 of an n-channel TFT and a p-channel TFT are formed as shown in FIG. 3D. As shown in FIG. 4A, phosphorous (P) that is an impurity element imparting n-type conductivity is doped to the memory transistor and a semiconductor region of the n-channel TFT (a first semiconductor region 303 and a second semiconductor region 304) to form first lightly doped drain regions imparting n-type conductivity (hereinafter, a first n-type impurity region) 401 to 404. Then, boron (B) that is an impurity element imparting p-type conductivity is doped to a semiconductor region of a p-channel TFT (a third semiconductor region 305) to form first lightly doped drain regions imparting p-type conductivity (hereinafter, a first p-type impurity region) 405, 406.

A sixth insulating film 410 is formed over gate electrodes 331 to 333 and the fifth insulating film 321. As the sixth insulating film, a silicon oxide film is formed by a CVD method.

Figure 4B:
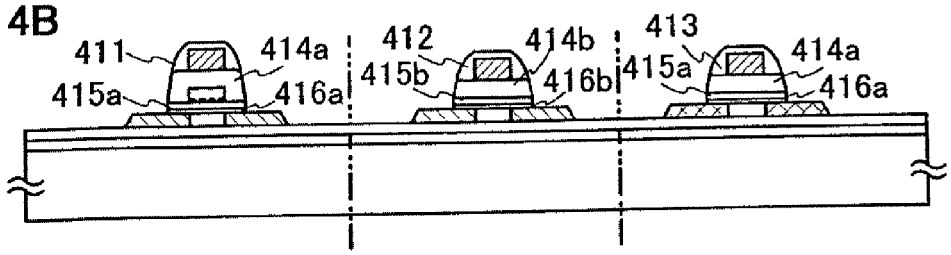

Then, the sixth insulating film 410 is anisotropically etched by a RIE (Reactive Ion Etching) method to from side walls (side wall spacers) 411 to 413 as shown in FIG. 4B, in which case a part of or all of the second to fifth insulating films are etched depending on a material for the insulating film. Here, the first to fourth semiconductor regions serve as etching stoppers and the second to fifth insulating films are etched. Here, the etched second insulating films 407 to 409 referred to as second insulating layers 416a to 416c, respectively, the etched third insulating film 321 is referred to as third insulating layers 415a to 415c, and the etched fifth insulating film 410 is referred to as second insulating layer 414a to 414c.

Figure 4C:
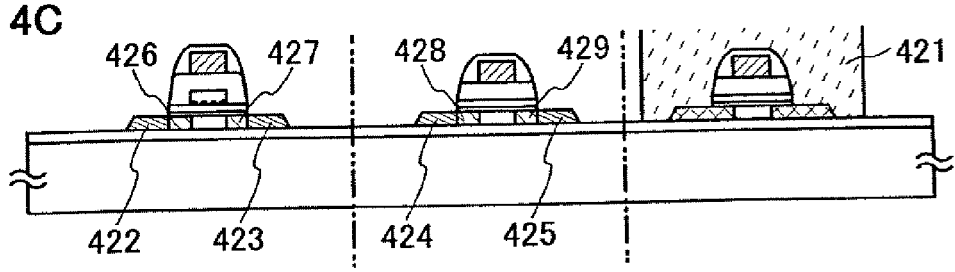

As shown in FIG. 4C, a mask pattern 421 for covering the third semiconductor region 305 that is a semiconductor region of a p-channel TFT to be formed afterwards is formed by a photolithography process. Then, highly doped drain regions (a source region and a drain region) imparting n-type conductivity 422 to 425 are formed by doping phosphorous (P) that is an impurity element imparting n-type conductivity to the first and the second semiconductor regions 303 and 304. At this time, first lightly doped drain regions (hereinafter, second n-type impurity region (LDD region)) imparting n-type conductivity covered by a side wall are formed, in which case, the second n-type impurity regions 426 to 429 are preferably formed to have widths of 0.01 to 0.3 μm. Thereafter a mask pattern 421 is removed. The second n-type impurity regions are lightly doped drain regions.

Figure 4D:
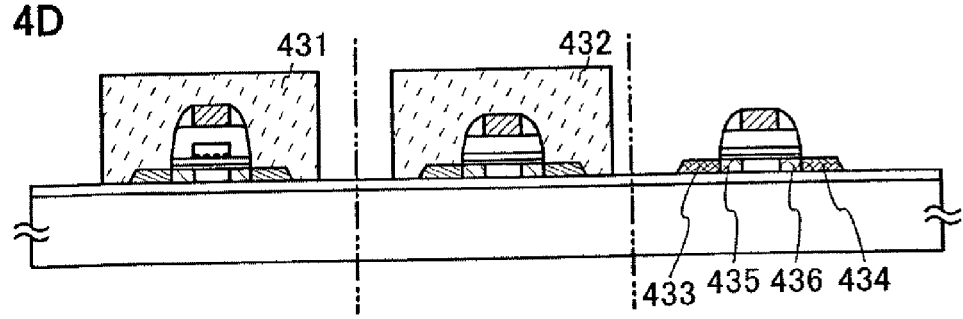
Figure 4E:
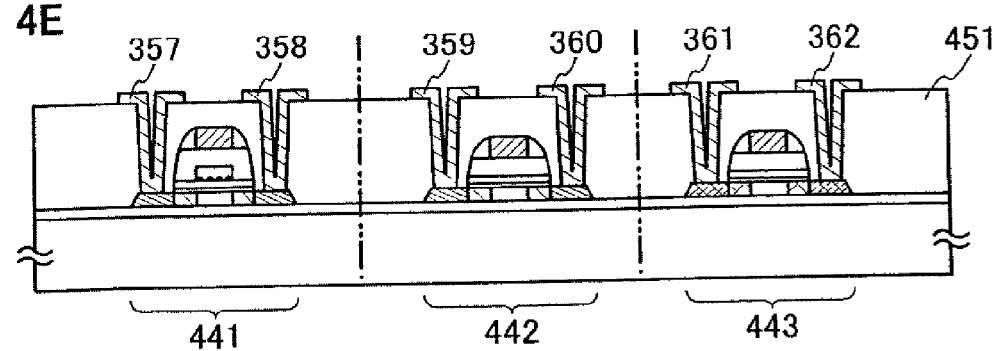

As shown in FIG. 4D, mask patterns 431 and 432 for covering each of the first and the second semiconductor regions 303 and 304 are formed by a photolithography process. Then, highly doped drain regions imparting p-type conductivity (a source region and a drain region) 422 to 425 are formed by doping boron (B) that is an impurity element imparting p-type conductivity to the third semiconductor region 305. At this time, first p-type impurity regions (hereinafter, second p-type impurity region (LDD region)) 428 and 429 covered by a side wall are formed, in which case the second p-type impurity regions 428 and 429 are preferably formed to have widths of 0.01 to 0.3 μm. And then, after removing the mask patterns 431, 432, the impurity elements are activated by heating.

After forming a seventh insulating film serving as an interlayer insulating film, as in Example 1, a contact hole is formed by etching the seventh insulating film, and a part of the source and drain regions 422 to 425, 433, and 434 are exposed. The seventh insulating film is formed by the same material and method as those of the sixth insulating film in Example 1. The etched seventh insulating film is referred to as a seventh insulating layer 451. Thereafter, as in Example 1, source and drain electrodes 357 to 362 are formed.

According to the foregoing processes, a memory transistor 441 having the first semiconductor region 303, the second insulating layer 416a and the third insulating layer 415a serving as tunnel oxide films, the insulating layer 313 having a floating gate electrode, the fifth insulating layer 414a, the gate electrode 331, and the side wall 411 can be formed.

An n-channel TFT 429 that is composed of the second semiconductor region 304; the second insulating layer 416*a*, the third insulating layer 415*b*, and the fifth insulating layer 414*b*, each of which serves as a gate insulating film; the gate electrode 332; and the side wall 412 can be formed.

Further, a p-channel TFT 443 that is composed of the third semiconductor region 305; the second insulating layer 416*c*, the third insulating layer 415*c*, and the fifth insulating layer 414*c*, each of which serves as a gate insulating film; the gate electrode 333; and the side wall 413 can be formed. Moreover, a semiconductor device having the memory transistor 441, the n-channel TFT 442, and the p-channel TFT 443, all of which are formed over one substrate, can be formed.

Since the memory transistor and the TFT have side wall structures, an LDD region can be formed in a memory transistor and a TFT having submicron structures. Since the memory transistor and the TFT have the LDD regions, they have an effect of preventing deterioration due to hot carrier injection by relieving an electric field in the vicinity of a drain and an effect of reducing off current. As a result, a semiconductor device having high reliability can be manufactured.

This example can be freely combined to each of Embodiments 1 to 3, and Example 1.

EXAMPLE 3

In this example, a method for manufacturing a semiconductor device having a memory transistor and a CMOS circuit, which are formed over one substrate is explained with reference to FIGS. 5A to 5D. In this example, the memory transistor and the TFT have silicide structures.

Figure 5A:
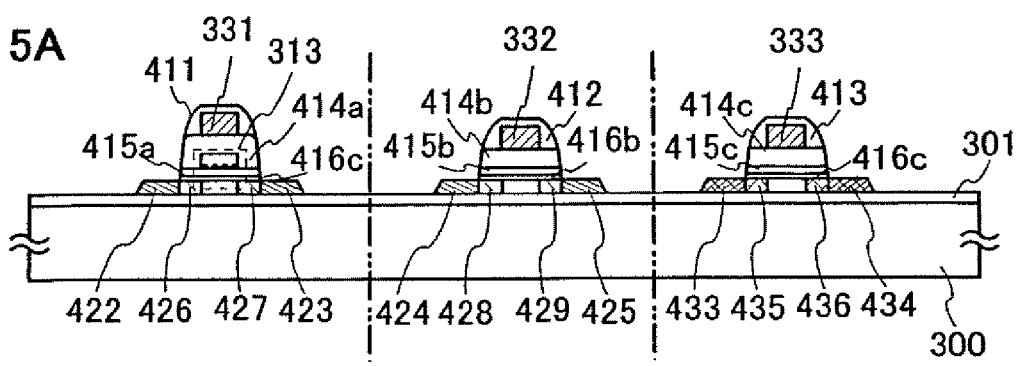
FIGS. 5A to 5D are cross-sectional views for showing a manufacturing process of a semiconductor device according to the present invention.

In this example, since up to a process of forming a source region and a drain region is the same as that explained in Example 2, subsequent processes thereof are explained. According to the process explained in Example 2, as shown in FIG. 5A, after forming side walls 411 to 413, first insulating layers 416*a* to 416*c*, second insulating layers 415*a* to 415*c*, and fifth insulating layers 414*a* to 414*c*, source and drain regions 422 to 425, 433, and 434 are formed. Thereafter, mask patterns 431, 432 are removed.

Figure 5B:
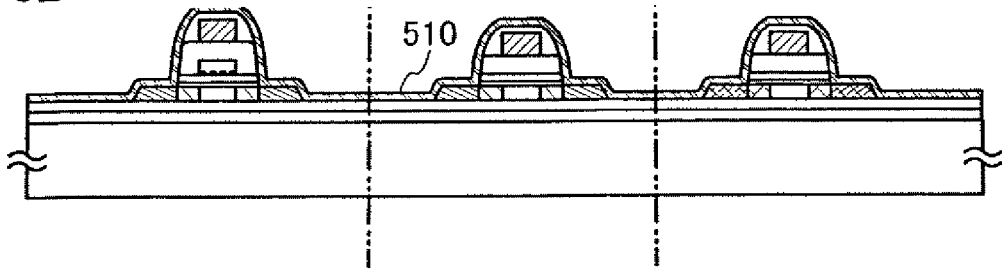

As shown in FIG. 5B, a conductive film 510 is formed. As the material for the conductive film 510, titanium (Ti), nickel (Ni), tungsten (W), molybdenum (Mo), cobalt (Co), zirconium (Zr), hafnium (Ha), tantalum (Ta), vanadium (V), neodymium (Nd), chromium (Cr), platinum (Pt), palladium (Pd), and the like are used. Here, a titanium film is formed by a sputtering method.

Figure 5C:
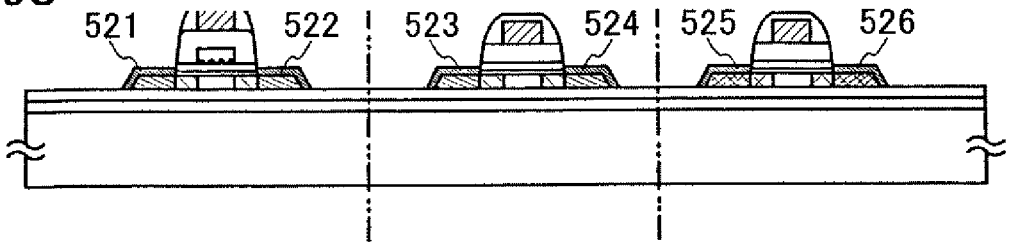
Figure 5D:
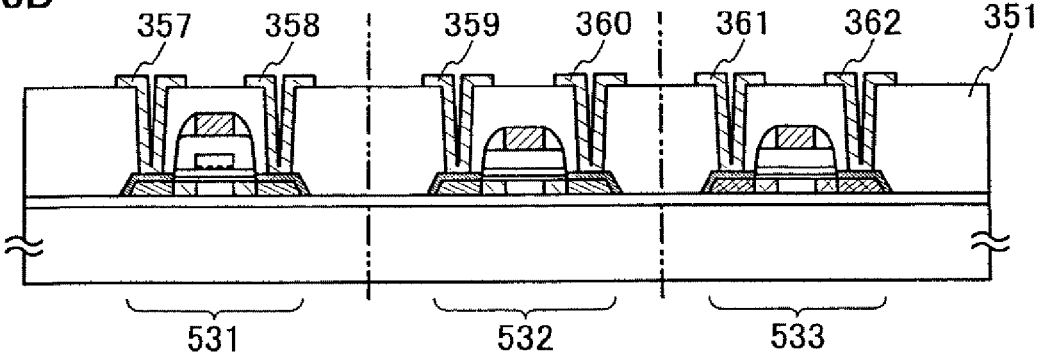

As shown in FIG. 5C, silicides 521 to 526 are formed by the reaction of silicon of exposed source and drain regions, and the conductive film by a heating process, a GRTA method, an LRTA method, or the like. Thereafter, a part of the conductive film 510 that does not react with the silicon is removed.

After forming a seventh insulating film serving as an interlayer insulating film as in Example 1, a contact hole is formed by etching a part of the seventh insulating film, and a part of the silicides 521 to 526 are exposed. Then, source and drain electrodes 357 to 362 are formed as in Example 3.

According to the foregoing processes, a memory transistor 531 having a first semiconductor region 303, the second insulating layer 416*a* and the third insulating layer 415*a* serving as tunnel oxide films, the insulating layer 313 having a floating gate electrode, the fifth insulating layer 414*a*, the gate electrode 331, and the silicides 521, 522 can be formed.

An n-channel TFT 532 that is composed of the second semiconductor region 304; the second insulating layer 416*a*, the third insulating layer 415*b*, and the fifth insulating layer 414*b*, each of which serves as a gate insulating film; the gate electrode 332; and the silicides 523, 524 can be formed.

Further, a p-channel TFT 533 that is composed of the third semiconductor region 305; the second insulating layer 416*c*, the third insulating layer 415*c*, and the fifth insulating layer 414*c*, each of which serves as a gate insulating film; the gate electrode 333; and the silicides 525, 526 can be formed. Moreover, a semiconductor device having the memory transistor 531 having a silicide structure, the n-channel TFT 532, and the p-channel TFT 533, all of which are formed over one substrate, can be efficiently formed.

Since the memory transistor and the TFT according to the present invention have silicide structures, the resistance of source and drain regions can be reduced and the semiconductor device can be made operate faster. Further, power consumption can be reduced since operation at low voltage is possible.

This example can be used by combining to each of Embodiments 1 to 3, and Examples 1 and 2.

EXAMPLE 4

In this example, a method for manufacturing a semiconductor device having a memory transistor and a CMOS circuit, which are formed over one substrate is explained with reference to FIGS. 3A to 3F, and 6A to 6D. In this example, the memory transistor and the TFT have lightly doped drain regions covered by a gate electrode (hereinafter, GOLD region).

Figure 6A:
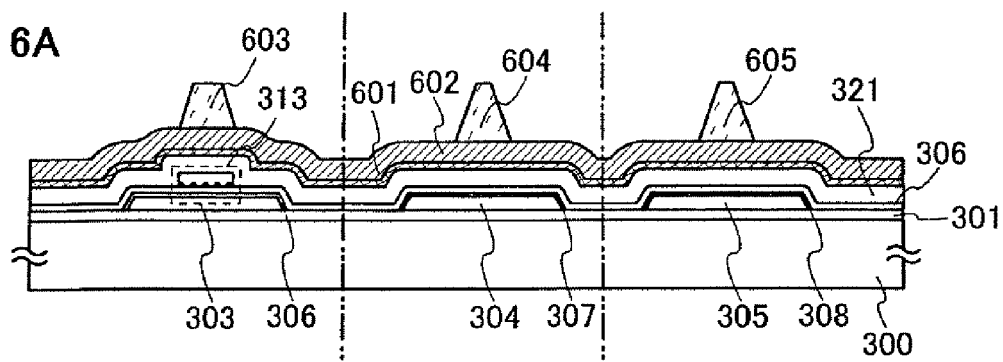
FIGS. 6A to 6D are cross-sectional views for showing a manufacturing process of a semiconductor device according to the present invention.

In this example, since up to a process of forming an insulating layer 313 having a floating gate electrode is the same as that explained in Example 1, subsequent processes thereof are explained. As shown in FIG. 3C, the insulating layer 313 having the floating gate electrode and a fifth insulating film 321 are formed. As shown in FIG. 6A, a first conductive film 601 and a second conductive film 602 are formed over the insulating layer 313 having a floating gate electrode and the fifth insulating film 321. Here, a tantalum nitride film having a thickness of 30 nm is formed as the first conductive film 601, whereas a tungsten film having a thickness of 370 nm is formed as the second conductive film.

Mask patterns 603 to 605 are formed over the second conductive film 602 by a photolithography process. Here, as the mask patterns 603 to 605, mask patterns that have tapered portions having angles (taper angle) of 40 to 80 degrees, preferably, 60 to 70 degrees in a region being contact with the second conductive film 602 are formed. The angle of the tapered portion (taper angle) is defined as an angle between a substrate surface (horizontal face) and an inclined portion of the tapered portion. In the case of forming a mask pattern having a tapered portion, a reduced projection exposure system (commonly known as stepper) or a mirror projection exposure system (commonly known as MPA) is preferably used. In the case of using the reduced projection exposure system, a mask pattern having a vertical side without having a tapered portion may be formed. In this case, a tapered portion can be formed at the side of the mask pattern by heating resist at 160 to 200° C. If a mask pattern having a tapered side can be formed, not only the foregoing exposure system but also a known exposure system can be freely used.

Figure 6B:
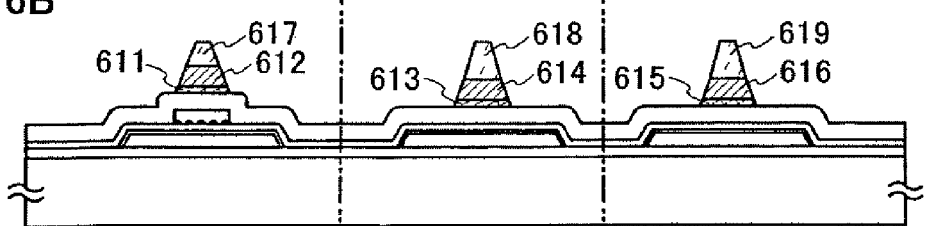

As shown in FIG. 6B, first conductive layers 611, 613, and 615 and second conductive layers 612, 614, and 616 having tapered portions are formed by etching the first conductive films 601 and 602 under a first condition. In the etching process, the mask patterns 603 to 605 are also etched, and mask patterns having narrow widths 617 to 619 are formed. The first conductive layers 611, 613, and 615 are conductive layers formed by etching the first conductive film 601. The second conductive layers 612, 614, and 616 are conductive layers formed by etching the second conductive film 602. Here, the first condition is an etching condition so that etching speeds of first conductive film and the second conductive film are almost equal to each other. In this example, the first conductive film and the second conductive film are etched by an ICP (Inductively Coupled Plasma) etching. As a result, the first conductive layers 611, 613, and 615, the second conductive layers 612, 614, and 616, and the mask patterns 617 to 619 having almost the same tapered angles are formed.

Figure 6C:
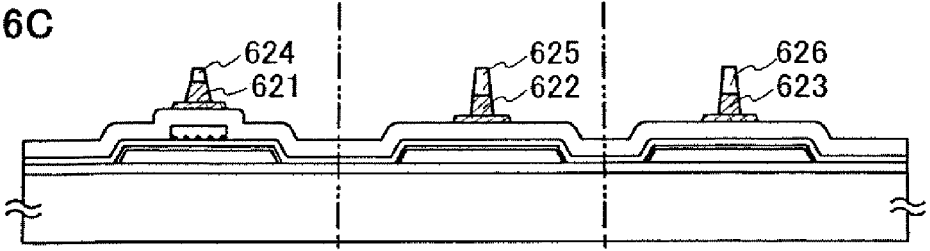
Figure 6D:
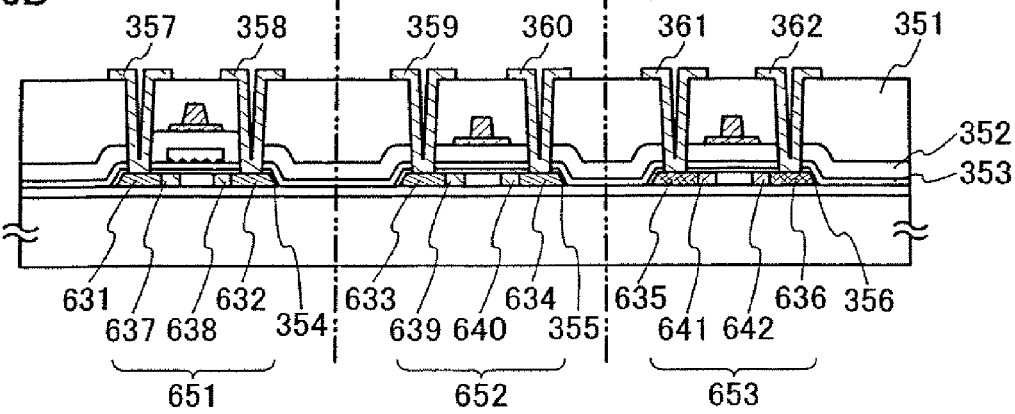

As shown in FIG. 6C, third conductive layers 621 to 623 are formed by etching the second conductive layers 612, 614, and 616 under a second condition. Here, the second condition is an etching condition for removing selectively the second conductive layers by etching. As such the condition, the second conductive layers are selectively etched while the mask patterns 617 to 619 are retreated. In this example, the second conductive layers 612, 614, and 616 are etched by an ICP (Inductively Coupled Plasma) etching. As a result, third conductive layers 621 to 623 having narrower widths than those of the first conductive layers and having larger tapered angles than those of the second conductive layers can be formed. In FIGS. 6A to 6D, reference numerals 624 to 626 denote the retreated mask patterns under the second condition.

According to the forgoing processes, the first conductive layer 611 and the third conductive layer 621 serve as gate electrodes of a memory transistor to be formed afterwards. The first conductive layer 613 and the third conductive layer 622 serve as gate electrodes of an n-channel TFT to be formed afterwards. Further, the first conductive layer 615 and the third conductive layer 623 serve as gate electrodes of a p-channel TFT to be formed afterwards.

Phosphorous (P) that is an impurity element imparting n-type conductivity is doped to first and second semiconductor regions 301 and 304 to form highly doped drain regions imparting n-type conductivity (source region and drain region) 631 to 634 and to form lightly doped drain regions imparting n-type conductivity covered by a gate electrode (GOLD region) 637 to 640 are formed. The regions of the first conductive layers 611 and 613 have thinner thicknesses than that of the third conductive layer 621. Therefore, low density impurity elements are doped to the semiconductor regions 303 and 304 that is not covered by the third conductive layers 621 and 622 but covered by the first conductive layers 611 and 613.

Boron (B) that is an impurity element imparting p-type conductivity is doped to a third semiconductor region 305 to form highly doped drain regions imparting p-type conductivity (source region and drain region) 635, 636, and to form lightly doped drain regions covered by a gate electrode (GOLD region) 641, 642. A region of the first conductive layer 615 has a thinner thickness than that of the third conductive layer 623. Accordingly, low density impurity elements are doped to the semiconductor region 305 that is not covered by the third conductive layer 623 but covered by the first conductive layer 615.

After removing the mask patterns 624 to 626, the impurity elements are activated by heating. After forming a sixth insulating film serving as an interlayer insulating film according to the process that is the same as that of Example 1, a contact hole is formed and a part of the source and drain regions 631 to 636 is exposed. Then, source and drain electrodes 357 to 362 are formed.

According to the foregoing processes, a memory transistor 651 that has the first semiconductor region 303 having the GOLD regions 637, 638, and the source and the drain regions 631, 632; the second and the third insulating layers 354, 353 serving as tunnel oxide films; the insulating layer 313 having a floating gate electrode; the fifth insulating layer 352; and the first and the third conductive layers 611, 621 serving as gate electrodes can be formed.

An n-channel TFT 652 that is composed of the second semiconductor region 304 having the GOLD regions 639, 640, and the source and drain regions 633, 634; the second, the third, and the fifth insulating layers 355, 353, and 352 serving as gate insulating films; and the first and the third conductive layers 613, 622 serving as gate electrodes can be formed.

Further, a p-channel TFT 653 that is composed of the third semiconductor region 305 having the GOLD regions 641, 642, and the source and drain regions 635, 636; the second, the third, and the fifth insulating layers 356, 353, and 352 serving as gate insulating films; and the first and the third conductive layer 613, 623 serving as gate electrodes can be formed. Moreover, a semiconductor device that has the memory transistor 651 having the GOLD regions, the n-channel TFT 652, and the p-channel TFT 653, all of which are formed over one substrate can be formed.

The memory transistor and the TFT according to the present invention can prevent deterioration of on current due to hot carrier injection by relieving an electric field in the vicinity of a drain since the memory transistor and the TFT have GOLD regions. As a result, a semiconductor device that can be operated at high speed can be manufactured.

A semiconductor device having the same advantageous effect can be manufactured by forming a memory transistor and a TFT having GOLD regions by side-etching the second conductive layer instead of manufacturing the gate electrode according to this example.

This example can be used by combining with each of Embodiments 1 to 3, and Examples 1 to 3.

EXAMPLE 5

In this example, a method for manufacturing a TFT capable of operating at high speed and a TFT having a high pressure resistance property are explained with reference to FIG. 7A to 7D.

In this example, the process up to a process of forming an insulating layer 313 having a floating gate electrode is the same as that explained in Example 1. As shown in FIG. 7A, a first semiconductor region 701, a second semiconductor region 702, a third semiconductor region 703, a fourth semiconductor region 704, and a fifth semiconductor region 705 are formed over a first insulating film 301 as in Example 1. The first semiconductor region 701 serves as an active region of a memory transistor to be formed afterwards, the second semiconductor region 702 serves as an active region of an n-channel TFT capable of operating at high speed to be formed afterwards, the third semiconductor region 703 serves as an active region of a p-channel TFT capable of operating at high speed to be formed afterwards, the fourth semiconductor region 704 serves as an active region of an n-channel TFT having a high pressure resistance property to be formed afterwards, and the fifth semiconductor region 705 serves as an active region of a p-channel TFT having a high pressure resistance property to be formed afterwards.

As in Example 1, second insulating films 706 to 710 are formed over the surfaces of the first to the fifth semiconductor regions. The second insulating films 706 to 710 are formed by the same material and the same method as those of the second insulating films 306 to 309 in Example 1. Then, a third insulating film 306 is formed. Silicon microcrystals 310 and a fourth insulating film 311 are formed over the third insulating film 306. And then, a mask pattern 312 is formed over the first semiconductor region 701 by a photolithography process.

As shown in FIG. 7B, the insulating layer 313 having a floating gate electrode is formed by removing a part of the fourth insulating film 311 and the silicon microcrystals 310 with the mask pattern 312 by etching. Then, after removing the mask pattern 312, a fifth insulating film 711 is formed. The fifth insulating film 711 is formed by the same material and the same method as those of the fifth insulating film 321 in Example 1. And then, mask patterns 712, 713 are formed over the first semiconductor region 701, the fourth semiconductor region 704, and the fifth semiconductor region 705 by a photolithography process.

As shown in FIG. 7C, a part of the fifth insulating film 711 that is not covered by the mask patterns 712, 713 is etched, in which case the fifth insulating film is etched under an etching condition so that the etching speed of the fifth insulating film 711 is higher than that of the fourth insulating film 311. As a result, the fifth insulating film over the second and the third semiconductor regions 702 and 703 is etched. An etched fifth insulating film 721 is remained over the first, the fourth, and the fifth semiconductor regions 701, 704, and 705. As a result, a gate insulating film of a TFT capable of operating at high speed afterwards is formed to have a thickness of 1 to 10 nm, preferably, 2 to 7 nm. Thereafter, the mask patterns 712, 713 are removed.

A first conductive film 722 is formed over the etched fifth insulating film 721 and the exposed fourth insulating film 311. The first conductive film 722 is formed by using appropriately the same material and method as those of the first conducive film 322 in Example 1.

Mask patterns 723 to 727 are formed over the first conductive film 722 by a photolithography process.

As shown in FIG. 7D, gate electrodes 731 to 735 are formed by etching the first conductive layer with the mask patterns 723 to 727. Then, as in Example 1, phosphorous (P) that is an impurity element imparting n-type conductivity is doped to the first semiconductor region 701, the second semiconductor region 702, and the fourth semiconductor region 704 to form source and drain regions 736 to 741 imparting n-type conductivity. Further, boron (B) that is an impurity element imparting p-type conductivity is doped to the third semiconductor region 703 and the fifth semiconductor region 705 to form source and drain regions 742 to 745 imparting p-type conductivity. And then, after removing the mask patterns 723 to 727, the impurity elements are activated by heating. After forming a sixth insulating film serving as an interlayer insulating film, a contact hole is formed as in Example 1 and a part of the source and drain regions is exposed.

A part of each of the sixth insulating film to the second insulating film is etched to form a contact hole and a part of the source and drain regions is exposed. The etched sixth insulating film is referred to as a sixth insulating layer 746, the etched fifth insulating film is referred to as a fifth insulating layer 747, the etched third insulating film is referred to as a third insulating layer 748, and the etched second insulating film is referred to as second insulating layers 749 to 753. Then, source and drain electrodes 754 to 763.

According to the foregoing processes, the memory transistor 771 that has the first semiconductor region 701, the second insulating layer 749 and the third insulating layer 748 serving as tunnel oxide films, the insulating layer 313 having a floating gate electrode, the fifth insulating layer 747, and the gate electrode 731 can be formed.

An n-channel TFT 772 capable of operating at high speed that is composed of the second semiconductor region 702, the second insulating layer 750 and the third insulating layer 748 serving as gate insulating films, and the gate electrode 732 can be formed.

A p-channel TFT 773 capable of operating at high speed that is composed of the third semiconductor region 703, the second insulating layer 751 and the third insulating layer 748 serving as gate insulating films, and the gate electrode can be formed.

An n-channel TFT 774 having a high pressure resistance composed of the fourth semiconductor region 704, the second insulating layer 752, the third insulating layer 748, and the fifth insulating layer 747 serving as gate insulating films, and the gate electrode 735 can be formed.

A p-channel TFT 775 having a high pressure resistance composed of the fifth semiconductor region 705, the second insulating film 753, the third insulating layer 748, and the fifth insulating layer 747 serving as gate insulating films, and the gate electrode 735 can be formed.

A semiconductor device having the memory transistor 771, the n-channel TFT 772 and the p-channel TFT 773 capable of operating at high speed, and the n-channel TFT 774 and the p-channel TFT 775 having high pressure resistance properties, all of which are formed over one substrate can be manufactured.

That is, a memory transistor, a TFT, for example, a functional circuit that emphasizes high speed operation such as a CPU, a DRAM, an image processing circuit, a voice processing circuit; and a driver circuit that emphasizes a high pressure resistance such as a buffer circuit, a shift register circuit, a level shifter circuit, and a sampling circuit can be formed over one substrate. Accordingly, a semiconductor device having various functions and structures such as a system LSI can be manufactured over one substrate.

This example can be used by combining with each of Embodiments 1 to 3, and Examples 1 to 4.

EXAMPLE 6

Figure 14A:
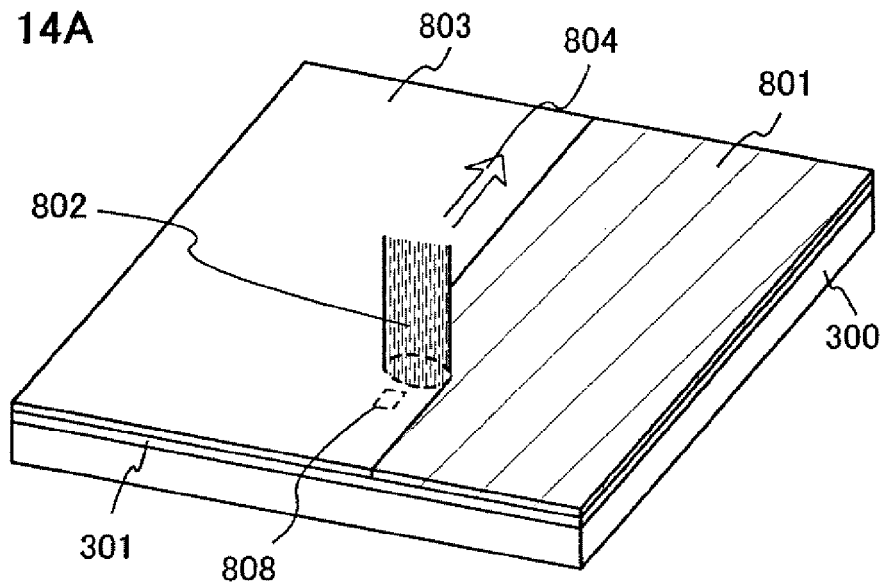
FIGS. 14A and 14B are perspective views for showing a manufacturing process of a semiconductor device according to the present invention.
Figure 14B:
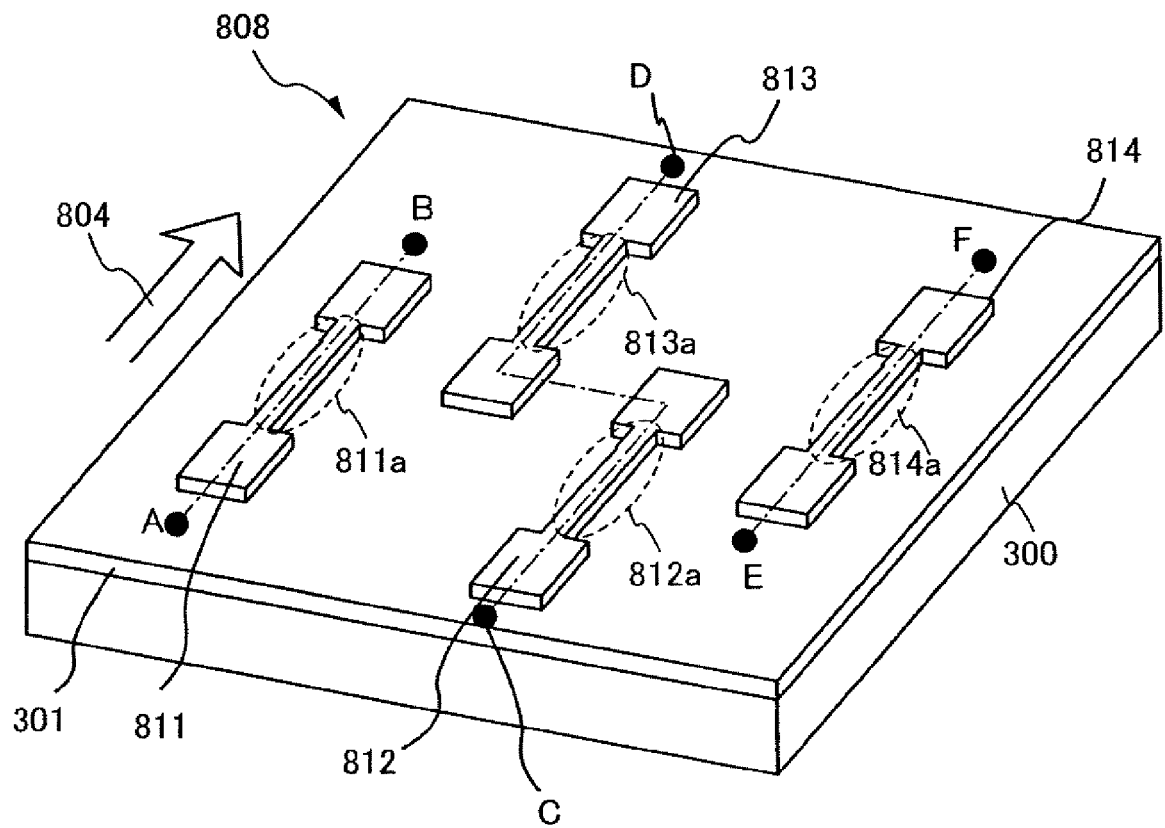

In this example, a method for manufacturing a low power consumption semiconductor device is explained with reference to FIGS. 8A to 10B, and FIGS. 14A and 14B. FIGS. 14A and 14B are perspective views of a substrate according to this example. FIGS. 8A to 10B are schematic cross-sectional views for showing an n-channel TFT (E-F) having a memory transistor (A-B), a CMOS circuit (C-D), and a p-type lightly doped drain region, each of which is illustrated in FIGS. 14A and 14B. In this example, a region in which an LDD region is overlapped with a gate electrode is referred to as a Lov region, whereas a region in which an LDD region is not overlapped with a gate electrode is referred to as a Loff region.

Figure 8A:
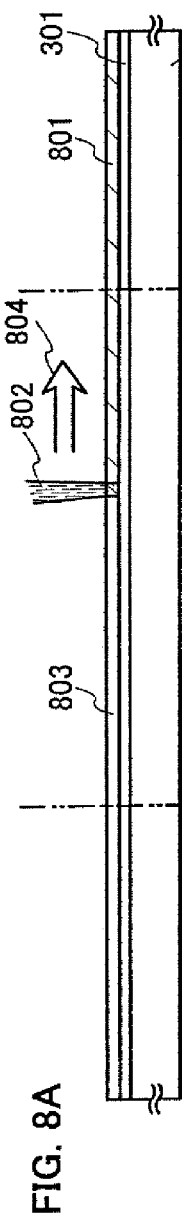
FIGS. 8A to 8D are cross-sectional views for showing a manufacturing process of a semiconductor device according to the present invention.

As shown in FIG. 8A, a first insulating film 301 is formed over a glass substrate 300. Then, an amorphous silicon film 801 is formed over a first insulating film 301. And then, a crystalline silicon film 803 is formed by emitting laser light 802 to the amorphous silicon film 801. Here, as shown in FIG. 14A, the crystalline silicon film 803 having crystal grains grown continuously in a scanning direction 804 indicated by an arrow is formed by emitting pulse laser light at an oscillation frequency of 80 MHz as the laser light 802 to the amorphous silicon film 801. By forming single crystalline crystal grains extended long along with the scanning direction, a semiconductor film having hardly crystal grains that prevent carrier's movement of a TFT can be formed.

Figure 8B:
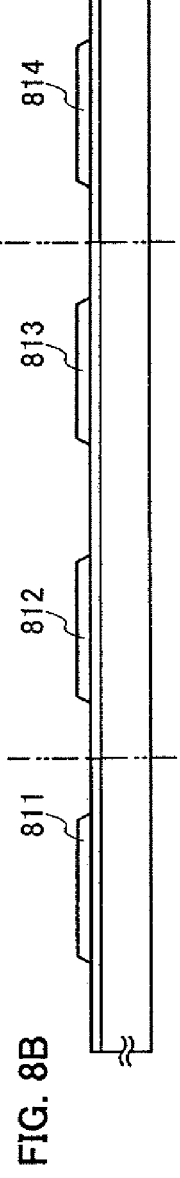

As shown in FIG. 8B, a mask pattern is formed over the crystalline silicon film 803 to form a first semiconductor region 811, a second semiconductor region 812, a third semiconductor region 813, and a fourth semiconductor region 814 by removing a part of the crystalline silicon film 803 with the mask pattern by etching. The first to fourth semiconductor regions are etched so that a memory transistor and a TFT channel region, each of which is formed afterwards, are parallel to the scanning direction 804 of the laser light 802.

FIG. 14B is an enlarged view of the first to fourth semiconductor regions formed with a part of the crystalline silicon film 803. Channel regions 811a to 814a of the first to fourth semiconductor regions 811 to 814 are respectively parallel to the scanning direction 804 of the laser light. The first semiconductor region 811 serves as an active region of a memory transistor 896a that is formed afterwards, the second semiconductor region 812 serves as an active region of a p-channel TFT 896b that is formed afterwards, the third semiconductor region 813 serves as an active region of an n-channel TFT 896c that is formed afterwards, and the fourth semiconductor region 814 serves as an active region of an n-channel TFT 896d having a p-type lightly doped drain region.

Figure 8C:
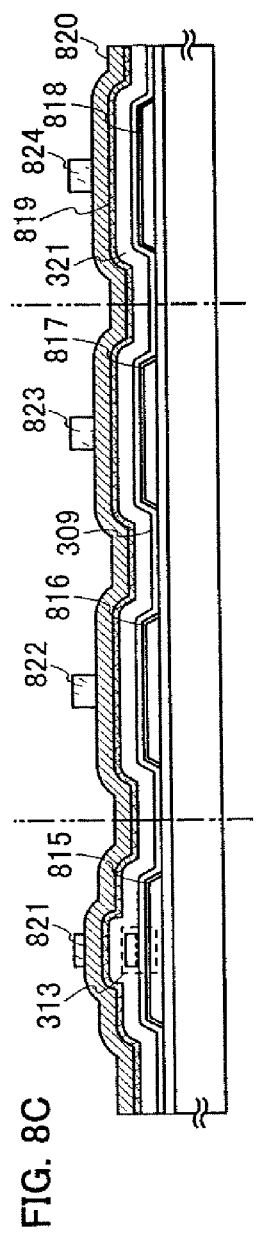

As shown in FIG. 8C, second insulating films 815 to 818 are formed by oxidizing the surfaces of the first to fourth semiconductor regions to form a third insulating film 309 over the first insulating film 301 and the second insulating films 815 to 818. The second insulating films 815 to 818 can be formed by the same material and method as those of the second insulating films 306 to 308 in Example 1.

A first insulating film 313 having a floating gate electrode is formed over the third insulating film 309 by the same process as in Example 1. Then, a fourth insulating film 321, a first conductive film 819, and a second conductive film 820 are stacked over the third insulating film 309 and an insulating layer 313 having a floating gate electrode. And then, mask patterns 821 to 824 are formed by a photolithography process. Here, a tantalum nitride film in a thickness of 30 nm is formed as the first conductive film 819 and a tungsten film in a thickness of 370 nm is formed as the second conductive film 820.

Figure 8D:
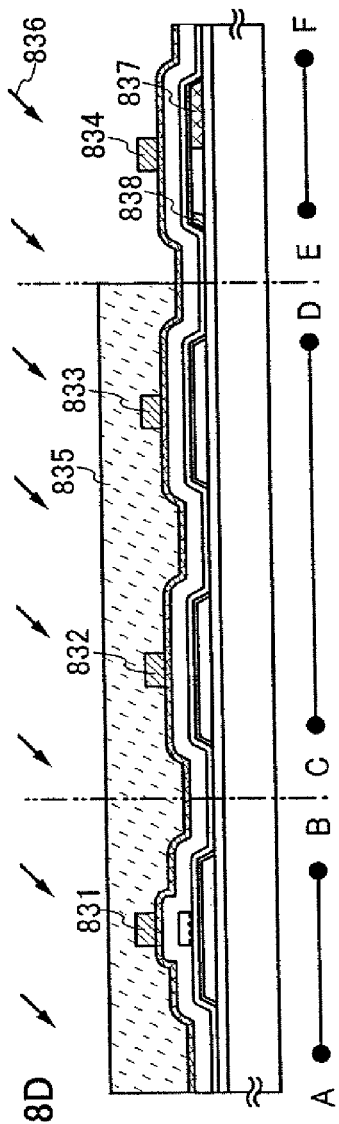

As illustrated in FIG. 8D, first conductive layers 831 to 834 are formed by etching the second conductive film 820 with the mask patterns 821 to 824. Here, the second conductive film is preferably etched under a condition so that an etching speed of the second conductive film 820 is higher than that of the first conductive film 819. According to the process, only the second conductive film can be selectively etched.

Here, a mask pattern 835 that covers the first to third semiconductor regions 811 to 813 are formed by a photolithography process. Then, an impurity element 836 imparting p-type conductivity is doped. Here, an impurity element imparting p-type conductivity is doped to the surfaces of each of the semiconductor regions at an angle of 0 to 60 degrees, preferably, 5 to 45 degrees to form first p-type impurity regions 837, 838. Since the impurity element is shielded by the gate electrode and doped to the semiconductor region, the first p-type impurity region 838 is not penetrated behind the gate electrode. Here, boron (B) is doped to the first p-type impurity region so that the region contains the impurity elements with density of approximately $5 \times 10^{17}$ to $5 \times 10^{18}$ atoms/$cm^3$. Alternatively, the boron (B) may be doped with the density of approximately $5 \times 10^{16}$ to $5 \times 10^{17}$ atoms/$cm^3$. As shown in FIG. 14B, the channel region of the semiconductor region is arranged in one direction. Accordingly, impurity elements can be doped to the semiconductor region covered by the gate electrode without rotating the substrate by doping the impurity elements obliquely to the surface of the semiconductor region as indicated by an arrow. When impurity elements are doped from either of the source region or the drain region to another, the impurity elements are doped to a semiconductor region covered by the gate electrode. That is, since the substrate is not required to be rotated, impurity elements can be doped to either of the semiconductor regions even if the substrate 800 is a large substrate.

Figure 21A:
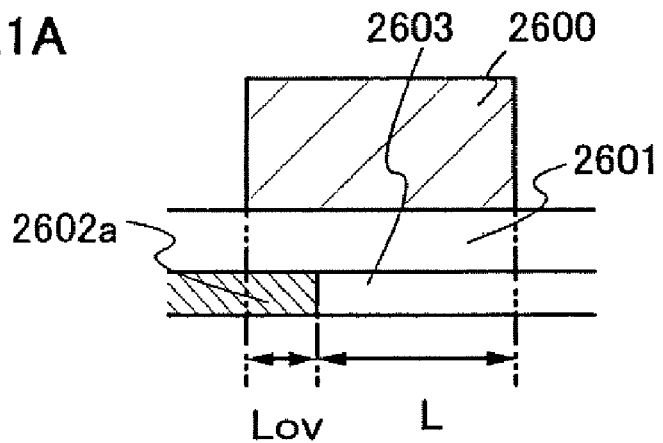
FIGS. 21A to 21C are views for showing a definition of $L_{OV}$.

A channel length L of the TFT and a length $L_{OV}$ of a Lov region 2602a in a channel length direction are explained. In this example, the channel length L of the TFT and the length $L_{OV}$ of the Lov region 2602a are defined as those in FIG. 21A. Basically, these lengths and a width of a gate electrode 2600 have the equality, that is, width=$L+L_{OV}$, as shown in FIG. 21A. In the case that doped impurity elements are dispersed by a heating process at comparable high temperature after doping the impurity elements to the substrate, boundaries of the channel region 2603 become vague. FIG. 21A shows a simple structural diagram of the channel region 2603 to distinguish the boundaries.

Figure 21B:
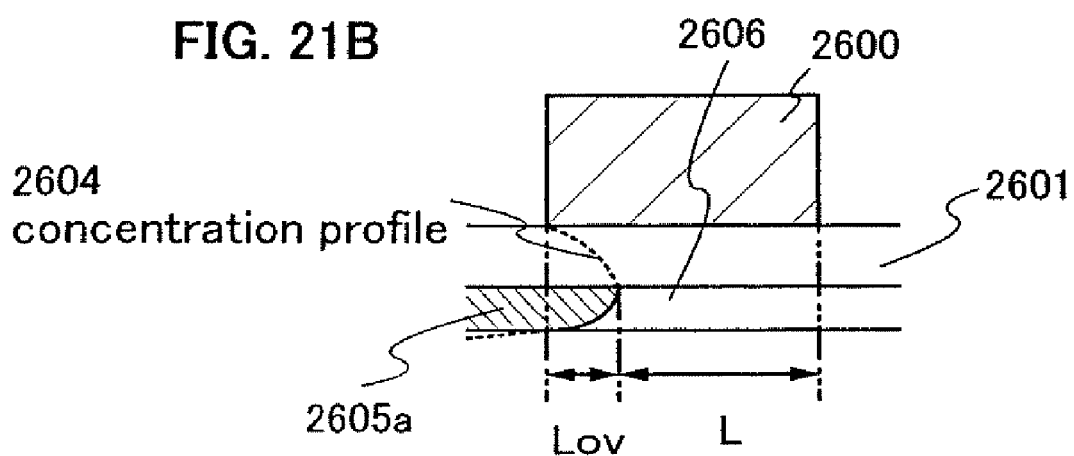

Depending on a doping condition, as indicated by a dotted line in FIG. 21B, a peak of a concentration profile 2604 may be positioned at a gate insulating film 2601 or an upper portion of the channel region 2606. In FIG. 21B, a length $L_{OV}$ of a Lov region 2605a that is overlapped with the gate electrode 2600 and a channel length L of the channel region 2606 are the same as those in FIG. 21A.

Figure 21C:
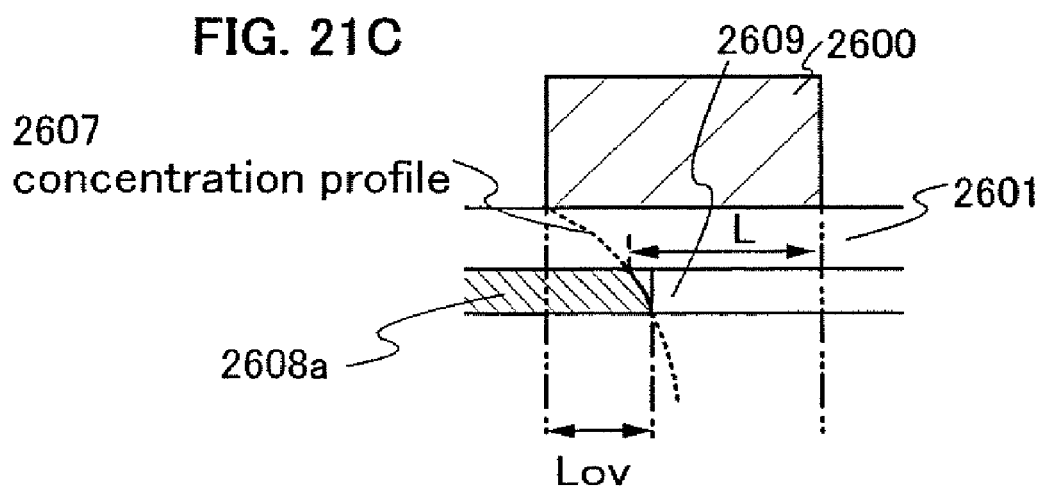

Depending on the doping condition, as indicated by a dotted line in FIG. 21C, a peak of a concentration profile 2607 may be positioned at a base insulating film in the semiconductor region or the substrate. In this case, the lengths and the width of the gate electrode 2600 cannot have the equality, that is, width=$L+L_{OV}$. Since the channel is formed at an interface between a channel region 2609 and a gate insulating film 2601, the channel length L has a length as illustrated in FIG. 21C and a Lov region 2068a overlapped with the gate electrode 2600 indicates the longest portion of the length $L_{ov}$. In the case of using a semiconductor substrate, the structure shown in FIG. 21C is the structure that is manufactured by only a TFT having a long channel length since concentration profiles of the semiconductor substrates are overlapped with each other or too close to each other at the bottom portion of the gate.

Figure 22A:
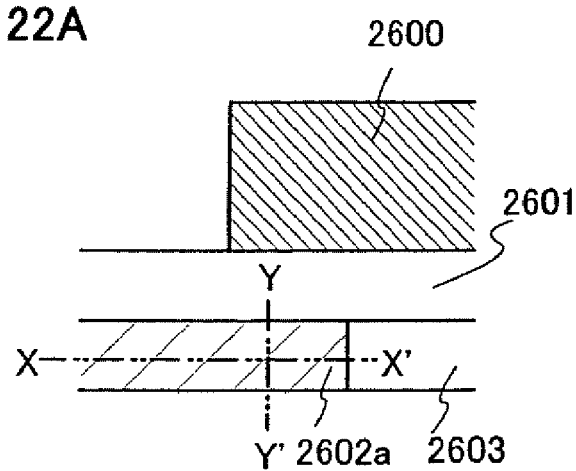
FIGS. 22A to 22C are views for showing density distribution of an impurity element in a crosswise direction and a lengthwise direction in a GOLD region.
Figure 22B:
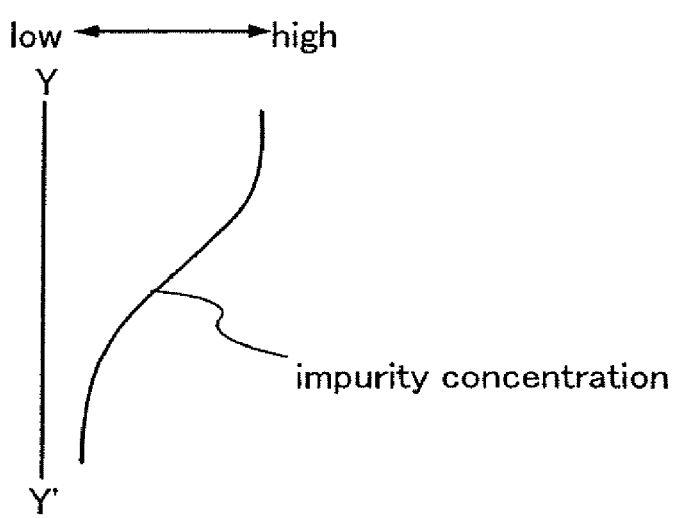
Figure 22C:
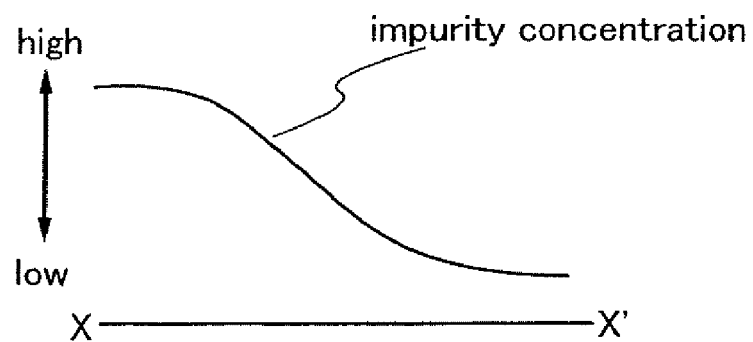

In FIG. 21A, concentration distribution of impurity elements in a crosswise direction and a lengthwise direction of the Lov region 2602a is explained with reference to FIGS. 22A to 22C. FIG. 22A is an enlarged view of another Lov region 2602a illustrated in FIG. 21A. FIG. 22B shows concentration distribution of impurity elements in a depth direction of the Lov region. FIG. 22C shows concentration distribution of impurity elements in a crosswise direction of the Lov region.

As shown in FIG. 22B, there is generated concentration gradient at the substrate side and the gate electrode side in the Lov region.

As shown in FIG. 22C, there is generated concentration gradient in the Lov region.

As shown in FIGS. 21B and 21C, the concentration gradient in a depth direction and a crosswise direction is various gradient.

As shown in FIG. 9A, a mask pattern 849 is formed over the second semiconductor region 812 by a photolithography process. Then, n-type impurity elements 841 are doped to each of the first semiconductor region 811, the third semiconductor region 813, and the fourth semiconductor region 814 to form first n-type impurity regions 842 to 847. Here, the first n-type impurity regions 842 to 847 are doped with phosphorous (P) so that the regions contain n-type impurity elements typically of $1\times10^{17}$ to $5\times10^{18}$ atoms/cm³. Here, the impurity elements are doped to the surface of each of the semiconductor regions vertically.

Since the phosphorous is doped in a self aligning manner with the gate electrode, a region overlapped with the first conductive layer 834 in the first p-type impurity region 837 is remained as a p-type impurity region. The region is referred to as a second p-type impurity region (Lov region) 848. Since phosphorous was already doped to the first n-type impurity regions 846, 847, phosphorous with higher density than boron in the first p-type impurity regions 837, 838 is doped in order to reverse from p-type conductivity to n-type conductivity. Thereafter, the mask pattern 849 is removed.

As shown in FIG. 9B, side walls (side wall spacers) 851 to 854 are provided around each of the first conductive layers 831 to 834 as in Example 2. In the side walls, since the insulating film over the upper face of the gate electrode serves as an etching stopper in etching the first conductive film 819 afterwards, the insulating film can minimize the reduction of a thickness of the gate electrode. Second conductive layers 855 to 858 are formed by etching the first conductive film 819 with the side walls and the gate electrodes as masks.

A mask pattern 859 is formed over the second semiconductor region 812 by a photolithography process. Then, second n-type impurity regions 861 to 866 are formed by doping impurity elements imparting n-type conductivity to the first semiconductor region 811, the third semiconductor region 813, and the fourth semiconductor region 814 by using the side walls and the first conductive layers 831 to 834 as masks. Here, boron (B) is doped so that the impurity elements with the density of approximately $5\times10^{19}$ to $5\times10^{20}$ atoms/cm³ are contained in the second n-type impurity regions. The second n-type impurity regions 861 to 866 are highly doped drain regions and serve as source and drain regions. The first n-type impurity regions covered by the second conductive layers 855, 857, and 858, the side walls 851, 853, and 854 are referred to as third n-type impurity regions (Lov regions) 867 to 872. The third n-type impurity regions (Lov regions) 867 to 872 are lightly doped drain regions. The third n-type impurity regions 867 to 872 are covered by the second conductive layers 855, 857, and 858 serving as gate electrodes, and so the regions can relieve an electric field in the vicinity of a drain to prevent deterioration of on current due to hot carriers. As a result, a semiconductor device capable of operating at high speed can be manufactured.

As shown in FIG. 9C, after removing the mask pattern 859, mask patterns 875 to 877 that cover newly the first semiconductor region 811, the third semiconductor region 813, and the fourth semiconductor region 814 are formed. Then, impurity elements imparting p-type conductivity are doped with high density to form third p-type impurity regions 878, 879. Here, the impunity elements are doped so that the third p-type impurity regions 878, 879 contain p-type impurity elements with density of $1\times10^{20}$ to $5\times10^{21}$ atoms/cm³. The third p-type impurity regions 878, 879 are highly doped impurity regions.

As shown in FIG. 10A, after removing the side wall 852 to expose a part of the second conductive layer 856, the exposed portion of the second conductive layer 856 is etched. As a result a third conductive layer 881 that has a schematically same width as that of the first conductive layer 832 is formed. In the case that the second, third, and fifth insulating films are formed by the same material as that of the side wall 852 in the etching process, a part or all of the foregoing insulating films are etched. Here, the semiconductor regions serve as etching stopper to etch the second, third, and fifth insulating films. The etched second insulating film 816 is referred to as a second insulating layer 816a, the etched third insulating film 309 is referred to as a third insulating layer 309a, and the etched fifth insulating film 321 is referred to as a fifth insulating layer 321a.

Fourth p-type impurity regions (Loff region) 882, 883 are formed by doping p-type impurity elements with low density to the second semiconductor region. Here, boron (B) is doped so that the fourth p-type impurity regions 882, 883 contain impurity elements with density of approximately $5\times10^{18}$ to $5\times10^{19}$ atoms/cm³. The fourth p-type impurity regions (Loff region) 882, 883 are lightly doped drain regions. Since the fourth p-type impurity regions 882, 883 are not covered by the gate electrodes, the regions can relieve an electric field in the vicinity of a drain and prevent the deterioration due to hot carrier injection, moreover, reduce off current. As a result, a semiconductor device having high reliability and operating with low power consumption can be manufactured.

As shown in FIG. 10B, after removing the mask patterns 875 to 877, impurity elements are activated by heating. Then, a sixth insulating film, that serves as an interlayer insulating film is formed by the same process as that in Example 1. And then, contact holes are formed by removing a part of each of the sixth insulating film by etching, the etched fifth, third, and second insulating films, simultaneously, a part of each of the second n-type impurity regions 861 to 866 serving as source and drain regions and the third p-type impurity regions 878, 879 serving as source and drain regions is exposed. In FIGS. 10A and 10B, the etched sixth insulating film is referred to as a sixth insulating layer 885, the etched fifth insulating film is referred to as a fifth insulating layer 886, the etched third insulating film is referred to as a third insulating layer 887, and the etched second insulating film is respectively referred to as second insulating layers 805, 807, and 808. Then, source and drain electrodes 888 to 895 are formed.

Figure 28:
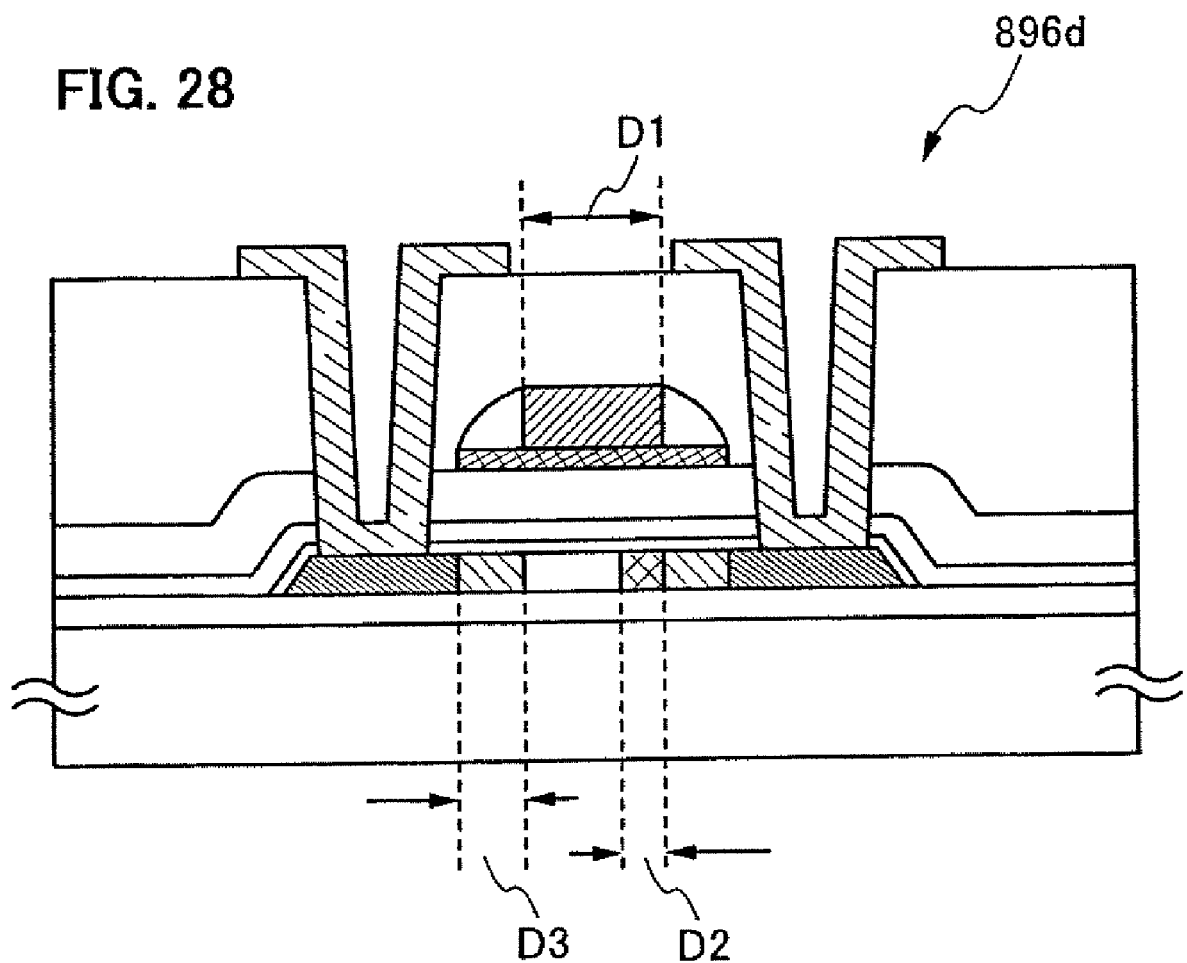
FIG. 28 is a cross-sectional view for showing a semiconductor device according to the present invention.

Widths of the gate electrode of the n-channel TFT having the second p-type impurity region, the second p-type impurity region, and the Lov region are illustrated in FIG. 28.

FIG. 28 illustrates an n-channel TFT 896d having the second p-type impurity region. A width D1 of the gate electrode is 200 to 1500 nm, preferably, 200 to 700 nm. A width D2 of the second p-type impurity region is 5 to 200 nm. A width D3 of the third n-type impurity region is 10 to 200 nm. By setting the width of the gate electrode in the foregoing range, a short channel structure can be formed, and so high speed operation can be realized. Further, by setting the widths of the second p-type impurity region and the third n-type impurity region in the foregoing range, a threshold value can be shifted and an n-channel TFT capable of reducing a cutoff current can be manufactured.

Each of a memory transistor 896a, a p-channel TFT 896b, and an n-channel TFT 896c has preferably the widths of the gate electrode and the third n-type impurity region as with the n-channel TFT 896d.

A simulation result of a current-voltage (I-V) characteristic of the n-channel TFT having the second p-type impurity region is explained with reference to FIGS. 23A to 24B. FIG. 23A shows an I-V characteristic of the n-channel TFT in which the second p-type impurity region (hereinafter, p−) is provided to a standard n-channel TFT and a drain side by assuming a model diagram of a TFT illustrated in FIG. 23B.

FIG. 23B shows structures of the TFTs. In FIG. 23B, Structure A is a standard n-channel TFT having Loff (hereinafter, n−), Structure B is an n-channel TFT having a p− with a width of 100 nm, and Structure C is an n-channel TFT having a p− with a width of 300 nm. Simulation of an I-V characteristic is performed in the conditions in each TN, that is, L/W is 1000/20000 nm, an Loff region width is 300 nm, a gate insulating film thickness is 20 nm, impurity density in source and drain regions (hereinafter, n+) is 1×10$^{20}$ atoms/cm$^3$, and impurity density of p– is 1×10$^{18}$ atoms/cm$^3$.

In FIG. 23A, full line indicates the I-V characteristic of Structure A, whereas broken lines indicate the I-V characteristics of Structure B and Structure C having p–, respectively. Since Structure B and C have the p–, it is found that a threshold value is shifted to a positive side. Further, it can be found that the threshold value is shifted as the width of the p– is increased (that is, the threshold value of Structure C is more shifted than that of Structure B).

FIGS. 24A and 24B show a simulation result of an I-V characteristic of a TFT provided with a p– at its source side. FIG. 24A shows an I-V characteristic of an n-channel TFT provided with a standard n-channel TFT and a second p-type impurity region (hereinafter, p–) at its source side assuming a model diagram of a TFT illustrated in FIG. 24B.

FIG. 24B shows structures of TFTs. In FIG. 24B, Structure A is the same as the standard n-channel TFT illustrated in FIG. 23B, Structure D is an n-channel TFT having a p– with a width of 100 nm, and Structure E is an n-channel TFT having a p– with a width of 300 nm. The level of the L/W, the Loff region width, the gate insulating film thickness, and n$^+$ density are the same as those in FIGS. 23A and 23B.

In FIG. 24A, full line indicates the I-V characteristic of Structure A and broken line indicates the I-V characteristics of Structure D and Structure E having p–. Since Structure D and E have the p–, it is found that a threshold value is shifted to a positive side. Further, it can be found that the threshold value is shifted as the width of the p– is increased (that is, the threshold value of Structure E is more shifted than that of Structure E). Moreover, a cutoff current (Icut) is lowered than that of the standard n-channel TFT. The cutoff current (Icut) is the value of a drain current Id at gate voltage Vg of 0 V in an Id-Vg characteristic.

As noted above, by using an n-channel TFT that is covered by a gate electrode and that has a p-type lightly doped drain region in a channel region and either of a source region or a drain region, a threshold value is shifted and a cutoff current is reduced. Conventionally, a TFT that is required to operate at high speed such as CPU, DRAM, an image processing circuit, or voice processing circuit has a short channel structure; however, there is a problem that a short channel length causes the reduction of a threshold value and the increase of a cutoff current. A TFT according to this example can reduce a cutoff current despite of having a short channel structure. By using such the TFT in all important positions in a semiconductor device, power consumption of the entire semiconductor device can be reduced. For instance, power consumption in a standby state can be reduced by connecting such the TFT between a TFT for logic and a power source to turn on in operating and turn off in nonoperating. Alternatively, by forming a circuit by the TFT in a region that does not require high speed operation, power consumption of the entire semiconductor device can be reduced.

Moreover, a threshold value of each of the semiconductor regions can be controlled without channel doping by forming a first p-type lightly doped drain region by doping impurity elements imparting p-type conductivity to each of the surfaces of the first to fourth semiconductor regions 811 to 814 at an angle of from 0 to 60 degrees, preferably, 5 to 45 degrees without forming the mask pattern 835 in FIG. 8D. In this case, the number of processes can be reduced since channel doping is not required.

In the case that an n-type lightly doped drain region covered by a gate electrode as with the n-channel TFT is formed in a p-channel TFT, a threshold value is shifted to a negative side. Moreover, cutoff current can be reduced by providing at a source side. That is, high speed operation is possible and power consumption can be reduced as with the n-channel TFT.

As noted above, the memory transistor 896a having the first semiconductor region 811 including the second n-type impurity regions 861, 862 serving as a source region and a drain region, the third n-type impurity regions 867, 868, and a channel region; the second and the third insulating layers 805, 887 serving as tunnel oxide films; the insulating layers 313 and the fifth insulating layer 886 having floating gate electrodes; and the second and the third conductive layers 831, 855 serving as gate electrodes can be formed.

Further, the p-channel TFT 896b composed of the second semiconductor region 812 having the third p-type impurity regions 878, 879 serving as source and drain regions, the fourth p-type impurity regions 882, 883 that are Loff regions, and a channel region; the second insulating layer 816a, the third insulating layer 309a, and the fifth insulating layer 321a serving as gate insulating films; and the second conductive layer 832 and the third conductive layer 881 serving as gate electrodes can be formed.

The n-channel TFT 896c composed of the third semiconductor region 813 including the highly doped drain regions 863, 863, the Lov regions 869, 870, and a channel region; the second insulating layer 807, the third insulating layer 887, and the fifth insulating layer 857 serving as gate insulating films; and the second conductive layer 833 and the third conductive layer 857 serving as gate electrodes can be formed.

The n-channel TFT 896d composed of the fourth semiconductor region 814 including the highly doped drain regions 865, 866, the Lov regions 871, 872, and the second impurity regions 848 having low density impurities, and a channel region; the second insulating layer 808, the third insulating layer 887, the fifth insulating layer 886 serving as gate insulating films; and the second conductive layer 834 and the third conductive layer 858 serving as gate electrodes can be formed.

Moreover, a semiconductor device having the memory transistor 896a, the p-channel TFT 896b, the n-channel TFT 896c, and the n-channel TFT 896 having a p-type lightly doped drain region, all of which are formed over one substrate. The memory transistor and the TFT of the semiconductor device according to this example can operate at high speed since the memory transistor and the TFT are formed in a semiconductor region having hardly crystal grains in a channel direction. A semiconductor device capable of operating at high speed with lower power consumption can be manufactured since the semiconductor device has the n-channel TFT having a p-type lightly doped drain region.

EXAMPLE 7

A semiconductor device having a silicide structure in the TFT described in Example 6 is explained with reference to FIGS. 11A to 13C in this example. In this example, since up to a process of forming a first conductive film and a second conductive film is the same as that explained in Example 6, subsequent processes thereof are explained.

As shown in FIG. 11A, a first conductive film 901 and a second conductive film 902 are formed over a fifth insulating film according to Example 6. Here, a tungsten nitride (WN) film is formed by a sputtering method as the first conductive film 901, and a tungsten (W) film is formed by a sputtering method as the second conductive film 902. Mask patterns 903 to 906 are formed by a photolithography process.

As shown in FIG. 11B, gate electrodes 911 to 914 are formed by etching the second conductive film 902 and the first conductive film 901 with the mask patterns 903 to 906. The gate electrodes 911 to 914 are formed to have lamination layer structure of a tungsten nitride film and a tungsten film. Then, after removing the mask patterns 903 to 906, a mask pattern 915 is newly formed covering the first to third semiconductor regions 811 to 813 by a photolithography process.

Impurity elements 916 imparting p-type conductivity are doped to the fourth semiconductor region 814. Here, as in Example 6, first p-type impurity regions 917, 918 are formed by doping impurity elements imparting p-type conductivity to the surface of the semiconductor regions obliquely at an angle of 0 to 60 degrees, preferably, 5 to 45 degrees. Here, boron (B) is doped so that the first p-type impurity regions contain at density of approximately $5\times10^{17}$ to $5\times10^{18}$ atoms/cm$^3$. Alternatively, the boron (B) can be doped at density of approximately $5\times10^{16}$ to $1\times10^{17}$ atoms/cm$^3$. Since impurity elements are doped obliquely to the semiconductor regions, impurity elements are doped to the region of the first p-type impurity region 917 overlapped with the gate electrode 914. On the other hand, the first p-type impurity region 918 is formed by doping impurity elements to a part of the fourth semiconductor region 814.

As shown in FIG. 11C, after removing the mask pattern 915, a mask pattern 921 is newly formed over the second semiconductor region 812. Then, first n-type impurity regions 923 to 928 are formed by doping impurity elements 922 for imparting n-type conductivity to each of the first semiconductor region 811, the third semiconductor region 813, and the fourth semiconductor region 814. Typically, phosphorous (P) are doped to the first n-type impurity regions 923 to 928 so that the regions contain n-type impurity elements of $1\times10^{17}$ to $5\times10^{18}$ atoms/cm$^3$. Here, impurity elements are doped vertically to the surface of each of the semiconductor regions.

Since phosphorous is doped in a self aligning manner with the gate electrode, the region of the first p-type impurity region 917 overlapped with the gate electrode 914 is remained as a p-type impurity region. The region is referred to as a second p-type impurity region 929. Since boron is doped to the first n-type impurity region 928, phosphorous with higher density than the boron in the first p-type impurity region 917 in order to reverse from p-type conductivity to n-type conductivity. Thereafter, the mask pattern 921 is removed.

As shown in FIG. 12A, third p-type impurity regions 930a, 930b are formed by doping low density boron to the second semiconductor region 812. Typically, boron (B) is doped to the second semiconductor region 812 so that the region contains p-type impurity elements of $5\times10^{18}$ to $5\times10^{19}$ atoms/cm$^3$.

Side walls (side wall spacer) 931 to 934 are formed around the gate electrodes 911 to 914 as with Example 2. Here, an exposed portion of the fifth insulating film is etched. Here, the etched fifth insulating film is referred to as fifth insulating layers 935 to 938. Then, exposed portions of the third insulating film 306 and the second insulating films 815 to 818 are etched by using the side walls 931 to 935 as masks. Here, the etched third insulating film is referred to as third insulating layers 941 to 944, and the etched second insulating film is referred to as second insulating layers 945 to 958. As a result, a part of the first to fourth semiconductor regions 811 to 814 are exposed.

As shown in FIG. 12B, a mask pattern 961 is formed over the second semiconductor region 812 by a photolithography process. Then, second n-type impurity regions 962 to 967 are formed by doping impurity elements imparting n-type conductivity to the first semiconductor region 811, the third semiconductor region 813, and the fourth semiconductor region 814 by using the side walls and gate electrodes as masks. Here, impurity elements are doped to the surface of each semiconductor region vertically as indicated by arrow. Here, phosphorus (P) is doped so that each the semiconductor region includes typically n-type impurity elements $5\times10^{19}$ to $5\times10^{20}$ atoms/cm$^3$. Here, the second n-type impurity regions 962 to 967 are highly doped drain regions and serve as source and drain regions. The first n-type impurity region covered by the side walls 931, 933, and 934 is referred to as third n-type impurity regions (Loff region) 968 to 973. The third n-type impurity regions 968 to 973 are lightly doped drain regions. The third n-type impurity regions 968 to 973 are not covered by the gate electrodes 911, 913, and 914, and so the regions can relieve an electric field in the vicinity of a drain to prevent the deterioration of on current due to hot carriers and to reduce off current. As a result, a semiconductor device having high reliability and low power consumption can be manufactured.

As shown in FIG. 12C, a mask pattern 961 is removed. Then, a third conductive film 975 is formed to form silicide as in Example 3. Here, a titanium film is formed by a sputtering method as the third conductive film 975.

Figures 13A, 13B, 13C:
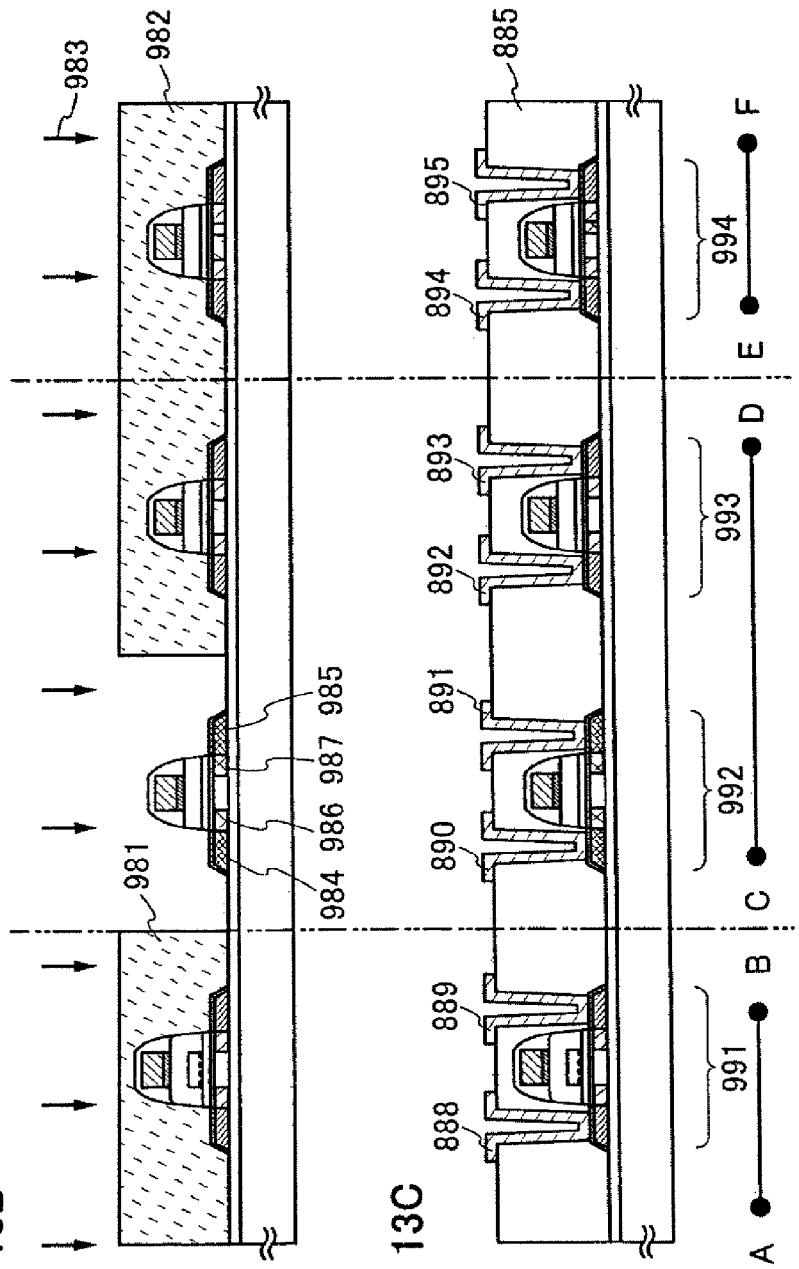
FIGS. 13A to 13C are cross-sectional views for showing a manufacturing process of a semiconductor device according to the present invention.

As shown in FIG. 13A, silicides 971 to 978 are formed by reacting silicon of the exposed source and drain regions and the conductive film by heat treatment, a GRTA method, an LRTA method, or the like. Thereafter, the third conductive film that is not reacted with silicon is removed.

As shown in FIG. 13B, mask patterns 981, 982 for covering the first semiconductor region 811, the third semiconductor region 813, and the fourth semiconductor region 814 are formed. Then, impurity elements 983 imparting p-type conductivity are doped at high density to form fourth p-type impurity regions 984, 985. Simultaneously, fifth p-type impurity regions 986; 987 are formed in the second semiconductor region covered by the side wall 932. Here, impurity elements are doped so that the fourth p-type impurity regions 884, 885 contain p-type impurity elements at high density of $1\times10^{20}$ to $5\times10^{21}$ atoms/cm$^3$. Since the fifth p-type impurity regions 986, 987 are doped with low density impurity elements (boron (B)) of approximately $5\times10^{18}$ to $5\times10^{19}$ atoms/cm$^3$, the regions are lightly doped drain regions. Since the fifth p-type impurity regions 986, 987 are not covered by gate electrodes, and so the regions can relieve an electric field in the vicinity of a drain to prevent deterioration of on current due to hot carriers and reduce cutoff current. As a result, a semiconductor device having high reliability and low power consumption can be manufactured.

As shown in FIG. 13C, after removing mask patterns 981, 982, impurity elements are activated by heating. Then, contact holes are formed in accordance with the same process as that in Example 6, simultaneously, a part of the second n-type impurity regions 962 to 967 serving as source and drain regions and the fourth p-type impurity regions 984, 985 is exposed. Then, the source electrodes and the drain electrodes 888 to 895 are formed.

According to the foregoing process, a memory transistor 991 that has the first n-type semiconductor region 811 having the second n-type impurity regions 962, 963 serving as a source region and a drain region, the third n-type impurity regions 968, 969 that are Loff regions, and a channel region; the second insulating layer 945 and the third insulating layer 941 serving as tunnel oxide films; and the insulating layer 313 having a floating electrode, the fifth insulating layer 935, and the gate electrode 911 can be formed.

A p-channel TFT 992 composed of the second semiconductor region 812 having the fourth p-type impurity regions 984, 985 serving as a source region, a drain region, the fifth p-type impurity regions 986, 987 that are Loff regions, and a channel region; the second insulating layer 946 and the third insulating layer 942 serving as gate insulating films; the fifth insulating layer 936; and the gate electrode 912 can be formed.

An n-channel TFT 993 composed of the third semiconductor region 813 having the highly doped drain regions 964, 965, the Loff regions 970, 971, and a channel region; the second insulating layer 947 and the third insulating layer 943 serving as gate insulating films; fifth insulating layer 937; and the gate electrode 913 can be formed.

An n-type channel TFT 994 composed of the fourth semiconductor region 814 having the highly dope drain regions 966, 967, Loff regions 972, 973, the low p-type doped drain regions 974, and a channel region; the second insulating layer 948 and the third insulating layer 944 serving as gate insulating films; the fifth insulating layer 938; and the gate electrode 914 can be formed.

Moreover, a semiconductor device that has the memory transistor 991, the p-channel TFT 992, the n-channel TFT 993, and the n-channel TFT 994 having low p-type impurity region, all of which are formed over one substrate can be manufactured.

Moreover, the memory transistor and the TFT formed according to this example have silicide structures. Since they have n-channel TFTs having p-type lightly doped drain regions, resistance of the source and drain regions can be reduced, and high speed operation and low power consumption operation can be realized. Accordingly, a semiconductor device with reduced power consumption can be manufactured.

This example can be used by combining Embodiments 1 to 3, and Examples 1 to 6, respectively.

EXAMPLE 8

Figure 15:
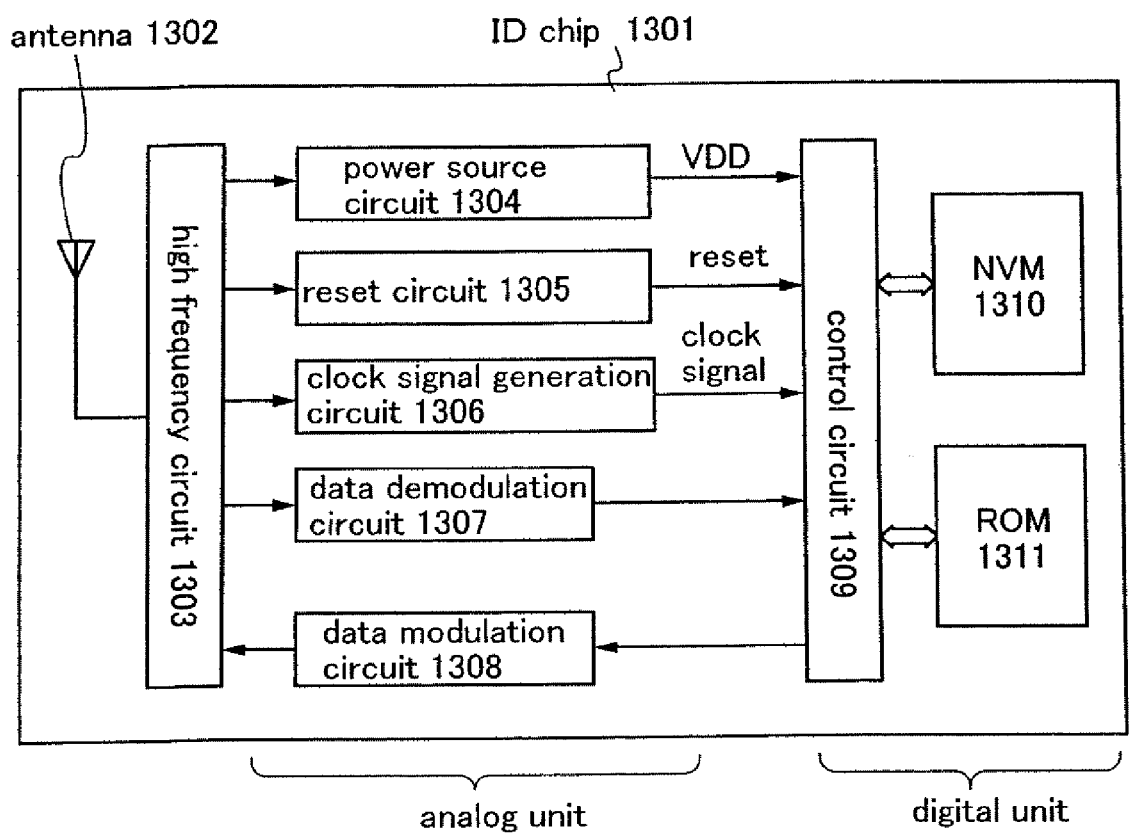
FIG. 15 is a block diagram for showing a structure of a semiconductor device according to the present invention.

FIG. 15 is a typical block diagram of an ID chip that is a typical example of a semiconductor device according to the present invention as typified by such as a non-contact RFID (Radio Frequency Identification) tag or a wireless tag. FIG. 15 shows a structure having a simple function of reading out fixed date such as identification data. In FIG. 15, an ID chip 1301 is composed of an antenna 1302, a high frequency circuit 1303, a power source circuit 1304, a reset circuit 1305, a clock signal generation circuit 1306, a data demodulation circuit 1307, a data modulation circuit 1308, a control circuit 1309, a nonvolatile memory (hereinafter, NVM) 1310, and a ROM 1311.

In this example, a memory transistor that constitutes the present invention as the NVM 1310 is used. In the case that a transistor that operates at high speed is required as a transistor that is composed of the high frequency circuit 1303, the reset circuit 1305, the clock signal generation circuit 1306, the data demodulation circuit 1307, the data modulation circuit 1308, the control circuit 1309, and the ROM 1311, the transistor can be manufactured simultaneously with a memory transistor by a manufacturing process of a high speed transistor. In the case that a transistor having high withstanding pressure is required as a transistor that constitutes the power source circuit 1304, the transistor can be manufactured simultaneously with a memory transistor according to a manufacturing process of a high-speed transistor that constitutes the present invention. As noted above, an RFID tag can be manufactured efficiently over one substrate. Moreover, the cost for the ID chip 1301 can be reduced, and the size of the ID chip can be reduced.

All circuits illustrated in FIG. 15 are formed over a glass substrate, a flexible substrate, or a semiconductor substrate. The antenna 1302 may be formed over the glass substrate, the flexible substrate, or the semiconductor substrate, alternatively, provided at the outside of the substrate to be connected to the high frequency circuit within the substrate.

The high frequency circuit 1303 receives an analog signal from the antenna 1302 and outputs an analog signal received from the data modulation circuit 1308 from the antenna 1302. The power source circuit 1304 is a circuit generating a constant power source from a received signal, the reset circuit 1305 is a circuit generating a reset signal, the clock generating circuit 1306 is a circuit generating a clock signal, the data demodulation circuit 1307 is a circuit extracting data from a received signal, and the data modulation circuit 1308 is a circuit for generating an analog signal to be outputted to an antenna based on a digital signal received from the control circuit or varying an antenna characteristic. An analog unit is composed of the foregoing circuits.

On the other hand, the control circuit 1309 receives data extracted from the received signal to read out the data. Specifically, the control circuit 1309 generates an address signal of the NVM 1310 or the ROM 1311, reads out data, and sends the read data to the data demodulation circuit. A digital unit is composed of the foregoing circuits.

This example can be used by combining with Embodiments 1 to 3, and Example 1 to 7.

EXAMPLE 9

Figure 16A:
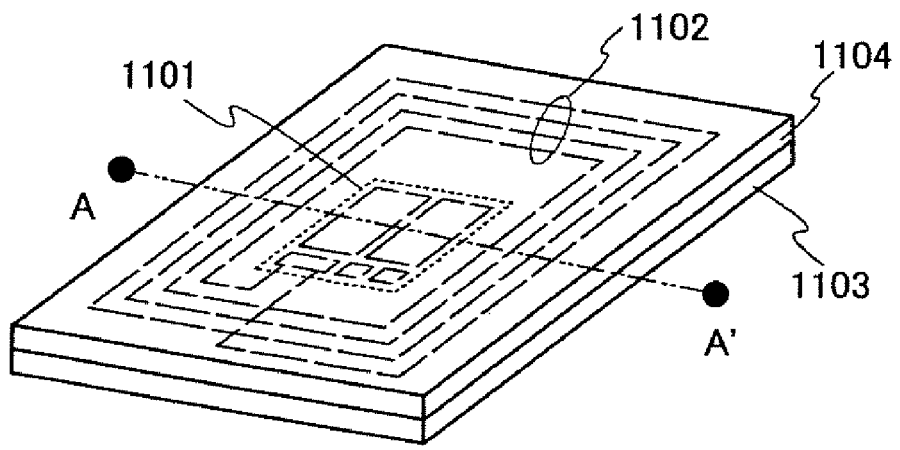
FIGS. 16A and 16B are perspective views for showing a semiconductor device according to the present invention.

FIG. 16A is a perspective view of one embodiment of an ID chip that is one of semiconductor devices according to the present invention. Reference numeral 1101 denotes an integrated circuit as typified by a high frequency circuit 1303, a power source circuit 1304, a reset circuit 1305, a clock signal generation circuit 1306, a data demodulation circuit 1307, a data modulation circuit 1308, a control circuit 1309, a non volatile memory (hereinafter, NVM) 1310, and a ROM 1311, all of which are described in Example 8, and reference numeral 1102 denotes an antenna. The antenna 1102 is connected to the integrated circuit 1101. Reference numeral 1103 denotes a substrate, and 1104 denotes a cover member. The integrated circuit 1101 and the antenna 1102 are formed over the substrate 1103. The cover member 1104 is overlapped with the substrate 1103 so as to cover the integrated circuit 1101 and the antenna 1102. Though the cover member 1104 is not always required, the cover member can enhance a mechanical strength of an ID chip by covering the integrated circuit 1101 and the antenna 1102.

Figure 16B:
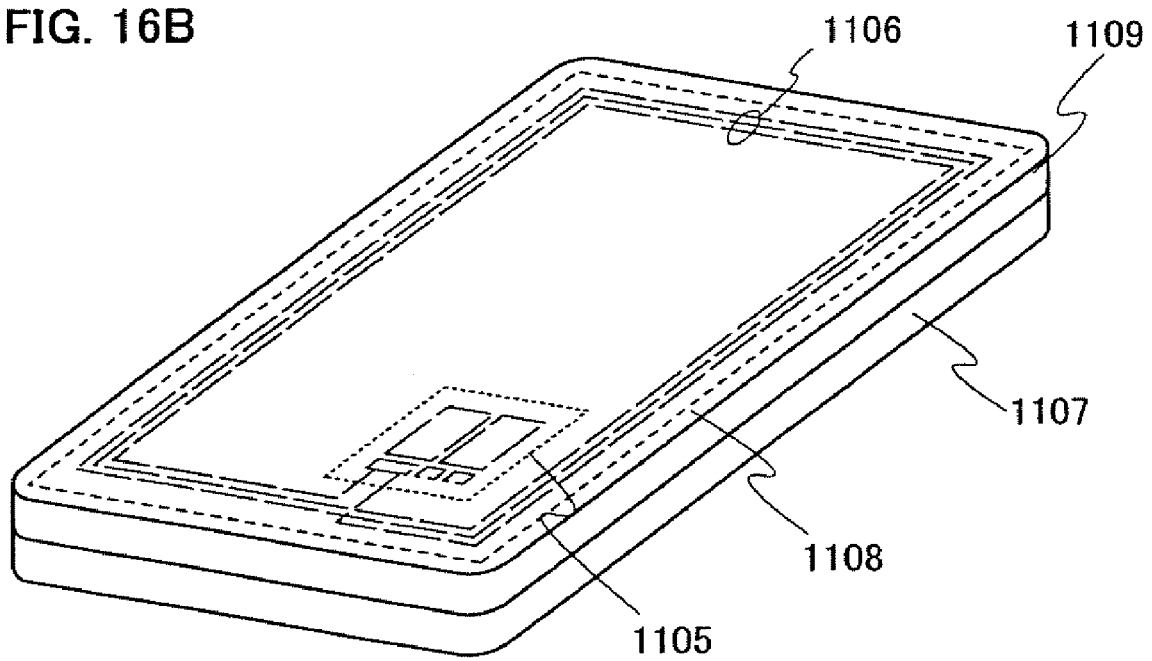

FIG. 16B is a perspective view of one embodiment of an IC card that is one of semiconductor devices according to the present invention. Reference numeral 1105 denotes an integrated circuit as typified by a high frequency circuit 1303, a power source circuit 1304, a reset circuit 1305, a clock signal generation circuit 1306, a data demodulation circuit 1307, a data modulation circuit 1308, a control circuit 1309, a non volatile memory (hereinafter, NVM) 1310, and a ROM 1311, all of which are described in Example 8, and reference numeral 1106 denotes an antenna. The antenna 1106 is connected to the integrated circuit 1105. Reference numeral 1108 denotes a substrate serving as an inlet sheet, and reference numerals 1107, 1109 denote cover members. The integrated circuit 1105 and the antenna 1106 are formed over the substrate 1108, and the substrate 1108 is interposed between the cover members 1107, 1109. The IC card according to the present invention may have a display device connected to the integrated circuit 1105.

Figure 17A:
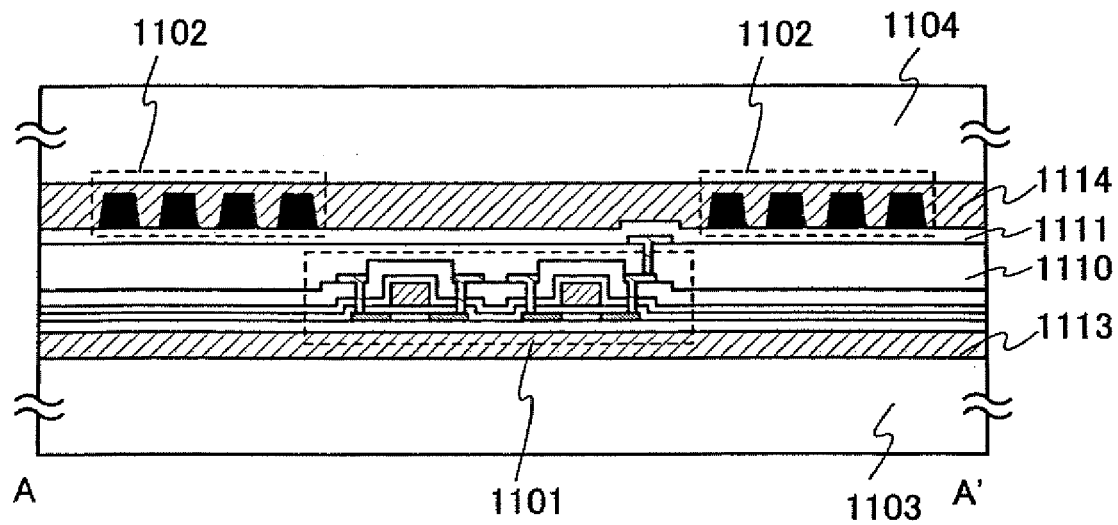
FIGS. 17A and 17B are cross-sectional views for showing a semiconductor device according to the present invention.
Figure 17B:
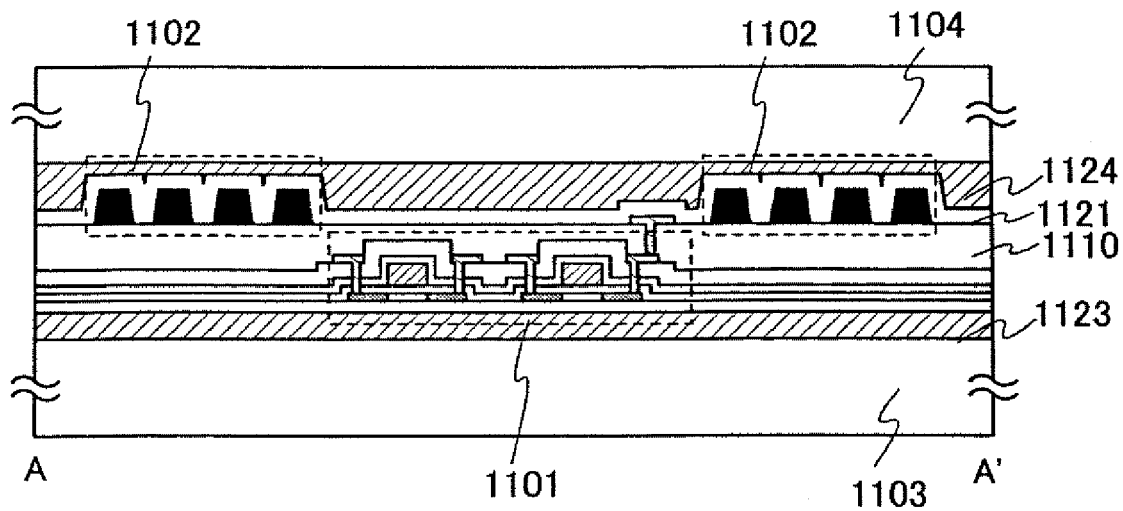

FIGS. 17A and 17B show cross-sectional views of the ID chip illustrated in FIG. 16A taken along line A-A'. In the ID chip, the cover members 1103, 1104 are adhered to the integrated circuit 1101 formed by an exfoliation process and the antenna 1102 via adhesive agents 1113 and 1114.

The integrated circuit 1101 can be formed by an integrated circuit described in any one of Embodiments 1 to 3, or Example 1 to 8. The semiconductor element used in the integrated circuit 1101 is not limited to the foregoing semiconductor element. For example, in addition to a TFT, a memory element, a diode, a photoelectric conversion element, a resistance element, a coil, a capacitor element, an inductor, and the like can be used.

As shown in FIG. 17A, an interlayer insulating film 1110 is formed over a TFT of the integrated circuit 1101, a barrier film 1111 made of a silicon nitride film is formed over the interlayer insulating film 1110, and the antenna 1102 is formed thereover.

On the other hand, as shown in FIG. 17B, the interlayer insulating film 1110 may be formed over the TFT of the integrated circuit 1101, the antenna 1102 may be formed over the integrated circuit 1101, and the barrier film 1121 may be formed over the interlayer insulating film 1110 and the antenna 1102. By providing the barrier film, an ID chip with improved reliability can be provided without contaminating the integrated circuit 1101.

The antenna 1102 is preferably gold, silver, copper, aluminum, or metal plated by gold, silver, copper, or aluminum.

In this example, an example of bonding a laminated body having the integrated circuit and the antenna formed over the interlayer insulating film of the integrated circuit by using different cover members is described; however, the present invention is not limited thereto. The cover member provided with the antenna and the integrated circuit can be fixed with an adhesive agent, in which case, the antenna and the integrated circuit are connected with an anisotropic conductive adhesive agent or an anisotropic conductive film by performing a UV treatment or an ultrasonic treatment; however, the present invention is not limited thereto. The present invention can use various methods.

The cover members 1103, 1104 can be made from a material having a flexible property such as plastic, organic resin, paper, a fiber, or carbon graphite. In the case of using biodegradable resin for the cover members, the cover members are degraded by bacteria to be reduced to soil. Since the integrated circuit according to the present invention is made from silicon, aluminum, oxygen, nitrogen, and the like, a pollution-free ID chip can be manufactured. By using flammable pollution-free material such as paper, a fiber, carbon graphite, and the like as the cover member, the used ID chip can be burned out or cut out. The ID chip using the foregoing materials is pollution-free since it does not generate poison gas even if the ID chip is burned.

The integrated circuit 1101 interposed between the cover members 1103, 1104 is preferably formed to have a thickness of 5 µm or less, more preferably, 0.1 to 3 µm. Further, the cover members 1103, 1104 are preferably formed to have thicknesses of 10 to 200 µm. Moreover, the area of the integrated circuit 1101 is 5 mm square (25 mm$^2$) or less, preferably, 0.3 to 4 mm square (0.09 to 16 mm$^2$).

Since the cover members 1103, 1104 are made from organic resin materials, the cover members 1103, 1104 has a high property with respect to bending. The integrated circuit 1101 formed by an exfoliation process has a high property with respect to bending compared to a single crystalline semiconductor. Since the integrated circuit 1101 and the cover members 1103, 1104 can be stuck together, the complete ID chip itself has a high property with respect to bending. The integrated circuit 1101 surrounded by the cover members 1103, 1104 may be placed over the surface or interior of another solid material or embedded in a paper.

This example can be used by combining with Embodiments 1 and 2, and Example 1 to 8.

EXAMPLE 10

Figure 18:
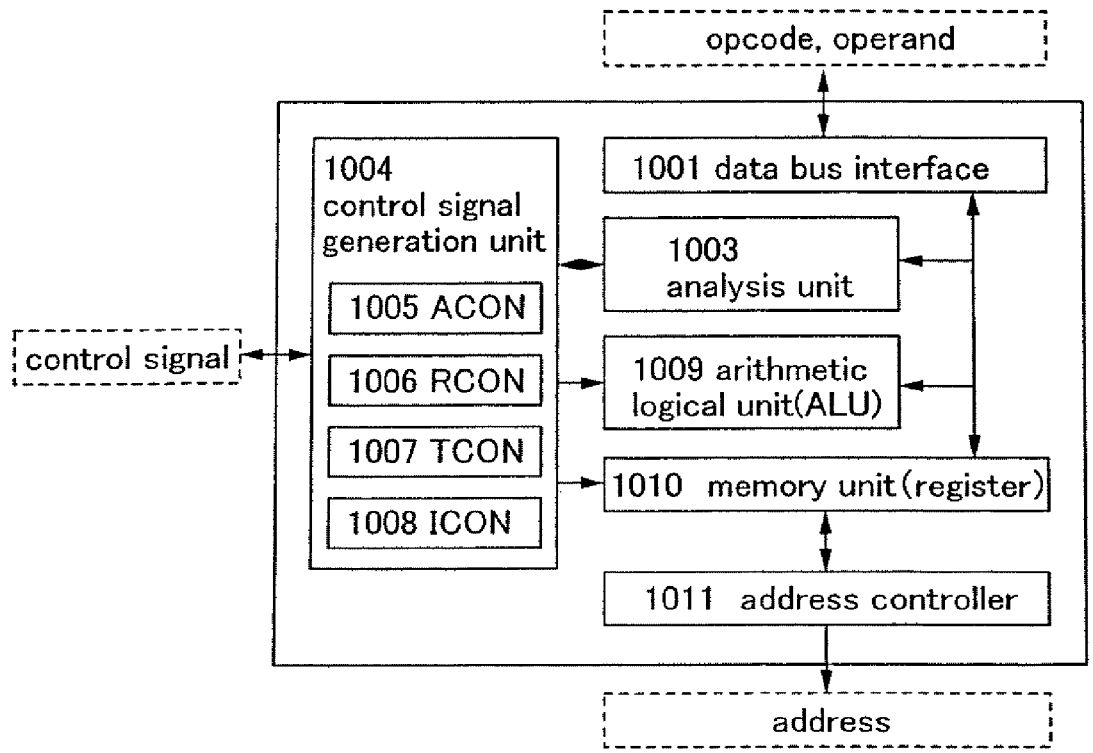
FIG. 18 is a block diagram for showing a structure of a semiconductor device according to the present invention.

An operation and a structure of a chip pasted over a thermal conductive substrate in case that the chip has a function as a CPU will be described with reference to FIG. 18 in this example.

When an opcode is inputted to an interface 1001, the code is decrypted in an analysis unit 1003 (also referred to as an Instruction Decoder), and a signal is inputted to a control signal generation unit 1004 (a CPU Timing Control). Upon inputting the signal, a control signal is outputted from the control signal generation unit 1004 to an arithmetic logical unit 1009 (hereinafter, an ALU) and a register unit 1010 (hereinafter, a Register).

The control signal generation unit 1004 comprises an ALU controller 1005 for controlling the ALU 1009 (hereinafter, ACON), a unit 1006 for controlling the Register 1010 (hereinafter, a RCON), a timing controller 1007 for controlling timing (hereinafter, a TCON), and an interruption controller 1008 for controlling interruption (hereinafter, an ICON).

On the other hand, when an operand is inputted to the interface 1001, the operand is outputted to the ALU 1009 and the Register 1010. Then, a processing such as a memory read cycle, a memory write cycle, an I/O read cycle, an I/O write cycle, or the like, based on a control signal, which is inputted from the control signal generation unit 1004, is carried out.

The Register 1010 is composed of a general resister, a stack pointer (SP), a program counter (PC), or the like.

An address controller 1011 (hereinafter, ADRC) outputs 16 bits address.

A structure of a CPU described in this example is illustrative only as a CPU manufactured according to the present invention and does not limit the constitution of the present invention. Therefore, the present invention can use a known CPU with the structure other than that of the present invention.

This example can be used by combining with Embodiments 1 and 2, and Example 1 to 9.

EXAMPLE 11

The case of applying a system LSI that is one example of a semiconductor device according to the present invention is explained with reference to FIG. 19.

The system LSI is an LSI constituting a system that is installed in the interior of a device expected to be used for a specific application to control the device and to process data. The application is wide-ranging, for example, a cellular phone, a PDA, a television, a printer, a facsimile, a game machine, a car navigation, a DVD player, and the like.

Figure 19:
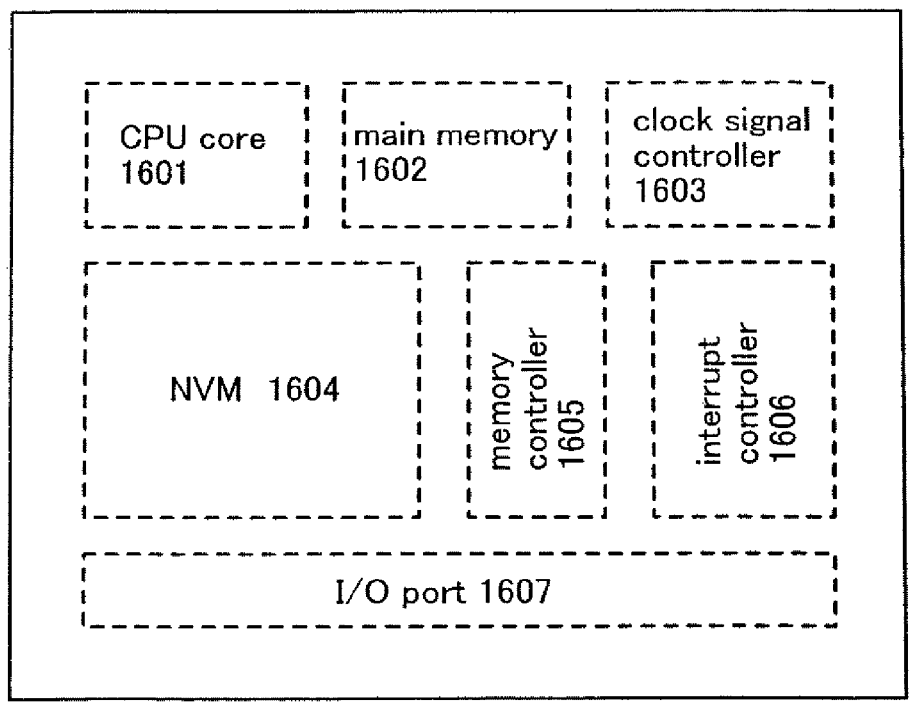
FIG. 19 is a block diagram for showing a structure of a semiconductor device according to the present invention.

FIG. 19 shows one example of the system LSI. Typically, the system LSI is mainly composed of a CPU core 1601, a nonvolatile memory (NVM) 1604, a clock controller 1603, a main memory 1602, a memory controller 1605, an interrupt controller 1606, an I/O port 1607, and the like. Needless to say, the system LSI shown in FIG. 19 is a simplified example. Various circuit designs are performed in an actual system LSI depending on its application.

The memory transistor according to the present invention can be used in the NVM 1604.

As a transistor that constitutes the CPU core 1601, the clock controller 1603, the main memory 1602, the memory controller 1605, the interrupt controller 1606, the I/O port 1607, a transistor that can operate at high speed and constitutes the present invention can be manufactured in the same manner. Accordingly, various circuits can be manufactured over one substrate.

This example can be used by combining with Embodiments 1 to 3, and Example 1 to 10.

EXAMPLE 12

Figure 20A:
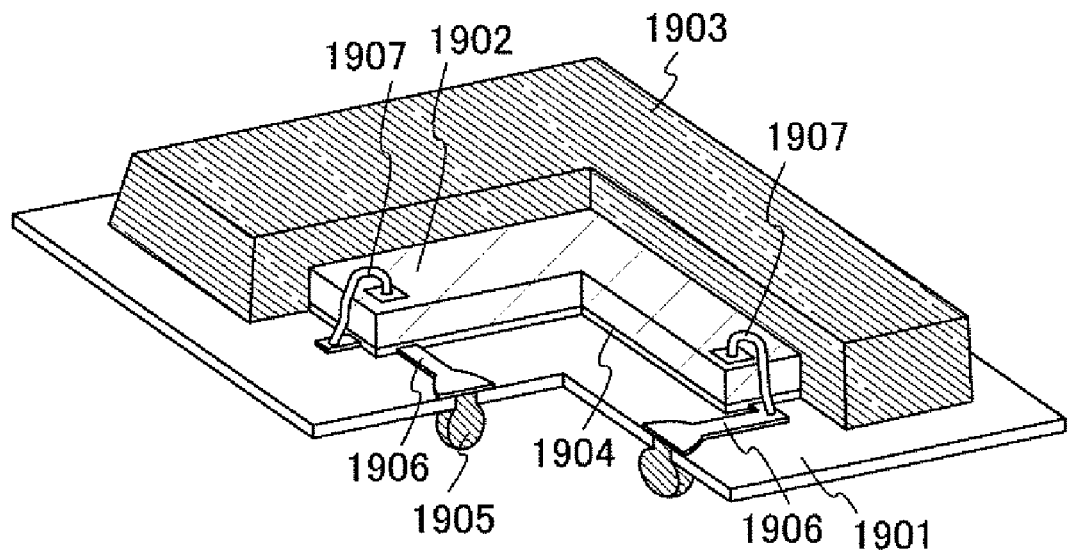
FIGS. 20A and 20B are perspective views for showing a semiconductor device according to the present invention.
Figure 20B:
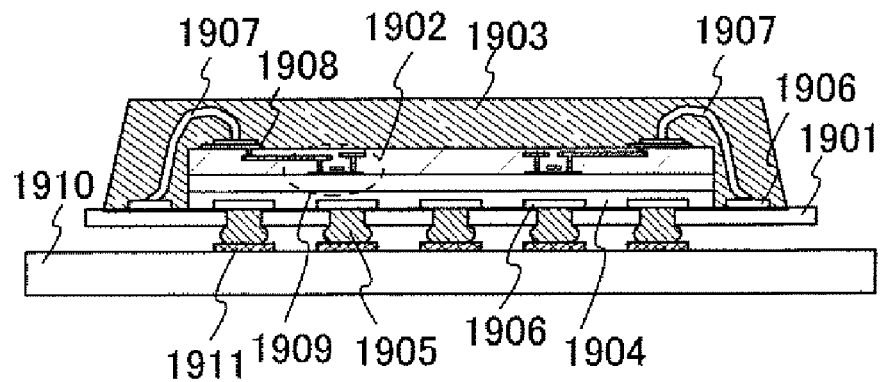

In this example, a package that is one example of a semiconductor device formed by using the present invention is explained with reference to FIGS. 20A and 20B. FIG. 20A is a perspective view for showing a cross-sectional structure of the package in which a chip is connected to an interposer by a wire bonding method. Reference numeral 1901 denotes an interposer; 1902, a chip; and 1903, a mold resin layer. The chip 1902 is mounted over the interposer 1901 with an adhesive agent for mounting 1904.

The interposer 1901 shown in FIG. 20A is a ball grid array type provided with a solder ball 1905. The solder ball 1905 is provided to the side opposite to a side provided with the chip 1902 of the interposer 1901. A wiring 1906 provided to the interposer 1901 is electrically connected to the solder ball 1905 via a contact hole provided to the interposer 1901.

In this example, the wiring 1906 for electrically connecting the chip 1902 to the solder ball 1905 is provided over the face provided with the chip of the interposer 1901; however the interposer used in the present invention is not limited thereto. For instance, the wiring may be formed to have a lamination layer structure in the interior of the interposer.

In FIG. 20A, the chip 1902 is electrically connected to the wiring 1906 by a wire 1907. FIG. 20B shows a cross-sectional structure of the package shown in FIG. 20A. The chip 1902 is provided with a semiconductor element 1909 described in Embodiments 1 to 3 and Examples 1 to 7. Further, a pad 1908 is provided to the side opposite to the side provided with the interposer 1901 of the chip 1902. The pad 1908 is electrically connected to the semiconductor element 1909. The pad 1908 is connected by the wiring 1906 provided to the interposer 1901 and the wire 1907.

Reference numeral 1910 denotes a part of a printed wiring board and reference numeral 1911 denotes a wiring or electrode provided to the printed wiring board 1910. The wiring 1906 is connected to the wiring or electrode 1911 provided to the printed wiring board 1910 via the solder ball 1905. For the connection of the solder ball 1905 and the wiring or electrode 1911, various methods such as thermocompression or thermocompression with supersonic vibration can be used. Gaps between solder balls after being compressed may be filled by under fill to improve the mechanical strength of the connecting portion and the efficiency of dispersion of heat generated in the package. Though the under fill is not always required, the under fill can prevent connection deterioration by the stress caused by miss matching of the interposer and thermal expansion coefficient of the chip. In the case of compressing with ultrasonic waves, connection deterioration can be minimized compared to the case of simply thermocompression.

This example explains the package in which the chip connected to the interposer by a wire bonding method; however, the present invention is not limited thereto. The chip can be connected to the interposer by using a flip chip method. In this case, pitches between pads can be comparatively kept large compared to the wire bonding method even if the number of pads to be connected is increased, the flip chip method is suitable for connecting chips having the large number of terminals.

The chips can be stacked within the package. In this case, since a plurality of chips can be provided in one package, there is an advantage of the rise of the overall package size can be curbed.

Moreover, a plurality of packages can be stacked. The structure has an advantage of improving manufacturing yields since electrical testing can be carried out every package to select only conforming articles to be stacked.

Further, the package formed according to this example can be provided to a display device, an electrical appliance, and the like.

According to the present invention, a small and high-integrated semiconductor device can be manufactured.

This example can be used by combining with Embodiments 1 to 3, and Example 1 to 11.

EXAMPLE 13

The usage of the semiconductor device according to the present invention is wide-ranging. For example, an ID chip 20 that is one embodiment of a semiconductor device according to the present invention can be used by providing to paper money, coins, securities, certificates, bearer bonds, packing containers, documents, recording media, commodities, vehicles, foods, garments, health articles, medicines, electric appliances, and the like.

Figure 25A:
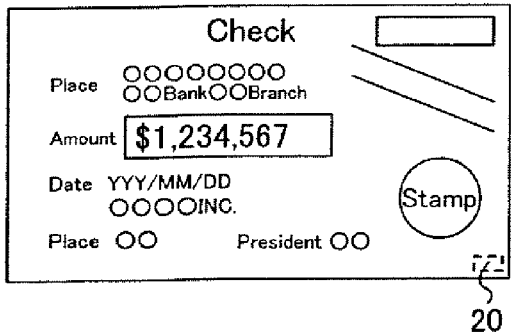
FIGS. 25A to 25H are views for showing applications using semiconductor devices according to the present invention.
Figure 25B:
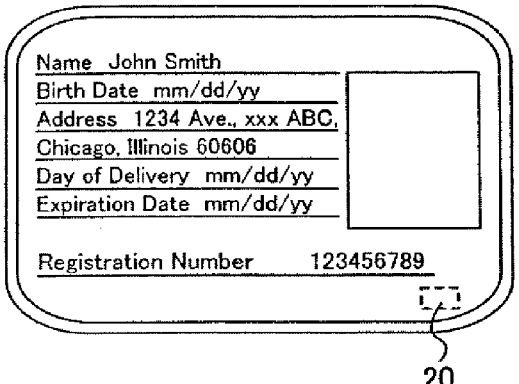
Figure 25C:
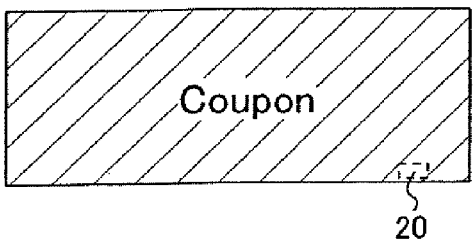
Figure 25D:
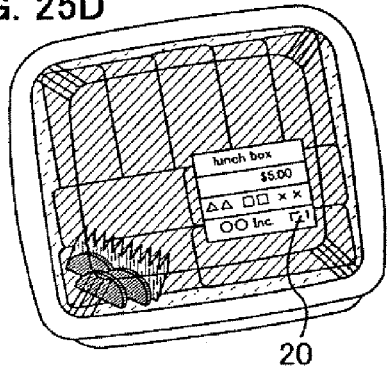
Figure 25E:
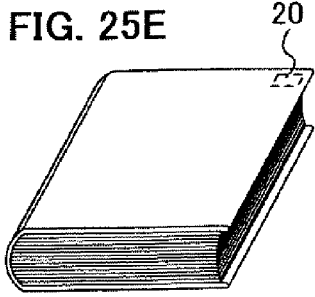
Figure 25F:
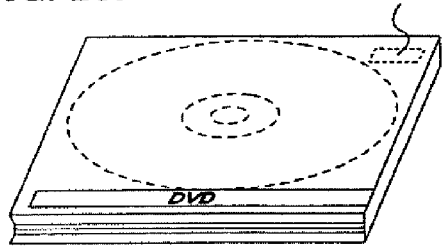
Figure 25G:
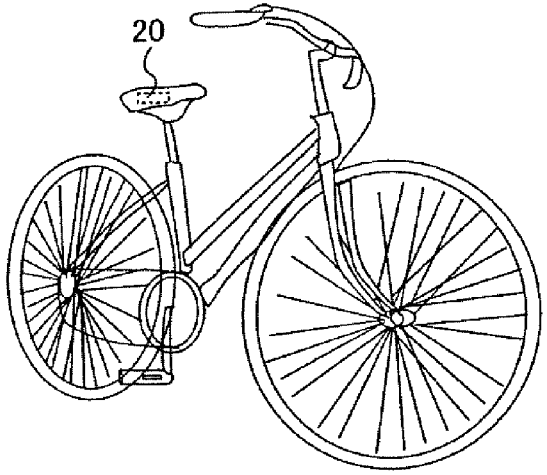
Figure 25H:
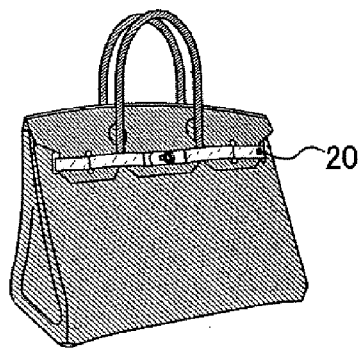

The paper money or the coins are money distributed in the market and include currency such as cash vouchers available in a certain area or memorial coins. The securities refer to checks, certificates, promissory notes, and the like (FIG. 25A). The certificates refer to a driver's license, a certificate of residence, and the like (FIG. 25B). The bearer bonds refer to stamps, rise coupons, various merchandise coupons, and the like (FIG. 25C). The packing containers refer to wrapping paper for lunch, plastic bottles, and the like (FIG. 25D). The documents refer to books and the like (FIG. 25E). The recording media refer to a DVD software, a video tape, and the like (FIG. 25F). The commodities refer to a bag, or glasses, and the like (FIG. 25H). The vehicles refer to wheeled vehicles such as bicycles, ship and vessel, and the like (FIG. 25G). The foods refer to food articles, drinks, and the like. The garments refer to clothes, chaussures, and the like. The health articles refer to medical appliances, health appliances, and the like. The commodities refer to furniture, lighting equipment, and the like. The medicines refer to medical products, pesticides, and the like. The electric appliances refer to a liquid crystal display device, an EL display device, a television device (TV sets or a flat-screen television), cellular phone, and the like.

Counterfeits can be prevented by providing an ID chip to each of the paper money, coins, securities, certificates, bearer bonds, and the like. The efficiency of an inspection system or a system used in a rental shop can be promoted by providing an ID chip to each of the packing containers, the documents, the recording media, the commodities, the vehicles, the foods, the garments, the health articles, the medicines, the electric appliances. By providing an ID chip to each of the vehicles, health articles, medicines, and the like, counterfeits or theft can be prevented, further, medicines can be prevented from taking mistakenly. The ID chip is provided to the foregoing articles by pasting on their surfaces or embedding thereinto. For example, the ID chip may be embedded in a book or embedded in a package made from organic resin.

Figure 26A:
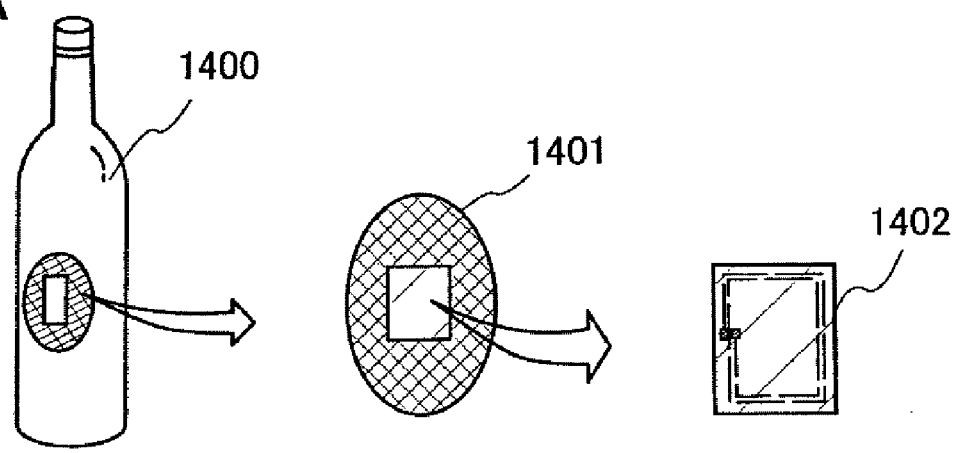
FIGS. 26A and 26B are views for showing applications using semiconductor devices according to the present invention.
Figure 26B:
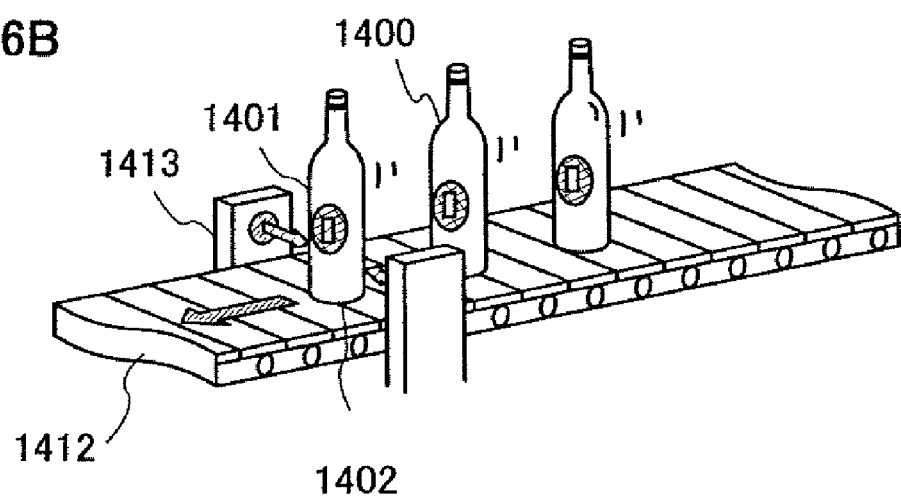

An example that can be applied to physical distribution management or a distribution system is explained with reference to FIGS. 26A and 26B. Here, an example of mounting an ID chip onto a product is explained. As shown in FIG. 26A, an ID chip 1402 is mounted onto a label 1401 to be pasted on a beer bottle 1400.

The ID chip 1402 records basic information such as a manufacturing date, a manufacturing area, a used material, and the like. Such the basic information may be recorded by using a memory that is unrewritable such as a mask ROM or a memory transistor according to the present invention since the basic information is not required to be rewritten. In addition, the ID chip 1402 records individual information such as a delivery destination, a delivery date, and the like of each beer bottle. For instance, as illustrated in FIG. 26B, each of the delivery destination and the delivery date can be recorded at the time of moving each of the beer bottle 1400 along belt conveyor 1412 to pass through a writer device 1413. Such the individual information may be recorded by a rewritable and erasable memory such as an EEROM.

When information on purchased products is sent to a logistics control center from a delivery destination, a system in which a delivery address or a delivery date is calculated by the writer, a personal computer that controls the writer, or the like and the calculated information is recorded to the IDF chip via a network is preferably constructed.

Since delivery is made in units of cases, the ID chip can be mounted to units of cases or units of a plurality of cases to record individual information.

A product capable of being recorded with a plurality of delivery destinations can reduce the time of typing by hand, thereby typing errors due to the inputting by hand can be reduced by means of mounting the ID chip. In addition, a personnel cost that is the largest cost in a logistics field can be reduced. By mounting the ID chip, logistics control can be carried out with few errors at low costs.

Application information such as foods to go with beer, a recipe using beer, and the like may be recorded at the delivery destination. As a result, foods and the like can also be advertised to drive buying inclination of a consumer.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A semiconductor device comprising:
a thin film integrated circuit over a substrate;
a first interlayer insulating film over the thin film integrated circuit;
an antenna over the first interlayer insulating film; and
a cover member comprising a biodegradable resin over the antenna,
wherein the thin film integrated circuit and the antenna are adhered to the substrate and the cover member with an adhesive agent.

2. A semiconductor device according to claim 1, wherein the antenna includes any one of gold, silver, copper, aluminum, or a metal plated by any one of gold, silver, copper, and aluminum.

3. A semiconductor device according to claim 1, wherein the substrate comprises any one of plastic, organic resin, a fiber, and carbon graphite.

4. A semiconductor device according to claim 1, wherein each of the substrate and the cover member has a thickness of 10 to 200 µm.

5. A semiconductor device according to claim 1, wherein the thin film integrated circuit has one or a plurality of circuits selected from the group consisting of a power source circuit, a clock signal generation circuit, a data modulation/demodulation circuit, an interface circuit, a control circuit, and a memory.

6. A semiconductor device comprising:
a thin film integrated circuit over a substrate;
a first interlayer insulating film over the thin film integrated circuit;
an antenna over the first interlayer insulating film;
a barrier film over the antenna; and
a cover member comprising a biodegradable resin over the barrier film,
wherein the thin film integrated circuit and the antenna are adhered to the substrate and the cover member with an adhesive agent, and
wherein the barrier film is formed between the antenna and the cover member.

7. A semiconductor device according to claim 6, wherein the antenna includes any one of gold, silver, copper, aluminum, or a metal plated by any one of gold, silver, copper, and aluminum.

8. A semiconductor device according to claim 6, wherein the thin film integrated circuit has one or a plurality of circuits selected from the group consisting of a power source circuit, a clock signal generation circuit, a data modulation/demodulation circuit, an interface circuit, a control circuit, and a memory.

9. A semiconductor device according to claim 6, wherein the substrate comprises any one of plastic, organic resin, a fiber, and carbon graphite.

10. A semiconductor device according to claim 6, wherein each of the substrate and the cover member has a thickness of 10 to 200 µm.

11. A semiconductor device according to claim 6, wherein the barrier film comprises a silicon nitride film.

12. A semiconductor device according to claim 6, wherein a thickness of the integrated circuit is less than 5 µm.

13. A semiconductor device comprising:
a memory element comprising:
a first semiconductor region over a substrate;
a first insulating film formed over the first semiconductor region;
a floating gate electrode formed over the first insulating film;
a second insulating film formed over the floating gate electrode; and
a first gate electrode formed over the second insulating film;
a first interlayer insulating film over the memory element;
an antenna over the first interlayer insulating film; and
a cover member over the antenna,
wherein the memory element and the antenna are adhered to the substrate and the cover member with an adhesive agent.

14. A semiconductor device according to claim 13, wherein the antenna includes any one of gold, silver, copper, aluminum, or a metal plated by any one of gold, silver, copper, and aluminum.

15. A semiconductor device according to claim 13, wherein the memory element includes a non volatile memory.

16. A semiconductor device according to claim 13, wherein each of the substrate and the cover member includes any one of plastic, organic resin, a fiber, and carbon graphite.

17. A semiconductor device according to claim 13, further comprising a barrier film formed between the antenna and the cover member.

18. A semiconductor device according to claim 17, wherein the barrier film comprises a silicon nitride film.

19. A semiconductor device according to claim 13, wherein a thickness of the memory circuit is less than 5 μm.

20. A semiconductor device according to claim 13, wherein the floating gate electrode comprises a plurality of particles.

21. A semiconductor device according to claim 20, wherein a part of the plurality of particles is aggregated together.

22. A semiconductor device according to claim 20, wherein each of the plurality of particles has a diameter of from 1 to 5 nm.

23. A semiconductor device according to claim 13, wherein the floating gate electrode comprises a semiconductor material.

24. A semiconductor device according to claim 13, wherein the floating gate electrode comprises a conductive material.

25. A semiconductor device according to claim 13, wherein the first insulating film is formed by stacking a silicon oxide film having a thickness of from 1 to 2 nm and a silicon nitride film having a thickness of 1 to 5 nm in this order from the side of the first semiconductor region.

26. A semiconductor device comprising:
   a first element comprising:
      a first semiconductor region over a substrate;
      a first insulating film formed over the first semiconductor region;
      a floating gate electrode formed over the first insulating film;
      a second insulating film formed over the floating gate electrode; and
      a first gate electrode formed over the second insulating film;
   a second element comprising:
      a second semiconductor region over the substrate;
      a third insulating film formed over the second semiconductor region;
      a second gate electrode formed over the third insulating film;
   a first interlayer insulating film over the first element and the second element;
   an antenna over the first interlayer insulating film; and
   a cover member over the antenna,
   wherein the first element, the second element, and the antenna are adhered to the substrate and the cover member with an adhesive agent.

27. A semiconductor device according to claim 26, further comprising a barrier film formed over the antenna.

28. A semiconductor device according to claim 27, wherein the barrier film comprises a silicon nitride film.

29. A semiconductor device according to claim 26, wherein the antenna includes any one of gold, silver, copper, aluminum, or a metal plated by any one of gold, silver, copper, and aluminum.

30. A semiconductor device according to claim 26, wherein the first element includes a non volatile memory.

31. A semiconductor device according to claim 26, wherein each of the substrate and the cover member includes any one of plastic, organic resin, a fiber, and carbon graphite.

32. A semiconductor device according to claim 26, wherein a thickness of the first element is less than 5 μm.

33. A semiconductor device according to claim 26, wherein the floating gate electrode comprises a plurality of particles.

34. A semiconductor device according to claim 33, wherein each of the plurality of particles has a diameter of from 1 to 5 nm.

35. A semiconductor device according to claim 33, wherein a part of the plurality of particles is aggregated together.

36. A semiconductor device according to claim 26, wherein the floating gate electrode comprises a semiconductor material.

37. A semiconductor device according to claim 26, wherein the floating gate electrode comprises a conductive material.

38. A semiconductor device according to claim 26, wherein the first insulating film is formed by stacking a silicon oxide film having a thickness of from 1 to 2 nm and a silicon nitride film having a thickness of 1 to 5 nm in this order from the side of the first semiconductor region.

39. A semiconductor device according to claim 26, wherein the second element forms a CMOS circuit.

40. A semiconductor device according to claim 26, further comprising a side wall structure on a side surface of the second gate electrode.

* * * * *